US011559936B2

(12) United States Patent
Dikovsky et al.

(10) Patent No.: US 11,559,936 B2
(45) Date of Patent: Jan. 24, 2023

(54) ADDITIVE MANUFACTURING PROCESSES EMPLOYING A MATERIAL FEATURING PROPERTIES OF A SOFT BODILY TISSUE

(71) Applicant: Stratasys Ltd., Rehovot (IL)

(72) Inventors: Daniel Dikovsky, Ariel (IL); Shai Hirsch, Rehovot (IL); Mazi Amiel-Levy, Petach-Tikva (IL); Amit Feffer, Herzliya (IL); Shiran Lupo, Yokneam Ilit (IL)

(73) Assignee: Stratasys Ltd., Rehovot (IL)

( * ) Notice: Subject to any disclaimer, the term of this patent is extended or adjusted under 35 U.S.C. 154(b) by 120 days.

(21) Appl. No.: 16/634,185

(22) PCT Filed: Jul. 27, 2018

(86) PCT No.: PCT/IL2018/050842
§ 371 (c)(1),
(2) Date: Jan. 27, 2020

(87) PCT Pub. No.: WO2019/021294
PCT Pub. Date: Jan. 31, 2019

(65) Prior Publication Data
US 2020/0384680 A1 Dec. 10, 2020

Related U.S. Application Data

(60) Provisional application No. 62/538,003, filed on Jul. 28, 2017.

(51) Int. Cl.
*B29C 64/112* (2017.01)
*B33Y 70/00* (2020.01)
(Continued)

(52) U.S. Cl.
CPC .......... *B29C 64/112* (2017.08); *B29C 64/194* (2017.08); *B33Y 70/00* (2014.12); *G09B 23/30* (2013.01); *B33Y 10/00* (2014.12)

(58) Field of Classification Search
CPC ........ B33Y 10/00; B33Y 70/00; G09B 23/30; B29C 64/194; B29C 64/112
See application file for complete search history.

(56) References Cited

U.S. PATENT DOCUMENTS

| 3,425,418 A | 2/1969 | Chvapil et al. |
|---|---|---|
| 5,110,834 A | 5/1992 | Horn et al. |

(Continued)

FOREIGN PATENT DOCUMENTS

| CH | 641541 | 2/1984 |
|---|---|---|
| CN | 1654028 | 8/2005 |

(Continued)

OTHER PUBLICATIONS

Communication Pursuant to Article 94(3) EPC dated Nov. 4, 2021 From the European Patent Office Re. Application No. 18759760.4. (8 Pages).

(Continued)

*Primary Examiner* — Matthew J Daniels
*Assistant Examiner* — Gregory C. Grosso

(57) ABSTRACT

Methods of fabricating three-dimensional objects featuring properties of a soft bodily tissue and three-dimensional objects featuring properties of a soft bodily tissue or of an organ comprising same are provided.

26 Claims, 15 Drawing Sheets

(51) Int. Cl.
B29C 64/194 (2017.01)
G09B 23/30 (2006.01)
B33Y 10/00 (2015.01)

(56) References Cited

U.S. PATENT DOCUMENTS

| | | | |
|---|---|---|---|
| 6,228,923 | B1 | 5/2001 | Lombardi et al. |
| 6,259,962 | B1 | 7/2001 | Gothait |
| 6,569,373 | B2 | 5/2003 | Napadensky |
| 6,658,314 | B1 | 12/2003 | Gothait |
| 6,850,334 | B1 | 2/2005 | Gothait |
| 7,183,335 | B2 | 2/2007 | Napadensky |
| 7,209,797 | B2 | 4/2007 | Kritchman et al. |
| 7,225,045 | B2 | 5/2007 | Gothait et al. |
| 7,255,825 | B2 | 8/2007 | Nielsen et al. |
| 7,285,237 | B2 | 10/2007 | Newell et al. |
| 7,300,619 | B2 | 11/2007 | Napadensky et al. |
| 7,479,510 | B2 | 1/2009 | Napadensky et al. |
| 7,500,846 | B2 | 3/2009 | Eshed et al. |
| 7,962,237 | B2 | 6/2011 | Kritchman |
| 9,031,680 | B2 | 5/2015 | Napadensky |
| 9,156,999 | B2 | 10/2015 | Ng et al. |
| 9,227,365 | B2 | 1/2016 | Dikovsky et al. |
| 9,805,624 | B2 | 10/2017 | Reihsen et al. |
| 2004/0000046 | A1 | 1/2004 | Stinson |
| 2004/0175686 | A1 | 9/2004 | Ono et al. |
| 2004/0183226 | A1 | 9/2004 | Newell |
| 2010/0191360 | A1 | 7/2010 | Napadensky et al. |
| 2013/0040091 | A1 | 2/2013 | Dikovsky |
| 2014/0052285 | A1 | 2/2014 | Butcher et al. |
| 2014/0163445 | A1* | 6/2014 | Pallari ............... A61F 13/00029 604/290 |
| 2014/0180397 | A1 | 6/2014 | Gerberding et al. |
| 2014/0312535 | A1* | 10/2014 | Dikovsky .............. B33Y 50/00 264/401 |
| 2015/0210010 | A1 | 7/2015 | Napadensky |
| 2015/0282963 | A1 | 10/2015 | Gounis et al. |
| 2015/0353750 | A1 | 12/2015 | Titterington et al. |
| 2016/0009029 | A1 | 1/2016 | Cohen et al. |
| 2016/0145452 | A1 | 5/2016 | Fong et al. |
| 2016/0167306 | A1 | 6/2016 | Vidimce et al. |
| 2016/0302911 | A1 | 10/2016 | Soletti |
| 2016/0332382 | A1* | 11/2016 | Coward ................ B29C 64/277 |
| 2017/0015850 | A1 | 1/2017 | Yoshino et al. |
| 2017/0121542 | A1 | 5/2017 | Xu et al. |
| 2017/0169733 | A1 | 6/2017 | Peterson et al. |
| 2017/0190859 | A1 | 7/2017 | Liu et al. |
| 2018/0036953 | A1 | 2/2018 | Gottschalk-Gaudig |
| 2018/0193152 | A1 | 7/2018 | Bauer |
| 2018/0207863 | A1 | 7/2018 | Porter et al. |
| 2018/0244831 | A1 | 8/2018 | Hirata et al. |
| 2018/0281295 | A1 | 10/2018 | Tibbits et al. |
| 2018/0296343 | A1 | 10/2018 | Wei |
| 2019/0136079 | A1 | 5/2019 | Moussa |
| 2020/0155321 | A1 | 5/2020 | Dikovsky et al. |
| 2020/0164109 | A1 | 5/2020 | Kroll et al. |
| 2020/0171739 | A1 | 6/2020 | Dikovsky et al. |
| 2020/0172748 | A1 | 6/2020 | Moussa |
| 2020/0231803 | A1 | 7/2020 | Amiel-Levy et al. |
| 2020/0368009 | A1 | 11/2020 | Dikovsky et al. |
| 2021/0155722 | A1 | 5/2021 | Vaughn et al. |

FOREIGN PATENT DOCUMENTS

| | | |
|---|---|---|
| CN | 1759139 | 4/2006 |
| CN | 101219461 | 7/2008 |
| CN | 102626347 | 8/2012 |
| CN | 103189187 | 7/2013 |
| CN | 104136199 | 11/2014 |
| CN | 104490489 | 4/2015 |
| CN | 105479751 | 4/2016 |
| CN | 105873954 | 8/2016 |
| CN | 106214296 | 12/2016 |
| CN | 106414039 | 2/2017 |
| CN | 106491241 | 3/2017 |
| CN | 106626423 | 5/2017 |
| DE | 102015214883 | 2/2017 |
| EP | 0442256 | 8/1991 |
| EP | 2466380 | 6/2012 |
| EP | 2636511 | 9/2013 |
| EP | 2780154 | 9/2014 |
| EP | 2780154 B1 | 3/2018 |
| GB | 1044680 | 10/1966 |
| JP | 07-313382 | 12/1995 |
| JP | 2004-202126 | 7/2004 |
| JP | 2004-255839 | 9/2004 |
| JP | 2012-111226 | 6/2012 |
| JP | 2013-522453 | 6/2013 |
| JP | 2014-533613 | 12/2014 |
| JP | 2016-088944 | 5/2016 |
| JP | 2016413518 | 6/2016 |
| JP | 2016-198897 | 12/2016 |
| JP | 2018-521710 | 8/2018 |
| WO | WO 03/030964 | 4/2003 |
| WO | WO 2013/072874 | 5/2003 |
| WO | WO 2004/081311 | 9/2004 |
| WO | WO 2010/030013 | 3/2010 |
| WO | WO 2011/119828 | 9/2011 |
| WO | WO 2013/072644 | 5/2013 |
| WO | WO 2015/107333 | 7/2015 |
| WO | WO 2016/142947 | 9/2016 |
| WO | WO 2016/153711 | 9/2016 |
| WO | WO 2016/161944 | 10/2016 |
| WO | WO 2016/179242 | 11/2016 |
| WO | WO 2017/020971 | 2/2017 |
| WO | WO 2017/029657 | 2/2017 |
| WO | WO 2017/208238 | 12/2017 |
| WO | WO 2017/222602 | 12/2017 |
| WO | WO 2018/007579 | 1/2018 |
| WO | WO 2019/021291 | 1/2019 |
| WO | WO 2019/021292 | 1/2019 |
| WO | WO 2019/021292 A9 | 1/2019 |
| WO | WO 2019/021293 | 1/2019 |
| WO | WO 2019/021294 | 1/2019 |
| WO | WO 2019/021295 | 1/2019 |

OTHER PUBLICATIONS

Notification of Office Action and Search Report dated Jun. 2, 2021 From the State Intellectual Property Office of the People's Republic of China Re. Application No. 201880063362.1 and Its Translation of Office Action Into English. (8 Pages).
Communication Pursuant to Article 94(3) EPC dated Feb. 19, 2021 From the European Patent Office Re. Application No. 18759759.6. (4 Pages).
Notification of Office Action dated Jun. 11, 2021 From the State Intellectual Property Office of the People's Republic of China Re. Application No. 201880063361.7. (10 Pages).
Translation Dated Jun. 18, 2021 of Notification of Office Action dated Jun. 1, 2021 From the State Intellectual Property Office of the People's Republic of China Re. Application No. 201880063414.5. (5 Pages).
Notification of Office Action and Search Report dated May 8, 2021 From the State Intellectual Property Office of the People's Republic of China Re. Application No. 201880056051.2. (9 Pages).
International Search Report and the Written Opinion dated Dec. 10, 2018 From the International Searching Authority Re. Application No. PCT/IL2018/050842. (14 Pages).
Notification of Office Action and Search Report dated Jun. 1, 2021 From the State Intellectual Property Office of the People's Republic of China Re. Application No. 201880063414.5. (8 Pages).
Translation Dated Dec. 1, 2021 of Notification of Office Action and Search Report dated Nov. 11, 2021 From the State Intellectual Property Office of the People's Republic of China Re. Application No. 201880056051.2. (11 Pages).
Translation Dated Jun. 7, 2021 of Notification of Office Action dated May 8, 2021 From the State Intellectual Property Office of the People's Republic of China Re. Application No. 201880056051.2. (8 Pages).

(56) References Cited

OTHER PUBLICATIONS

Translation Dated Jul. 2, 2021 of Notification of Office Action dated Jul. 11, 2021 From the State Intellectual Property Office of the People's Republic of China Re. Application No. 201880063361.7. (31 Pages).
Translation Dated Dec. 17, 2021 of Notification of Office Action dated Nov. 17, 2021 Fromthe State Intellectual Property Office of the People's Republic of China Re. Application No. 201880063414.5. (7 Pages).
Notification of Office Action and Search Report dated Nov. 11, 2021 From the State Intellectual Property Office of the People's Republic of China Re. Application No. 2018800560512.
Notice of Reasons for Rejection dated Apr. 26, 2022 From the Japan Patent Office Re. Application No. 2020-504413 and Its Translation Into English. (6 Pages).
Restrictin Official Action dated Jun. 24, 2022 from US Patent and Trademark Office Re. U.S. Appl. No. 16/634,171. (6 pages).
Translation Dated Apr. 15, 2022 of Notification of Office Action dated Mar. 17, 2022 From the State Intellectual Property Office of the People's Republic of China Re. Application No. 201880063361. 7. (2 Pages).
Eglish Translation Dated May 20, 2022 of Notice of Rejection dated Apr. 6, 2022 From the State Intellectual Property Office of the People's Republic of China Re. Application No. 201880063414.5. (5 Pages).
Communication Pursuant to Article 94(3) EPC Dated Feb. 3, 2022 From the European Patent Office Re. Application No. 18758746.4. (7 Pages).
Communication Pursuant to Article 94(3) EPC dated Feb. 2, 2022 From the European Patent Office Re. Application No. 18762158.6. (8 Pages).
Notification of Office Action and Search Report dated Mar. 17, 2022 From the State Intellectual Property Office of the People's Republic of China Re. Application No. 201880063361.7. (5 Pages).
Notice of Reason for Rejection dated Jun. 21, 2022 From the Japan Patent Office Re. Application No. 2020-504351 and Its Translation Into English. (9 Pages).
Office Action dated Jul. 10, 2022 From the Israel Patent Office Re. Application No. 272316. (3 Pages).
Official Action dated Jun. 9, 2022 from US Patent and Trademark Office Re. U.S. Appl. No. 16/632,548. (76 pages).
Restriction Official Action dated Jun. 2, 2022 from US Patent and Trademark Office Re. U.S. Appl. No. 16/634,173. (11 pages).
Notification of Office Action dated May 12, 2022 From the State Intellectual Property Office of the People's Republic of China Re. Application No. 201880056051.2 and Its Translation Into English. (9 Pages).
Restriction Official Action dated Jun. 14, 2022 From the US Patent and Trademark Office Re. U.S. Appl. No. 16/634,582. (7 Pages).
Notification of Office Action and Search Report dated Feb. 28, 2022 From the State Intellectual Property Office of the People's Republic of China Re. Application No. 201880063362.1. (10 Pages)
English Translation Dated Apr. 13, 2022 of Notification of Office Action and Search Report dated Feb. 28, 2022 From the State Intellectual Property Office of the People's Republic of China Re. Application No. 201880063362.1. (15 Pages).

Notice of Rejection dated Apr. 6, 2022 From the State Intellectual Property Office of the People's Republic of China Re. Application No. 201880063414.5. (5 Pages).
International Preliminary Report on Patentability dated Feb. 6, 2020 From the International Bureau of WIPO Re. Application No. PCT/IL2018/050839. (8 Pages).
International Preliminary Report on Patentability dated Feb. 6, 2020 From the International Bureau of WIPO Re. Application No. PCT/IL2018/050840. (8 Pages).
International Preliminary Report on Patentability dated Feb. 6, 2020 From the International Bureau of WIPO Re. Application No. PCT/IL2018/050841. (8 Pages).
International Preliminary Report on Patentability dated Feb. 6, 2020 From the International Bureau of WIPO Re. Application No. PCT/IL2018/050842. (8 Pages).
International Preliminary Report on Patentability dated Feb. 6, 2020 From the International Bureau of WIPO Re. Application No. PCT/IL2018/050843. (9 Pages).
International Search Report and the Written Opinion dated Dec. 3, 2018 From the International Searching Authority Re. Application No. PCT/IL2018/050841. (14 Pages).
International Search Report and the Written Opinion dated Dec. 10, 2018 From the International Searching Authority Re. Application No. PCT/IL2018/050839. (14 Pages).
International Search Report and the Written Opinion dated Nov. 16, 2018 From the International Searching Authority Re. Application No. PCT/IL2018/050843. (16 Pages).
International Search Report and the Written Opinion dated Nov. 19, 2018 From the International Searching Authority Re. Application No. PCT/IL2018/050840. (13 Pages).
Gustavson "Simplex Noise Demystified", Linkoping University, Sweden, XP055522459, Research Report, p. 1-18, Mar. 22, 2005. p. 1.
Turner et al. "Basic Biomechanical Measurements of Bone: A Tutorial", Bone, XP026431978, 14(4): 595-608, Jul. 1, 1993.
Notice of Reasons for Rejection dated Jul. 12, 2022 From the Japan Patent Office Re. Application No. 2020-504391 and Its Translation Into English. (8 Pages).
Notification of Office Action dated Aug. 8, 2022 From the State Intellectual Property Office of the People's Republic of China Re. Application No. 201880063362.1. (10 Pages).
Notice of Allowance dated Aug. 25, 2022 From the US Patent and Trademark Office Re. U.S. Appl. No. 16/634,173. (76 Pages).
Notice of Reason(s) for Rejection dated Aug. 16, 2022 From the Japan Patent Office Re. Application No. 2020-504356 and Its Translation Into English. (14 Pages).
Notification of Office Action dated Aug. 8, 2022 From the State Intellectual Property Office of the People's Republic of China Re. Application No. 201880063362.1. (14 Pages).
Notice of Reason for Rejection dated Aug. 26, 2022 From the Japan Patent Offic Re. Application No. 2020-504382 and Its Translation Into English. (20 Pages).
Official Action dated Sep. 21, 2022 from US Patent and Trademark Office Re. U.S. Appl. No. 16/632,548. (22 pages).
Official Action dated Nov. 8, 2022 from the US Patent and Trademark Office Re. U.S. Appl. No. 16/634,171. (85 pages).
Office Action dated Nov. 13, 2022 From the Israel Patent Office Re. Application No. 272315. (3 Pages).

* cited by examiner

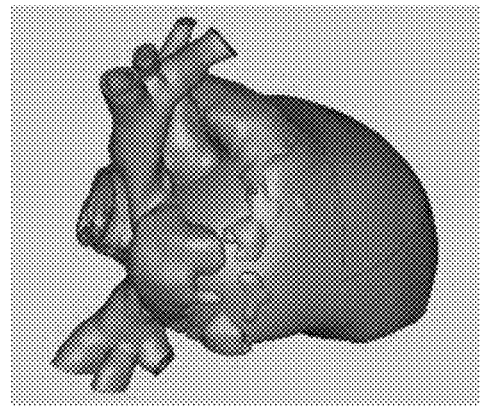
FIG. 12
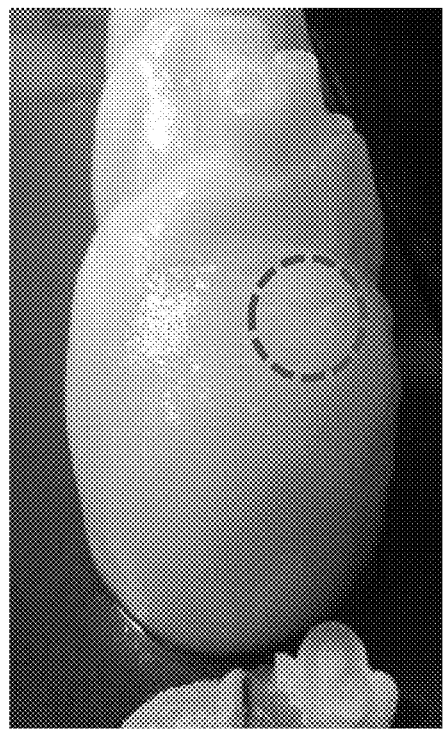 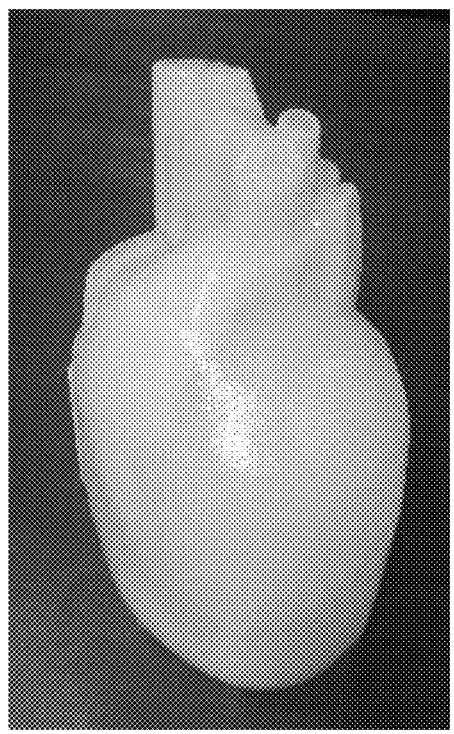
FIG. 13A  FIG. 13B

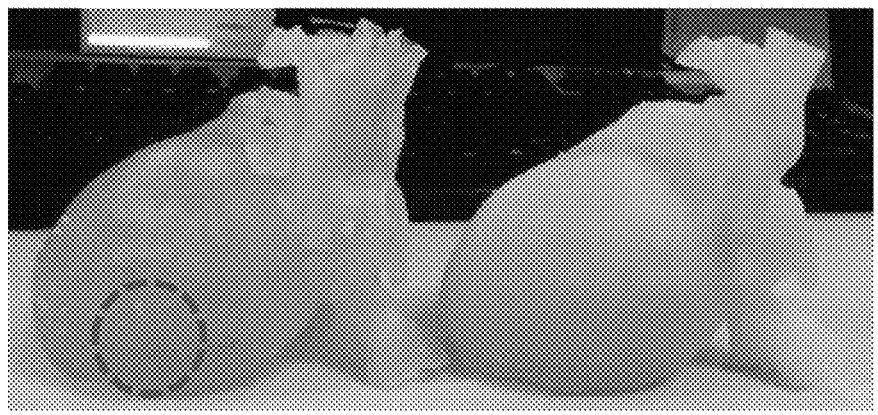
FIG. 14
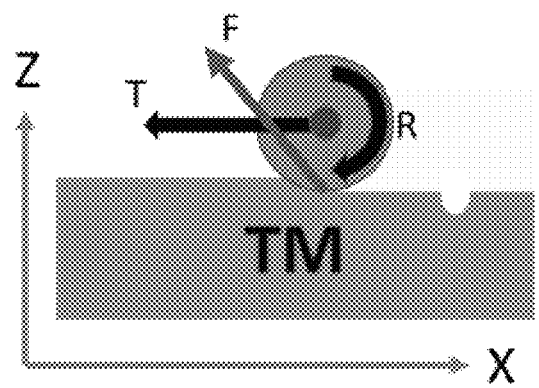
FIG. 15
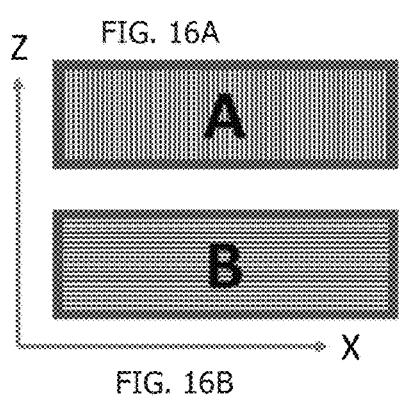
FIG. 16A
FIG. 16B
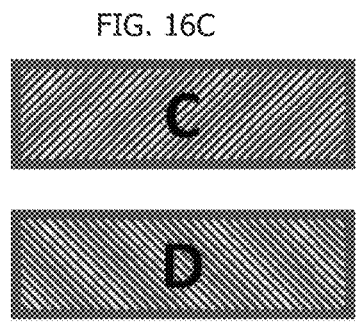
FIG. 16C
FIG. 16D
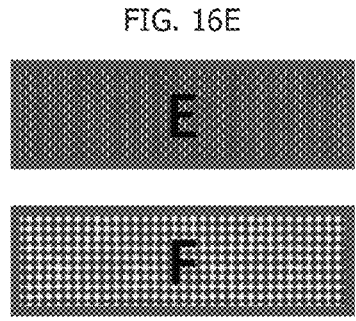
FIG. 16E
FIG. 16F

ADDITIVE MANUFACTURING PROCESSES EMPLOYING A MATERIAL FEATURING PROPERTIES OF A SOFT BODILY TISSUE

RELATED APPLICATIONS

This application is a National Phase of PCT Patent Application No. PCT/IL2018/050842 having International filing date of Jul. 27, 2018, which claims the benefit of priority under 35 USC § 119(e) of U.S. Provisional Patent Application No. 62/538,003 filed on Jul. 28, 2017 which was co-filed with U.S. Provisional Patent Application Nos. 62/538,006, 62/538,015, 62/538,018 and 62/538,026.

The contents of the above applications are all incorporated by reference as if fully set forth herein in their entirety.

FIELD AND BACKGROUND OF THE INVENTION

The present invention, in some embodiments thereof, relates to additive manufacturing (AM), and, more particularly, but not exclusively, to additive manufacturing of an object made, in at least a portion thereof, of a soft material that features properties (e.g., mechanical and/or visual properties) of a soft bodily tissue.

Additive manufacturing is generally a process in which a three-dimensional (3D) object is manufactured utilizing a computer model of the objects. Such a process is used in various fields, such as design related fields for purposes of visualization, demonstration and mechanical prototyping, as well as for rapid manufacturing (RM).

The basic operation of any AM system consists of slicing a three-dimensional computer model into thin cross sections, translating the result into two-dimensional position data and feeding the data to control equipment which manufacture a three-dimensional structure in a layerwise manner.

Various AM technologies exist, amongst which are stereolithography, digital light processing (DLP), and three dimensional (3D) printing, 3D inkjet printing in particular. Such techniques are generally performed by layer by layer deposition and solidification of one or more building materials, typically photopolymerizable (photocurable) materials.

In three-dimensional printing processes, for example, a building material is dispensed from a dispensing head having a set of nozzles to deposit layers on a supporting structure. Depending on the building material, the layers may then be cured or solidified using a suitable device.

Various three-dimensional printing techniques exist and are disclosed in, e.g., U.S. Pat. Nos. 6,259,962, 6,569,373, 6,658,314, 6,850,334, 7,183,335, 7,209,797, 7,225,045, 7,300,619, 7,479,510, 7,500,846, 7,962,237 and 9,031,680, all to the same Assignee, the contents of which are hereby incorporated by reference.

A printing system utilized in additive manufacturing may include a receiving medium and one or more printing heads. The receiving medium can be, for example, a fabrication tray that may include a horizontal surface to carry the material dispensed from the printing head. The printing head may be, for example, an ink jet head having a plurality of dispensing nozzles arranged in an array of one or more rows along the longitudinal axis of the printing head. The printing head may be located such that its longitudinal axis is substantially parallel to the indexing direction.

The printing system may further include a controller, such as a microprocessor to control the printing process, including the movement of the printing head according to a pre-defined scanning plan (e.g., a CAD configuration converted to a Stereo Lithography (STL) format and programmed into the controller). The printing head may include a plurality of jetting nozzles. The jetting nozzles dispense material onto the receiving medium to create the layers representing cross sections of a 3D object.

In addition to the printing head, there may be a source of a curing condition, for curing the dispensed building material. The curing condition typically comprises a curing energy, and is typically radiation, for example, UV radiation.

Additionally, the printing system may include a leveling device for leveling and/or establishing the height of each layer after deposition and at least partial solidification, prior to the deposition of a subsequent layer.

The building materials may include modeling materials and support materials, which form the object and the temporary support constructions supporting the object as it is being built, respectively.

The modeling material (which may include one or more material(s), included in one or more formulations) is deposited to produce the desired object/s and the support material (which may include one or more material(s)) is used, with or without modeling material elements, to provide support structures for specific areas of the object during building and assure adequate vertical placement of subsequent object layers, e.g., in cases where objects include overhanging features or shapes such as curved geometries, negative angles, voids, and so on.

Both the modeling and support materials are preferably liquid at the working temperature at which they are dispensed, and subsequently hardened, typically upon exposure to a curing condition (e.g., a curing energy such as UV curing), to form the required layer shape. After printing completion, support structures are removed to reveal the final shape of the fabricated 3D object.

Several additive manufacturing processes allow additive formation of objects using more than one modeling material. For example, U.S. Patent Application having Publication No. 2010/0191360, of the present Assignee, discloses a system which comprises a solid freeform fabrication apparatus having a plurality of dispensing heads, a building material supply apparatus configured to supply a plurality of building materials to the fabrication apparatus, and a control unit configured for controlling the fabrication and supply apparatus. The system has several operation modes. In one mode, all dispensing heads operate during a single building scan cycle of the fabrication apparatus. In another mode, one or more of the dispensing heads is not operative during a single building scan cycle or part thereof.

In a 3D inkjet printing process such as Polyjet™ (Stratasys Ltd., Israel), the building material is selectively jetted from one or more printing heads and deposited onto a fabrication tray in consecutive layers according to a pre-determined configuration as defined by a software file.

U.S. Pat. No. 9,227,365, by the present assignee, discloses methods and systems for solid freeform fabrication of shelled objects, constructed from a plurality of layers and a layered core constituting core regions and a layered shell constituting envelope regions.

Additive Manufacturing processes have been used to form rubber-like materials. For example, rubber-like materials are used in PolyJet™ systems as described herein. These materials are formulated to have relatively low viscosity permitting dispensing, for example by inkjet, and to develop Tg which is lower than room temperature, e.g., −10° C. or lower. The latter is obtained by formulating a product with relatively low degree of cross-linking and by using monomers and oligomers with intrinsic flexible molecular structure (e.g., acrylic elastomers). An exemplary family of Rubber-like materials usable in PolyJet™ systems (marketed under the trade name "Tango" family) offers a variety of elastomer characteristics of the obtained hardened material, including Shore scale A hardness, elongation at break, Tear Resistance and tensile strength. The softest material in this family features a Shore A hardness of 27.

Another family of Rubber-like materials usable in PolyJet™ systems (marketed under the trade name "Agilus" family) is described in PCT International Application No. IL2017/050604 (published as WO2017/208238), by the present assignee, and utilizes an elastomeric curable material and silica particles.

To date, there are no reports of additive manufacturing techniques that employ model materials which, when hardened, feature a hardness and appearance of a soft bodily tissue, and hence of additive manufacturing techniques that are capable of producing 3D objects that comprise, in at least a portion thereof, a hardened material that features mechanical and optionally also visual properties similar to that of a bodily soft tissue.

SUMMARY OF THE INVENTION

According to an aspect of some embodiments of the present invention there is provided a method of additive manufacturing an object featuring properties of a soft bodily tissue, the method comprising: dispensing at least one modeling material formulation to sequentially form a plurality of layers in a configured pattern corresponding to a shape of the object, wherein for at least a portion of the layers, the dispensing is of a modeling material formulation featuring, when hardened, a Shore A hardness lower than 10 or a Shore 00 hardness lower than 40.

According to some of any of the embodiments described herein, the dispensing is of at least two modeling material formulations, at least one of the modeling material formulations is the formulation featuring, when hardened, a Shore A hardness lower than 10 or a Shore 00 hardness lower than 40, and at least one of the modeling material formulations is an elastomeric curable formulation which comprises at least one elastomeric curable material.

According to some of any of the embodiments of the invention, the elastomeric curable formulation further comprises silica particles. According to some embodiments of the present invention the elastomeric curable formulation comprises at least one formulation of a formulation family selected from the group consisting of the Tango™, the Tango+™ and the Agilus™ families described below.

According to some of any of the embodiments of the invention, the dispensing comprises forming voxel elements containing the formulation featuring, when hardened, a Shore A hardness lower than 10 or a Shore 00 hardness lower than 40, and elastomeric curable formulation.

According to some of any of the embodiments of the invention, interlaced locations occupied by the elastomeric curable formulation constitute from about 10% to about 30% of an area of the layer.

According to some of any of the embodiments of the invention, interlaced locations occupied by the elastomeric curable formulation constitute from about 15% to about 25% of an area of the layer.

According to some of any of the embodiments of the invention, voxel elements containing the elastomeric curable formulation form a volumetric fibrous pattern in the object.

According to some of any of the embodiments of the invention, a characteristic fiber thickness of the fibrous pattern is from about 0.4 mm to about 0.6 mm.

According to some of any of the embodiments of the invention, the fibrous pattern is vertical with respect to planar surfaces of the at least a few of the layers.

According to some of any of the embodiments of the invention, the fibrous pattern is diagonal with respect to planar surfaces of the at least a few of the layers.

According to some of any of the embodiments of the invention, the method comprises straightening each of the at least a few of the layers using a roller, wherein the diagonal fibrous pattern is generally parallel to a tearing force applied by the roller on the layer.

According to some of any of the embodiments of the invention, the fibrous pattern forms an angle of from about 30° to about 60° with respect to the planar surfaces.

According to some of any of the embodiments of the invention, the method comprises forming from the elastomeric curable formulation a shell coating the object.

According to some of any of the embodiments of the invention, a thickness of the shell, as measured perpendicularly to an outermost surface of the shell, is from about 0.4 mm to about 1 mm.

According to some of any of the embodiments of the invention, the method comprises forming from the elastomeric modeling formulation a shell coating the object, and removing the shell following a completion of the additive manufacturing of the three-dimensional object.

According to some of any of the embodiments of the invention, the modeling material formulation that features, when hardened, the Shore A hardness or the Shore 00 hardness as described herein, comprises curable materials and non-curable materials, wherein an amount of the non-curable materials ranges from 10 to 49, or from 10 to 30, % by weight, of the total weight of the formulation.

According to some of any of the embodiments of the invention, an amount of the non-curable polymeric material ranges from 20 to 40, or from 25 to 40, weight percents, of the total weight of the formulation.

According to some of any of the embodiments of the invention, the non-curable polymeric material features a molecular weight of at least 1000, or at least 1500 or at least 2000 Daltons (e.g., a molecular weight that ranges from about 1000 to about 4000 or from about 1500 to about 4000 or from about 2000 to about 4000, or from about 1500 to about 3500, or from about 2000 to about 3500, Daltons); and a Tg lower than 0, or lower than −10, or lower than −20, ° C.

According to some of any of the embodiments of the invention, the non-curable polymeric material comprises polypropylene glycol.

According to some of any of the embodiments of the invention, the non-curable polymeric material is a block co-polymer that comprises at least one polypropylene glycol block.

According to some of any of the embodiments of the invention, the non-curable polymeric material is a block co-polymer that comprises at least one polypropylene glycol block and at least one polyethylene glycol block, wherein a total amount of the polyethylene glycol in the block co-polymer is no more than 10 weight percents.

According to some of any of the embodiments of the invention, the curable formulation wherein a ratio of polypropylene glycol blocks and the polyethylene glycol blocks in the block-copolymer is at least 2:1.

According to some of any of the embodiments described herein, the curable formulation wherein a ratio of polypropylene glycol backbone units and the polyethylene glycol backbone units in the block-copolymer is at least 2:1.

According to some of any of the embodiments of the invention, the non-curable polymeric material comprises a polypropylene glycol and/or a block co-polymer comprising at least one polypropylene glycol block, each featuring a molecular weight of at least 2000 Daltons.

According to some of any of the embodiments of the invention, a ratio of the amount of the curable materials and the amount of the non-curable polymeric material ranges from 4:1 to 1.1:1, or from 3:1 to 2:1.

According to some of any of the embodiments of the invention, an amount of the curable materials ranges from 55 to 70 weight percents.

According to some of any of the embodiments of the invention, the curable materials comprise at least one mono-functional curable material and at least one multi-functional curable material.

According to some of any of the embodiments of the invention, an amount of the mono-functional curable material ranges from about 50% to about 89% by weight of the total weight of the formulation.

According to some of any of the embodiments of the invention, an amount of the multi-functional curable material ranges from about 1% to about 10% by weight of the total weight of the formulation.

According to some of any of the embodiments of the invention, the formulation comprises: a mono-functional curable material, in an amount of from about 50 to about 89 weight percents; a non-curable polymeric material, in an amount ranging from about 10 to about 49 weight percents; and a multi-functional curable material, in an amount ranging from about 1 to about 10 weight percents, of the total weight of the formulation.

According to some of any of the embodiments of the invention, (i) the non-curable polymeric material features a molecular weight of at least 1000, or at least 1500 or at least 2000 Daltons, as described herein; and/or (ii) the non-curable polymeric material features a Tg lower than 0, or lower than −10, or lower than −20, ° C.; and/or (iii) at least 80 weight percents of the total amount of the mono-functional and the multi-functional curable materials include curable materials featuring, when hardened, a Tg lower than 0, or lower than −10, or lower than −20, ° C.

According to some of any of the embodiments of the invention, an amount of the mono-functional curable material ranges from about 50 to about 60 weight percents, or from about 55 to about 60 weight percents, of the total weight of the formulation.

According to some of any of the embodiments of the invention, an amount of the multi-functional curable material ranges from about 3 to about 10 weight percents, or from about 5 to about 10 weight percents, of the total weight of the formulation.

According to some of any of the embodiments of the invention, the mono-functional curable material features, when hardened, a Tg lower than −10, or lower than −20° C.

According to some of any of the embodiments of the invention, the mono-functional curable material comprises a hydrophobic mono-functional curable material.

According to some of any of the embodiments of the invention, the mono-functional curable material comprises an amphiphilic mono-functional curable material.

According to some of any of the embodiments described herein, the mono-functional curable material comprises an amphiphilic mono-functional curable material which comprises a hydrophobic moiety or group.

According to some of any of the embodiments of the invention, the mono-functional curable material comprises an amphiphilic mono-functional curable material (e.g., which comprises a hydrophobic group or moiety) and a hydrophobic mono-functional curable material.

According to some of any of the embodiments of the invention, a weight ratio of the amphiphilic mono-functional curable material (e.g., which comprises a hydrophobic group or moiety) and the hydrophobic mono-functional curable material ranges from 1.5:1 to 1.1:1.

According to some of any of the embodiments of the invention, the multi-functional curable material features, when hardened, a Tg lower than −10, or lower than −20° C.

According to some of any of the embodiments of the invention, the multi-functional curable material is a difunctional curable material.

According to some of any of the embodiments of the invention, the mono-functional curable material is a UV-curable material.

According to some of any of the embodiments of the invention, the mono-functional curable material is a mono-functional acrylate.

According to some of any of the embodiments of the invention, the multi-functional curable material is a UV-curable material.

According to some of any of the embodiments of the invention, the multi-functional curable material is a multi-functional acrylate.

According to some of any of the embodiments of the invention, the formulation further comprises a photoinitiator.

According to some of any of the embodiments of the invention, an amount of the photoinitiator ranges from 1-3 weight percents of the total weight of the formulation.

According to some of any of the embodiments of the invention, the formulation further comprises a curing inhibitor, in an amount that ranges from about 0.01 to about 5 weight percents of the total weight of the formulation.

According to some of any of the embodiments described herein, the formulation further comprises at least one additive selected from a coloring agent (pigment), a surfactant, an impact modifier, etc.

According to some of any of the embodiments described herein, the formulation further comprises a surfactant, such as a UV-curable surfactant.

According to some of any of the embodiments of the invention, curable formulation comprises: a mono-functional amphiphilic acrylate (e.g., which comprises a hydrophobic group or moiety), in an amount of 25-35 weight percents; a mono-functional hydrophobic acrylate, in an amount of 25-30 weight percents; a multi-functional acrylate, in an amount of 5-10 weight percents; and a non-curable polymeric material featuring a molecular weight of at least 1000, or at least 1500 or at least 2000 Daltons; and a Tg lower than 0, or lower than −10, or lower than −20, ° C., in an amount of 30-35 weight percents, of the total weight of the formulation.

According to some of any of the embodiments of the invention, the non-curable polymeric material comprises a polypropylene glycol and/or a block co-polymer comprising at least one polypropylene glycol block, each featuring a molecular weight of at least 2000 Daltons.

According to some of any of the embodiments of the invention, the multi-functional acrylate is a urethane diacrylate.

According to some of any of the embodiments of the invention, the mono-functional amphiphilic acrylate that comprises a hydrophobic group or moiety comprises a hydrocarbon chain of at least 6 carbon atoms and at least 2 alkylene glycol groups.

According to some of any of the embodiments of the invention, the mono-functional hydrophobic acrylate comprises a hydrocarbon chain of at least 8 carbon atoms.

According to some of any of the embodiments of the invention, the formulation featuring, when hardened, the Shore hardness, is further characterized, when hardened, by Tear Resistance of at least 100 N/m.

According to some of any of the embodiments of the invention, the formulation featuring, when hardened, the Shore hardness, is further characterized, when hardened, by Compression Modulus at least 0.01 MPa.

According to some of any of the embodiments of the invention, at least the modeling material formulation featuring, when hardened, the Shore hardness, is devoid of a biological material.

According to some of any of the embodiments of the invention, at least the modeling material formulation featuring, when hardened, the Shore A hardness comprises less than 10% by weight water.

According to some of any of the embodiments of the invention, the at least one modeling material formulation featuring when hardened the Shore hardness further comprises a pigment which imparts to a red tint to the formulation when hardened.

According to some of any of the embodiments of the invention, the elastomeric curable formulation further comprises a pigment which imparts a white opaque color with yellow tint to the formulation when hardened.

According to some of any of the embodiments of the invention, an amount of the pigment ranges from 0.01 to 5 percents, by weight, of the total weigh of the formulation.

According to an aspect of some embodiments of the present invention there is provided a three-dimensional object featuring at least a visual property and a mechanical property of a soft bodily tissue or of an organ comprising same, prepared by the method as described herein in any of the respective embodiments and any combination thereof, the object comprising, in at least one portion thereof, a material which features a Shore A hardness lower than 10 or a Shore 00 hardness lower than 40.

According to an aspect of some embodiments of the present invention there is provided a three-dimensional object featuring at least a visual property and a mechanical property of a soft bodily tissue or of a bodily organ, system or structure comprising same, the object comprising in at least one portion thereof a material which features a Shore A hardness lower than 10 or a Shore 00 hardness lower than 40, the object being devoid of a biological material.

According to some of any of the embodiments of the invention, the object features at least a shape and a hardness of the soft bodily tissue or the system, structure or organ comprising same.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWING(S)

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIGS. 1A-D are schematic illustrations of an additive manufacturing system according to some embodiments of the invention;

Figure 7:
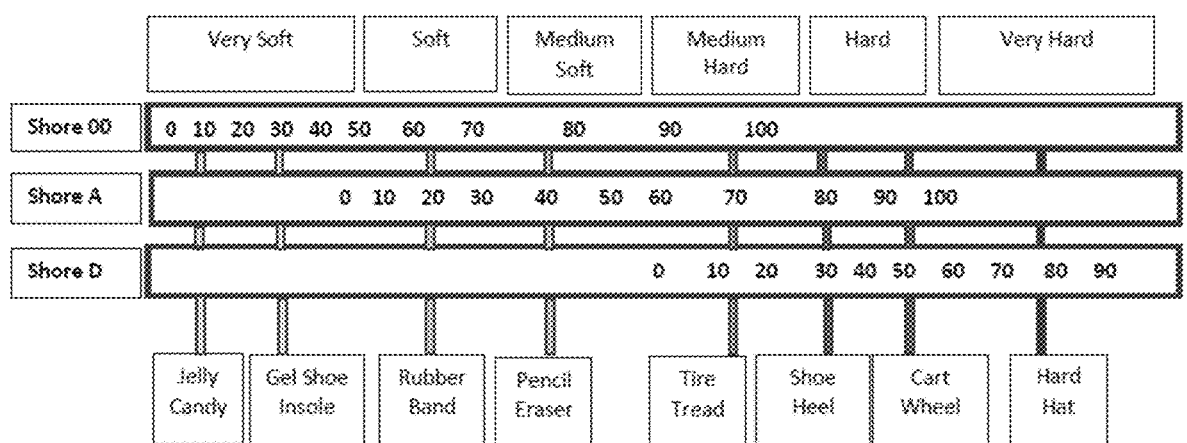

FIGS. 6A-D are schematic illustrations of a representative and non-limiting example of a structure according to some embodiments of the present invention;

FIG. 7 presents Shore Hardness values, at Scales 00, A and D, of known articles.

Figure 8:
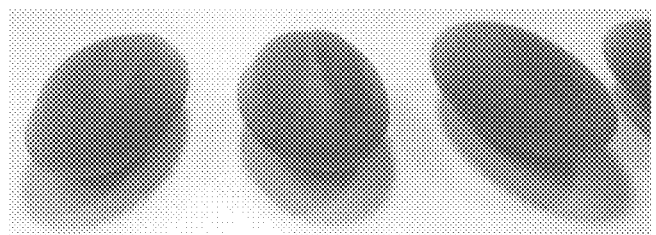

FIG. 8 presents images of oval objects made of a soft material formulation according to some embodiments of the present invention (left and middle objects), and of a composite scaffold made of the soft material formulation and the elastomeric modeling formulation according to some of the present embodiments (right object), all being coated by a thin shell made of the elastomeric modeling formulation.

Figure 9A:
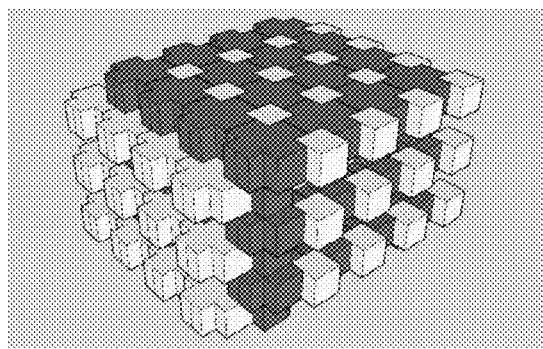
Figure 9B:
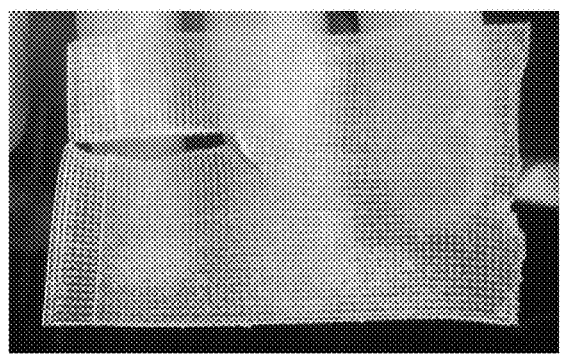

FIGS. 9A-B present a schematic illustration of a printing scheme to form a region which includes interlaced modeling materials (FIG. 9A) and an image showing an exemplary thin plate (FIG. 9B) printed according to the scheme illustrated in FIG. 9A and featuring a scaffold composite structure of an exemplary soft material formulation according to some of the present embodiments (BM61) with 19% of a scaffold made of an elastomeric modeling formulation (such as, but not limited to, Agilus, e.g., Agilus™30).

Figure 9C:
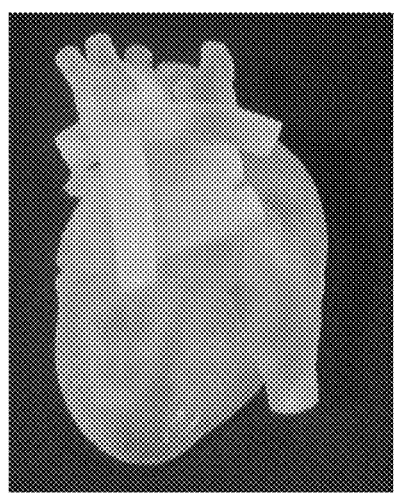
Figure 9D:
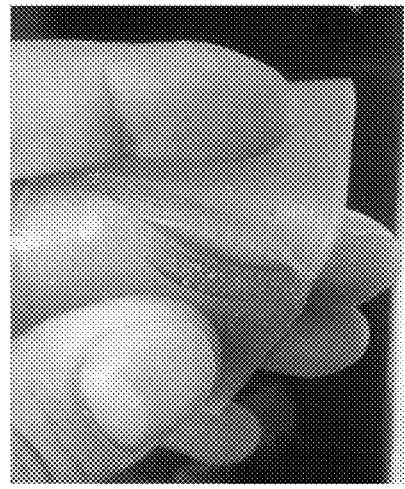

FIGS. 9C-D present a heart model made of an exemplary soft material formulation according to some of the present embodiments (BM19) reinforced by a scaffold structure (19% 0.5 mm beams) made of an elastomeric modeling formulation (FIG. 9C), and a view of its inner portion (FIG. 9D).

Figure 10:
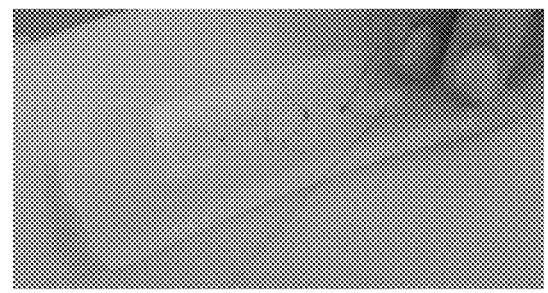

FIG. 10 is an image of an object made of an exemplary soft material formulation according to some of the present embodiments (BM61) with 19% scaffold and 0.6 mm coating made of an elastomeric modeling formulation, which withstands suturing/sewing therethrough.

Figure 11A:
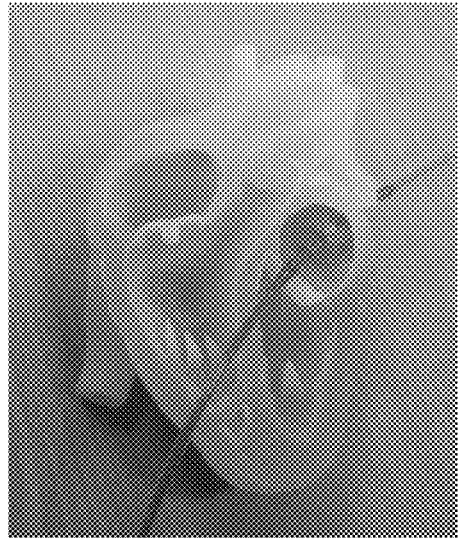
Figure 11B:
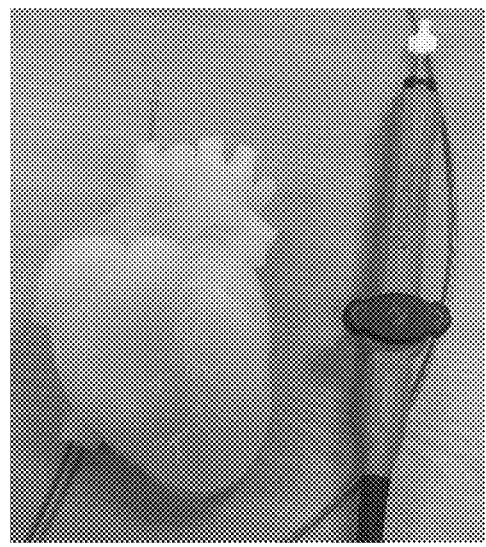

FIGS. 11A-B present images of heart-shaped objects made of an exemplary soft material formulation according to some of the present embodiments (BM61) with 19% scaffold and 0.6 mm coating made of an elastomeric modeling formulation, when practiced with a medical device.

FIG. 12 presents a Jarvik heart model, used in experiments performed according to some embodiments of the present invention.

FIGS. 13A-B present images of a heart-shaped model made of an exemplary soft material formulation according to some of the present embodiments (BM61) with 19% scaffold and 0.6 mm coating made of an elastomeric modeling formulation printed in a mode in which the roller rotated at a speed of 600 RPM (FIG. 13A), with the dashed circle showing a region of defects, and of a heart-shaped model printed in a mode in which the roller rotated at a speed of 412 RPM (FIG. 13B), showing the smoother outer surface thereof.

FIG. 14 presents images of heart models made of an exemplary soft material formulation according to some of the present embodiments (BM61) with 19% scaffold and 0.6 mm coating made of an elastomeric modeling formulation, printed in a mode in which outline gap was employed (right object), and in a mode in which an outline gap was not employed (left object), and showing a region with defects marked by a dashed circle on the image of the left heart model.

FIG. 15 presents a schematic illustration showing forces applied between a roller and a dispensed layer.

FIGS. 16A-F show several experimental reinforcement patterns tested in experiments performed according to some embodiments of the present invention.

Figure 17:
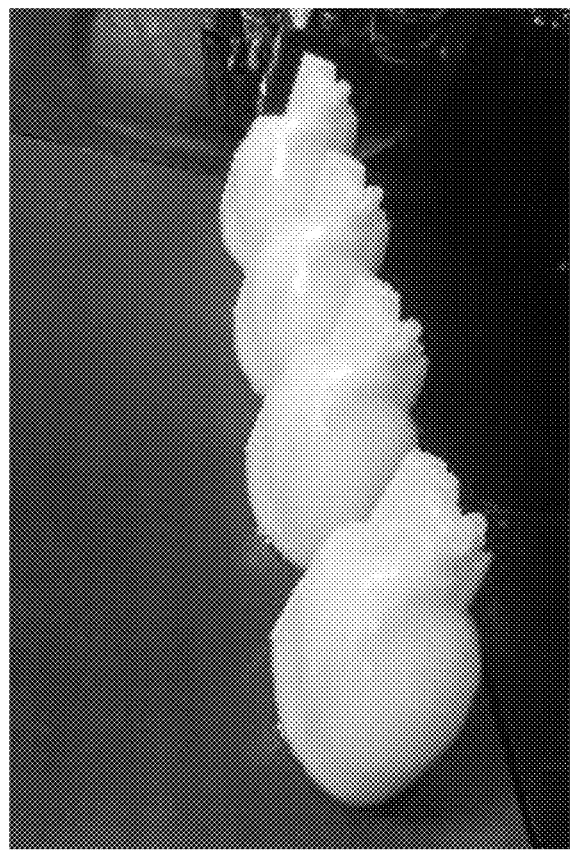

FIG. 17 is an image of four heart models printed in experiments performed according to some embodiments of the present invention.

Figure 18A:
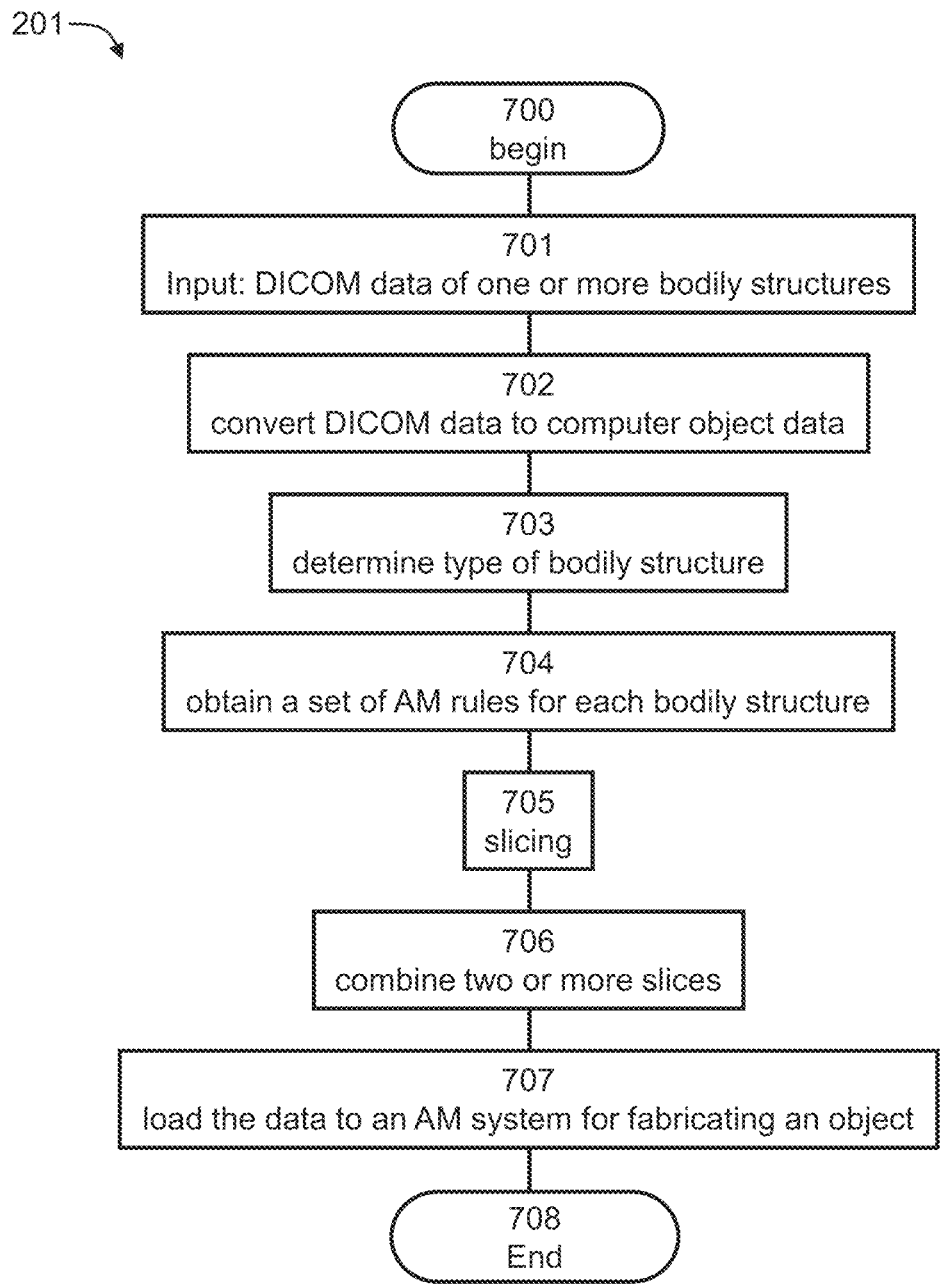
Figure 18B:
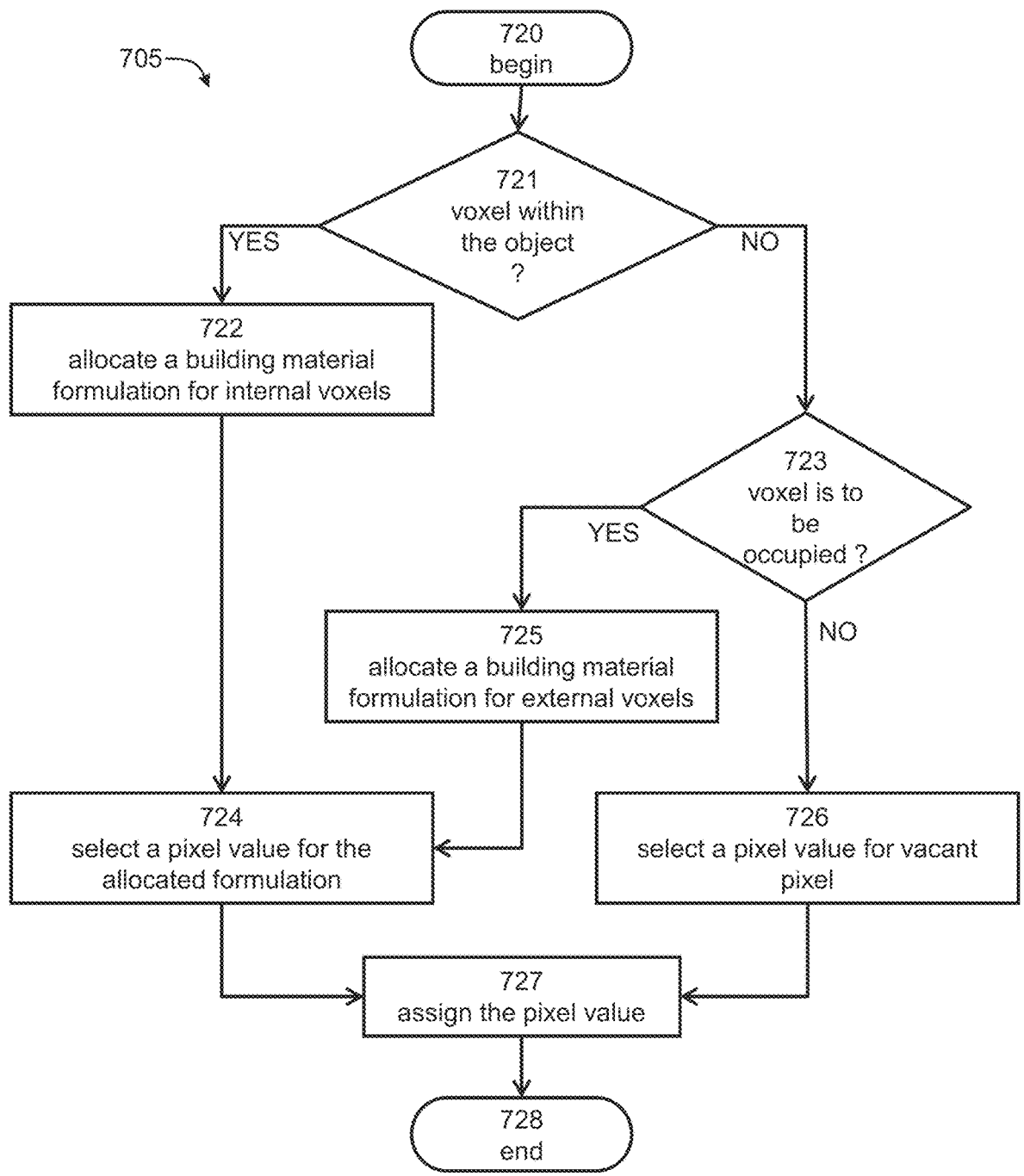

FIGS. 18A and 18B are flowchart diagrams describing an exemplified procedure which can be used according to some embodiments of the present invention for obtaining computer object data.

DESCRIPTION OF SPECIFIC EMBODIMENTS OF THE INVENTION

The present invention, in some embodiments thereof, relates to additive manufacturing (AM), and, more particularly, but not exclusively, to additive manufacturing of an object made, in at least a portion thereof, of a soft material that features properties (e.g., mechanical and/or visual properties) of a soft bodily tissue.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Currently used additive manufacturing processes, particularly those that utilize multi-material methodologies (e.g., PolyJet®), allow fabrication of objects made of materials featuring a wide range of properties, including, for example, hardness, strength, color, and transparency, which can be combined in the same object in any spatial distribution on a sub-millimeter scale. Such processes can be used to reproduce highly heterogeneous objects, featuring a variety of visual, mechanical and/or even functional properties at a sub-millimeter scale, according to pre-determined distribution.

The present inventors have conceived harnessing additive manufacturing processes, particularly while utilizing the multi-material technique, for fabricating objects that mimic bodily organs and tissues. Bodily organs feature a highly heterogeneous structure, which also varies from person to person. Such objects can be utilized, for example, as un-cellularized, artificial biomimicks for a variety of uses, such as medical training systems, pre-surgical models, phantoms, implants and education examples.

To date, there are additive manufacturing (e.g., 3D-inkjet printing) methodologies that produce objects that feature a structure and optionally a partial appearance that resemble that of some bodily parts, yet, none of these methodologies is capable of producing objects featuring mechanical properties that resemble those of bodily organ and tissues, and particularly of soft bodily tissues and bodily organs comprising same.

As discussed hereinabove, the lowest Shore hardness value obtained to date for hardened materials obtained in additive manufacturing processes is about 30 at the Shore Hardness A scale. Such hardness is substantially higher than that of bodily soft tissues and therefore currently used methodologies do not allow fabricating objects that mimic soft tissues and organs comprising same.

The Shore Hardness of currently practiced 3D-inkjet printed hardened materials is mainly attributed to the exclusive inclusion of curable materials in the formulations providing same.

Materials exhibiting low hardness as indicated above are typically gel-like materials (e.g., materials featuring mechanical properties of a gel), which are obtained from formulations that include, in addition to curable materials, also non-curable materials. Such gel-like materials are currently mostly used in additive manufacturing as support materials, which are aimed to be removed at the end of the process and do not form a part of the final object.

Herein and in the art, the term "gel" describes a material, often referred to as a semi-solid material, which comprises a three-dimensional solid network, typically made of fibrous structures chemically or physically linked therebetween, and a liquid phase encaged within this network. Gels are typically characterized by a consistency of a solid (e.g., are non-fluidic), and feature relatively low Tensile strength, relatively low Shear Modulus, e.g., lower than 100 kPa, and a Shear Loss Modulus to Shear Storage modulus (tan delta, G"/G') value lower than 1.

Gel-like materials according to the present embodiments are typically soft materials, which can be gels or solids, which feature mechanical and rheological properties of a gel.

However, such gel-like materials exhibit low Tensile strength and low Tear resistance, and hence break easily under stress, a property which is highly undesirable in additive manufacturing in general and 3D-inkjet printing in particular, and are further susceptible to being damaged when exposed to water and upon usage. Further, gel-like materials typically pose printing reliability issues such as smearing and stickiness, and, in addition, feature low dimension stability due to possible leakage, sweating or drying. Gel-like materials are further limited by their capability to swell other components or dry and change their form and dimensions in some environmental conditions and hence may be incompatible, or at least form unstable objects, when used in multi-material (e.g., digital material) techniques.

While a solution to the limitations associated with utilizing formulations that provide, when hardened, gel-like materials, may be a use of reinforcing materials which provide for improved strength or encapsulating the gel-like material in a material exhibiting the desired stiffness and/or durability, such a solution may provide hardened materials with overall characteristics, and particularly hardness, which exceed the target characteristics.

Liquid materials can also be added to the formulation, to balance the overall properties, yet, such materials may adversely affect the performance of the obtained object, for example, while causing a "bleeding" effect.

The present inventors have now designed and successfully practiced additive manufacturing processes such as 3D-inkjet printing processes, for successful fabrication of objects featuring properties of bodily organs and tissues, and particularly of objects featuring, in at least a portion thereof, properties that resemble those of soft bodily tissues, for example, objects that mimic structural, visual mechanical and even functional properties of bodily organs which comprise soft tissues.

These processes utilize curable formulations which, when hardened, feature Shore hardness values similar to those of soft tissues, and involve process parameters and techniques which allow performing additive manufacturing which such soft materials either alone or in combination with other curable formulations. The designed processes allow using formulations that provide soft materials while meeting process requirements such suitability to the AM technique used (e.g., 3D-inkjet printing), and while providing objects that feature, in addition to the required hardness, dimension stability, sufficient Tear resistance and visual properties that resemble those of bodily soft tissues and/or organs comprising same.

The method and system of the present embodiments manufacture three-dimensional objects based on computer object data in a layerwise manner by forming a plurality of layers in a configured pattern corresponding to the shape of the objects. The computer object data can be in any known format, including, without limitation, a Standard Tessellation Language (STL) or a StereoLithography Contour (SLC) format, Virtual Reality Modeling Language (VRML), Additive Manufacturing File (AMF) format, Drawing Exchange Format (DXF), Polygon File Format (PLY) or any other format suitable for Computer-Aided Design (CAD).

The term "object" as used herein refers to a whole object or a part thereof.

Each layer is formed by additive manufacturing apparatus which scans a two-dimensional surface and patterns it. While scanning, the apparatus visits a plurality of target locations on the two-dimensional layer or surface, and decides, for each target location or a group of target locations, whether or not the target location or group of target locations is to be occupied by building material formulation, and which type of building material formulation is to be delivered thereto. The decision is made according to a computer image of the surface.

In preferred embodiments of the present invention the AM comprises three-dimensional printing, more preferably three-dimensional inkjet printing. In these embodiments a building material formulation is dispensed from a dispensing head having a set of nozzles to deposit building material formulation in layers on a supporting structure. The AM apparatus thus dispenses building material formulation in target locations which are to be occupied and leaves other target locations void. The apparatus typically includes a plurality of dispensing heads, each of which can be configured to dispense a different building material formulation. Thus, different target locations can be occupied by different building material formulations. The types of building material formulations can be categorized into two major categories: modeling material formulation and support material formulation. The support material formulation serves as a supporting matrix or construction for supporting the object or object parts during the fabrication process and/or other purposes, e.g., providing hollow or porous objects. Support constructions may additionally include modeling material formulation elements, e.g. for further support strength. Support material formulations typically provide, when hardened, gel or gel-like materials.

The modeling material formulation is generally a composition which is formulated for use in additive manufacturing and which is able to form a three-dimensional object on its own, i.e., without having to be mixed or combined with any other substance.

The final three-dimensional object is made of the modeling material formulation or a combination of modeling material formulations or modeling and support material formulations or modification thereof (e.g., following curing). All these operations are well-known to those skilled in the art of solid freeform fabrication.

In some exemplary embodiments of the invention an object is manufactured by dispensing two or more different modeling material formulations, each material formulation from a different dispensing head of the AM. The material formulations are optionally and preferably deposited in layers during the same pass of the printing heads. The material formulations and combination of material formulations within the layer are selected according to the desired properties of the object.

Figure 1A:
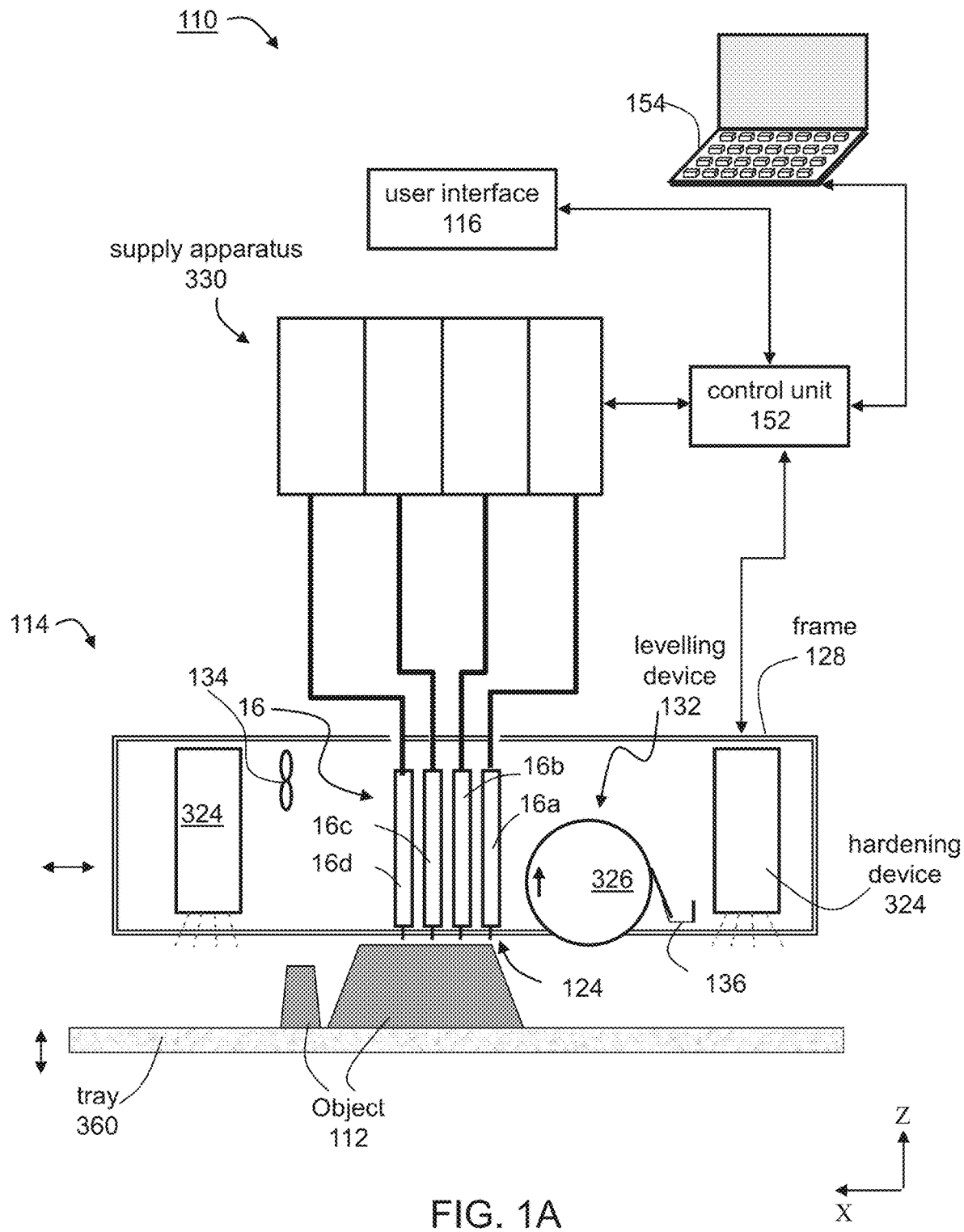
Figure 2A:
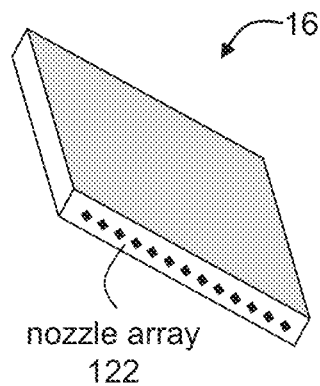
FIGS. 2A-2C are schematic illustrations of printing heads according to some embodiments of the present invention.
Figure 2B:
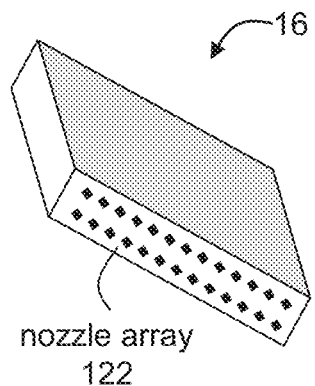
Figure 2C:
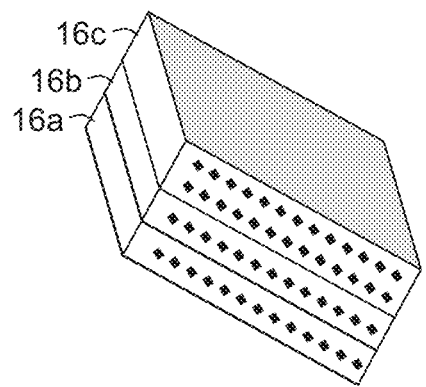

A representative and non-limiting example of a system 110 suitable for AM of an object 112 according to some embodiments of the present invention is illustrated in FIG. 1A. System 110 comprises an additive manufacturing apparatus 114 having a dispensing unit 16 which comprises a plurality of dispensing heads. Each head preferably comprises an array of one or more nozzles 122, as illustrated in FIGS. 2A-C described below, through which a liquid building material formulation 124 is dispensed.

Preferably, but not obligatorily, apparatus 114 is a three-dimensional printing apparatus, in which case the dispensing heads are printing heads, and the building material formulation is dispensed via inkjet technology. This need not necessarily be the case, since, for some applications, it may not be necessary for the additive manufacturing apparatus to employ three-dimensional printing techniques. Representative examples of additive manufacturing apparatus contemplated according to various exemplary embodiments of the present invention include, without limitation, fused deposition modeling apparatus and fused material formulation deposition apparatus.

Each dispensing head is optionally and preferably fed via a building material formulation reservoir which may optionally include a temperature control unit (e.g., a temperature sensor and/or a heating device), and a material formulation level sensor. To dispense the building material formulation, a voltage signal is applied to the dispensing heads to selectively deposit droplets of material formulation via the dispensing head nozzles, for example, as in piezoelectric inkjet printing technology. The dispensing rate of each head depends on the number of nozzles, the type of nozzles and the applied voltage signal rate (frequency). Such dispensing heads are known to those skilled in the art of solid freeform fabrication.

Preferably, but not obligatorily, the overall number of dispensing nozzles or nozzle arrays is selected such that half of the dispensing nozzles are designated to dispense support material formulation and half of the dispensing nozzles are designated to dispense modeling material formulation, i.e. the number of nozzles jetting modeling material formulations is the same as the number of nozzles jetting support material formulation. In the representative example of FIG. 1A, four dispensing heads 16a, 16b, 16c and 16d are illustrated. Each of heads 16a, 16b, 16c and 16d has a nozzle array. In this Example, heads 16a and 16b can be designated for modeling material formulation/s and heads 16c and 16d can be designated for support material formulation. Thus, head 16a can dispense a first modeling material formulation, head 16b can dispense a second modeling material formulation and heads 16c and 16d can both dispense support material formulation. In an alternative embodiment, heads 16c and 16d, for example, may be combined in a single head having two nozzle arrays for depositing support material formulation.

Yet it is to be understood that it is not intended to limit the scope of the present invention and that the number of modeling material formulation depositing heads (modeling heads) and the number of support material formulation depositing heads (support heads) may differ. Generally, the number of modeling heads, the number of support heads and the number of nozzles in each respective head or head array are selected such as to provide a predetermined ratio, a, between the maximal dispensing rate of the support material formulation and the maximal dispensing rate of modeling material formulation. The value of the predetermined ratio, a, is preferably selected to ensure that in each formed layer, the height of modeling material formulation equals the height of support material formulation. Typical values for a are from about 0.6 to about 1.5.

For example, for a=1, the overall dispensing rate of support material formulation is generally the same as the overall dispensing rate of the modeling material formulation when all modeling heads and support heads operate.

In a preferred embodiment, there are M modeling heads each having m arrays of p nozzles, and S support heads each having s arrays of q nozzles such that M×m×p=S×s×q. Each of the M×m modeling arrays and S×s support arrays can be manufactured as a separate physical unit, which can be assembled and disassembled from the group of arrays. In this embodiment, each such array optionally and preferably comprises a temperature control unit and a material formulation level sensor of its own, and receives an individually controlled voltage for its operation.

Apparatus 114 can further comprise a solidifying device 324 which can include any device configured to emit light, heat or the like that may cause the deposited material formulation to harden. For example, solidifying device 324 can comprise one or more radiation sources, which can be, for example, an ultraviolet or visible or infrared lamp, or other sources of electromagnetic radiation, or electron beam source, depending on the modeling material formulation being used. In some embodiments of the present invention, solidifying device 324 serves for curing or solidifying the modeling material formulation.

In some embodiments of the present invention apparatus 114 comprises cooling system 134 such as one or more fans or the like.

The dispensing head and radiation source are preferably mounted in a frame or block 128 which is preferably operative to reciprocally move over a tray 360, which serves as the working surface. In some embodiments of the present invention the radiation sources are mounted in the block such that they follow in the wake of the dispensing heads to at least partially cure or solidify the material formulations just dispensed by the dispensing heads. Tray 360 is positioned horizontally. According to the common conventions an X-Y-Z Cartesian coordinate system is selected such that the X-Y plane is parallel to tray 360. Tray 360 is preferably configured to move vertically (along the Z direction), typically downward. In various exemplary embodiments of the invention, apparatus 114 further comprises one or more leveling devices 132, e.g. a roller 326. Leveling device 326 serves to straighten, level and/or establish a thickness of the newly formed layer prior to the formation of the successive layer thereon. Leveling device 326 preferably comprises a waste collection device 136 for collecting the excess material formulation generated during leveling. Waste collection device 136 may comprise any mechanism that delivers the material formulation to a waste tank or waste cartridge.

In use, the dispensing heads of unit 16 move in a scanning direction, which is referred to herein as the X direction, and selectively dispense building material formulation in a predetermined configuration in the course of their passage over tray 360. The building material formulation typically comprises one or more types of support material formulation and one or more types of modeling material formulation. The passage of the dispensing heads of unit 16 is followed by the curing of the modeling material formulation(s) by radiation source 126. In the reverse passage of the heads, back to their starting point for the layer just deposited, an additional dispensing of building material formulation may be carried out, according to predetermined configuration. In the forward and/or reverse passages of the dispensing heads, the layer thus formed may be straightened by leveling device 326, which preferably follows the path of the dispensing heads in their forward and/or reverse movement. Once the dispensing heads return to their starting point along the X direction, they may move to another position along an indexing direction, referred to herein as the Y direction, and continue to build the same layer by reciprocal movement along the X direction. Alternately, the dispensing heads may move in the Y direction between forward and reverse movements or after more than one forward-reverse movement. The series of scans performed by the dispensing heads to complete a single layer is referred to herein as a single scan cycle.

Once the layer is completed, tray 360 is lowered in the Z direction to a predetermined Z level, according to the desired thickness of the layer subsequently to be printed. The procedure is repeated to form three-dimensional object 112 in a layerwise manner.

In another embodiment, tray 360 may be displaced in the Z direction between forward and reverse passages of the dispensing head of unit 16, within the layer. Such Z displacement is carried out in order to cause contact of the leveling device with the surface in one direction and prevent contact in the other direction.

System 110 optionally and preferably comprises a building material formulation supply system 330 which comprises the building material formulation containers or cartridges and supplies a plurality of building material formulations to fabrication apparatus 114.

A control unit 340 controls fabrication apparatus 114 and optionally and preferably also supply system 330. Control unit 340 typically includes an electronic circuit configured to perform the controlling operations. Control unit 340 preferably communicates with a data processor 154 which transmits digital data pertaining to fabrication instructions based on computer object data, e.g., a CAD configuration represented on a computer readable medium in a form of a Standard Tessellation Language (STL) format or the like. Typically, control unit 340 controls the voltage applied to each dispensing head or nozzle array and the temperature of the building material formulation in the respective printing head.

Once the manufacturing data is loaded to control unit 340 it can operate without user intervention. In some embodiments, control unit 340 receives additional input from the operator, e.g., using data processor 154 or using a user interface 116 communicating with unit 340. User interface 116 can be of any type known in the art, such as, but not limited to, a keyboard, a touch screen and the like. For example, control unit 340 can receive, as additional input, one or more building material formulation types and/or attributes, such as, but not limited to, color, characteristic distortion and/or transition temperature, viscosity, electrical property, magnetic property. Other attributes and groups of attributes are also contemplated.

Figure 1B:
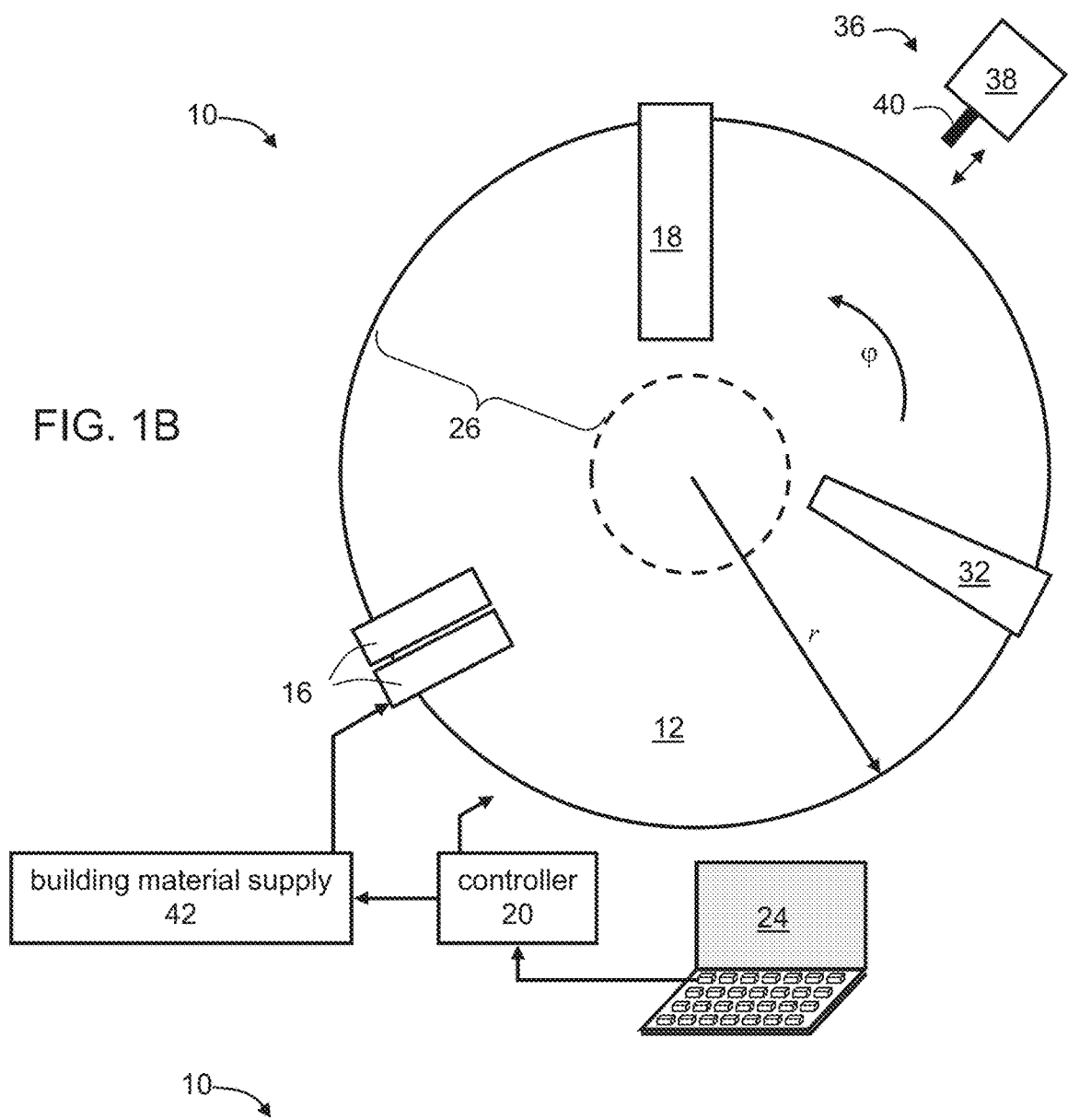
Figure 1C:
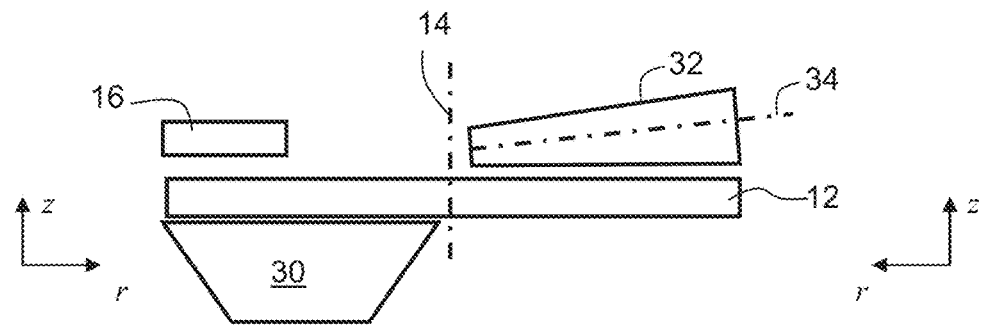
Figure 1D:
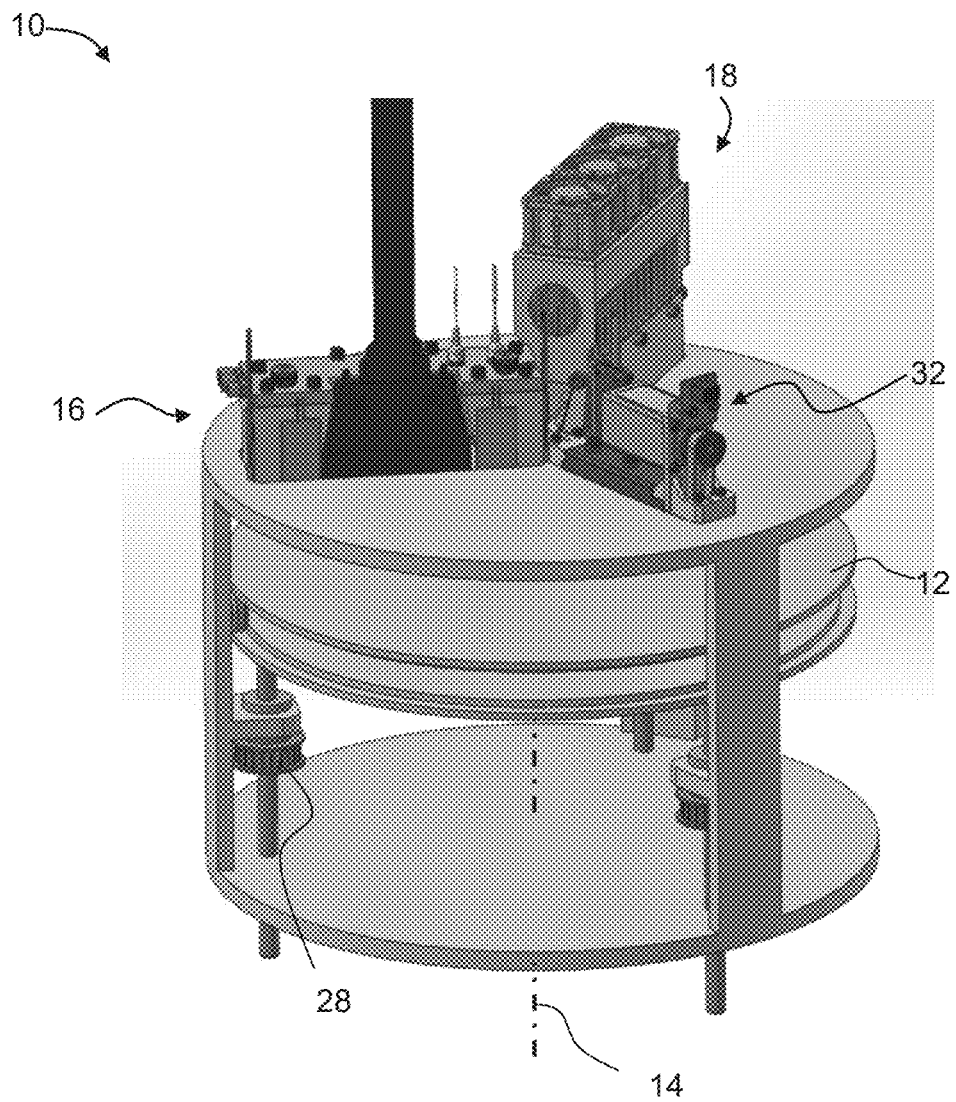

Another representative and non-limiting example of a system 10 suitable for AM of an object according to some embodiments of the present invention is illustrated in FIGS. 1B-D. FIGS. 1B-D illustrate a top view (FIG. 1B), a side view (FIG. 1C) and an isometric view (FIG. 1D) of system 10.

In the present embodiments, system 10 comprises a tray 12 and a plurality of inkjet printing heads 16, each having a plurality of separated nozzles. Tray 12 can have a shape of a disk or it can be annular. Non-round shapes are also contemplated, provided they can be rotated about a vertical axis.

Tray 12 and heads 16 are optionally and preferably mounted such as to allow a relative rotary motion between tray 12 and heads 16. This can be achieved by (i) configuring tray 12 to rotate about a vertical axis 14 relative to heads 16, (ii) configuring heads 16 to rotate about vertical axis 14 relative to tray 12, or (iii) configuring both tray 12 and heads 16 to rotate about vertical axis 14 but at different rotation velocities (e.g., rotation at opposite direction). While the embodiments below are described with a particular emphasis to configuration (i) wherein the tray is a rotary tray that is configured to rotate about vertical axis 14 relative to heads 16, it is to be understood that the present application contemplates also configurations (ii) and (iii). Any one of the embodiments described herein can be adjusted to be applicable to any of configurations (ii) and (iii), and one of ordinary skills in the art, provided with the details described herein, would know how to make such adjustment.

In the following description, a direction parallel to tray 12 and pointing outwardly from axis 14 is referred to as the radial direction r, a direction parallel to tray 12 and perpendicular to the radial direction r is referred to herein as the azimuthal direction $\varphi$, and a direction perpendicular to tray 12 is referred to herein is the vertical direction z.

The term "radial position," as used herein, refers to a position on or above tray 12 at a specific distance from axis 14. When the term is used in connection to a printing head, the term refers to a position of the head which is at specific distance from axis 14. When the term is used in connection to a point on tray 12, the term corresponds to any point that belongs to a locus of points that is a circle whose radius is the specific distance from axis 14 and whose center is at axis 14.

The term "azimuthal position," as used herein, refers to a position on or above tray 12 at a specific azimuthal angle relative to a predetermined reference point. Thus, radial position refers to any point that belongs to a locus of points that is a straight line forming the specific azimuthal angle relative to the reference point.

The term "vertical position," as used herein, refers to a position over a plane that intersect the vertical axis 14 at a specific point.

Tray 12 serves as a supporting structure for three-dimensional printing. The working area on which one or objects are printed is typically, but not necessarily, smaller than the total area of tray 12. In some embodiments of the present invention the working area is annular. The working area is shown at 26. In some embodiments of the present invention tray 12 rotates continuously in the same direction throughout the formation of object, and in some embodiments of the present invention tray reverses the direction of rotation at least once (e.g., in an oscillatory manner) during the formation of the object. Tray 12 is optionally and preferably removable. Removing tray 12 can be for maintenance of system 10, or, if desired, for replacing the tray before printing a new object. In some embodiments of the present invention system 10 is provided with one or more different replacement trays (e.g., a kit of replacement trays), wherein two or more trays are designated for different types of objects (e.g., different weights) different operation modes (e.g., different rotation speeds), etc. The replacement of tray 12 can be manual or automatic, as desired. When automatic replacement is employed, system 10 comprises a tray replacement device 36 configured for removing tray 12 from its position below heads 16 and replacing it by a replacement tray (not shown). In the representative illustration of FIG. 1B tray replacement device 36 is illustrated as a drive 38 with a movable arm 40 configured to pull tray 12, but other types of tray replacement devices are also contemplated.

Exemplified embodiments for the printing head 16 are illustrated in FIGS. 2A-2C. These embodiments can be employed for any of the AM systems described above, including, without limitation, system 110 and system 10.

FIGS. 2A-B illustrate a printing head 16 with one (FIG. 2A) and two (FIG. 2B) nozzle arrays 22. The nozzles in the array are preferably aligned linearly, along a straight line. In embodiments in which a particular printing head has two or more linear nozzle arrays, the nozzle arrays are optionally and preferably can be parallel to each other.

When a system similar to system 110 is employed, all printing heads 16 are optionally and preferably oriented along the indexing direction with their positions along the scanning direction being offset to one another.

When a system similar to system 10 is employed, all printing heads 16 are optionally and preferably oriented radially (parallel to the radial direction) with their azimuthal positions being offset to one another. Thus, in these embodiments, the nozzle arrays of different printing heads are not parallel to each other but are rather at an angle to each other, which angle being approximately equal to the azimuthal offset between the respective heads. For example, one head can be oriented radially and positioned at azimuthal position $\varphi_1$, and another head can be oriented radially and positioned at azimuthal position $\varphi_2$. In this example, the azimuthal offset between the two heads is $\varphi_1$-$\varphi_2$, and the angle between the linear nozzle arrays of the two heads is also $\varphi_1$-$\varphi_2$.

In some embodiments, two or more printing heads can be assembled to a block of printing heads, in which case the printing heads of the block are typically parallel to each other. A block including several inkjet printing heads 16a, 16b, 16c is illustrated in FIG. 2C.

In some embodiments, system 10 comprises a support structure 30 positioned below heads 16 such that tray 12 is between support structure 30 and heads 16. Support structure 30 may serve for preventing or reducing vibrations of tray 12 that may occur while inkjet printing heads 16 operate. In configurations in which printing heads 16 rotate about axis 14, support structure 30 preferably also rotates such that support structure 30 is always directly below heads 16 (with tray 12 between heads 16 and tray 12).

Tray 12 and/or printing heads 16 is optionally and preferably configured to move along the vertical direction z, parallel to vertical axis 14 so as to vary the vertical distance between tray 12 and printing heads 16. In configurations in which the vertical distance is varied by moving tray 12 along the vertical direction, support structure 30 preferably also moves vertically together with tray 12. In configurations in which the vertical distance is varied by heads 16 along the vertical direction, while maintaining the vertical position of tray 12 fixed, support structure 30 is also maintained at a fixed vertical position.

The vertical motion can be established by a vertical drive 28. Once a layer is completed, the vertical distance between tray 12 and heads 16 can be increased (e.g., tray 12 is lowered relative to heads 16) by a predetermined vertical step, according to the desired thickness of the layer subsequently to be printed. The procedure is repeated to form a three-dimensional object in a layerwise manner.

The operation of inkjet printing heads 16 and optionally and preferably also of one or more other components of system 10, e.g., the motion of tray 12, are controlled by a controller 20. The controller can have an electronic circuit and a non-volatile memory medium readable by the circuit, wherein the memory medium stores program instructions which, when read by the circuit, cause the circuit to perform control operations as further detailed below.

Controller 20 can also communicate with a host computer 24 which transmits digital data pertaining to fabrication instructions based on computer object data, e.g., in a form of a Standard Tessellation Language (STL) or a StereoLithography Contour (SLC) format, Virtual Reality Modeling Language (VRML), Additive Manufacturing File (AMF) format, Drawing Exchange Format (DXF), Polygon File Format (PLY) or any other format suitable for Computer-Aided Design (CAD). The object data formats are typically structured according to a Cartesian system of coordinates. In these cases, computer 24 preferably executes a procedure for transforming the coordinates of each slice in the computer object data from a Cartesian system of coordinates into a polar system of coordinates. Computer 24 optionally and preferably transmits the fabrication instructions in terms of the transformed system of coordinates. Alternatively, computer 24 can transmit the fabrication instructions in terms of the original system of coordinates as provided by the computer object data, in which case the transformation of coordinates is executed by the circuit of controller 20.

Figure 3A:
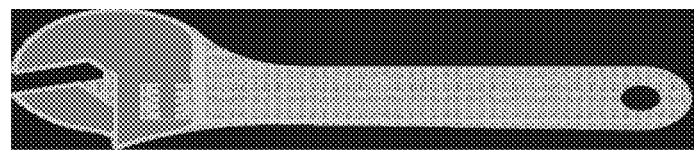
FIGS. 3A and 3B are schematic illustrations demonstrating coordinate transformations according to some embodiments of the present invention.
Figure 3B:
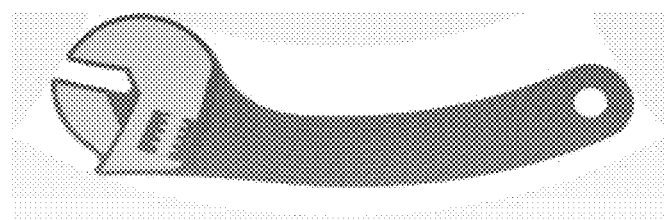

The transformation of coordinates allows three-dimensional printing over a rotating tray. In conventional three-dimensional printing, the printing heads reciprocally move above a stationary tray along straight lines. In such conventional systems, the printing resolution is the same at any point over the tray, provided the dispensing rates of the heads are uniform. Unlike conventional three-dimensional printing, not all the nozzles of the head points cover the same distance over tray 12 during at the same time. The transformation of coordinates is optionally and preferably executed so as to ensure equal amounts of excess material formulation at different radial positions. Representative examples of coordinate transformations according to some embodiments of the present invention are provided in FIGS. 3A-B, showing three slices of an object (each slice corresponds to fabrication instructions of a different layer of the objects), where FIG. 3A illustrates a slice in a Cartesian system of coordinates and FIG. 3B illustrates the same slice following an application of a transformation of coordinates procedure to the respective slice.

Typically, controller 20 controls the voltage applied to the respective component of the system 10 based on the fabrication instructions and based on the stored program instructions as described below.

Generally, controller 20 controls printing heads 16 to dispense, during the rotation of tray 12, droplets of building material formulation in layers, such as to print a three-dimensional object on tray 12.

System 10 optionally and preferably comprises one or more radiation sources 18, which can be, for example, an ultraviolet or visible or infrared lamp, or other sources of electromagnetic radiation, or electron beam source, depending on the modeling material formulation being used. Radiation source can include any type of radiation emitting device, including, without limitation, light emitting diode (LED), digital light processing (DLP) system, resistive lamp and the like. Radiation source 18 serves for curing or solidifying the modeling material formulation. In various exemplary embodiments of the invention the operation of radiation source 18 is controlled by controller 20 which may activate and deactivate radiation source 18 and may optionally also control the amount of radiation generated by radiation source 18.

In some embodiments of the invention, system 10 further comprises one or more leveling devices 32 which can be manufactured as a roller or a blade. Leveling device 32 serves to straighten the newly formed layer prior to the formation of the successive layer thereon. In some embodiments, leveling device 32 has the shape of a conical roller positioned such that its symmetry axis 34 is tilted relative to the surface of tray 12 and its surface is parallel to the surface of the tray. This embodiment is illustrated in the side view of system 10 (FIG. 1C).

The conical roller can have the shape of a cone or a conical frustum.

The opening angle of the conical roller is preferably selected such that is a constant ratio between the radius of the cone at any location along its axis 34 and the distance between that location and axis 14. This embodiment allows roller 32 to efficiently level the layers, since while the roller rotates, any point p on the surface of the roller has a linear velocity which is proportional (e.g., the same) to the linear velocity of the tray at a point vertically beneath point p. In some embodiments, the roller has a shape of a conical frustum having a height h, a radius $R_1$ at its closest distance from axis 14, and a radius $R_2$ at its farthest distance from axis 14, wherein the parameters h, $R_1$ and $R_2$ satisfy the relation $R_1/R_2=(R-h)/h$ and wherein R is the farthest distance of the roller from axis 14 (for example, R can be the radius of tray 12).

The operation of leveling device 32 is optionally and preferably controlled by controller 20 which may activate and deactivate leveling device 32 and may optionally also control its position along a vertical direction (parallel to axis 14) and/or a radial direction (parallel to tray 12 and pointing toward or away from axis 14.

In some embodiments of the present invention system 10 comprises cooling system (not shown, see FIG. 1A) such as one or more fans or the like.

In some embodiments of the present invention printing heads 16 are configured to reciprocally move relative to tray along the radial direction r. These embodiments are useful when the lengths of the nozzle arrays 22 of heads 16 are shorter than the width along the radial direction of the working area 26 on tray 12. The motion of heads 16 along the radial direction is optionally and preferably controlled by controller 20.

Some embodiments contemplate the fabrication of an object by dispensing different material formulations from different dispensing heads. These embodiments provide, inter alia, the ability to select material formulations from a given number of material formulations and define desired combinations of the selected material formulations and their properties. According to the present embodiments, the spatial locations of the deposition of each material formulation with the layer is defined, either to effect occupation of different three-dimensional spatial locations by different material formulations, or to effect occupation of substantially the same three-dimensional location or adjacent three-dimensional locations by two or more different material formulations so as to allow post deposition spatial combination of the material formulations within the layer, thereby to form a composite material formulation at the respective location or locations.

Any post deposition combination or mix of modeling material formulations is contemplated. For example, once a certain material formulation is dispensed it may preserve its original properties. However, when it is dispensed simultaneously with another modeling material formulation or other dispensed material formulations which are dispensed at the same or nearby locations, a composite material formulation having a different property or properties to the dispensed material formulations is formed.

The present embodiments thus enable the deposition of a broad range of material formulation combinations, and the fabrication of an object which may consist of multiple different combinations of material formulations, in different parts of the object, according to the properties desired to characterize each part of the object.

Further details on the principles and operations of an AM system suitable for the present embodiments are found in U.S. Published Application No. 20100191360, the contents of which are hereby incorporated by reference.

Figure 4:
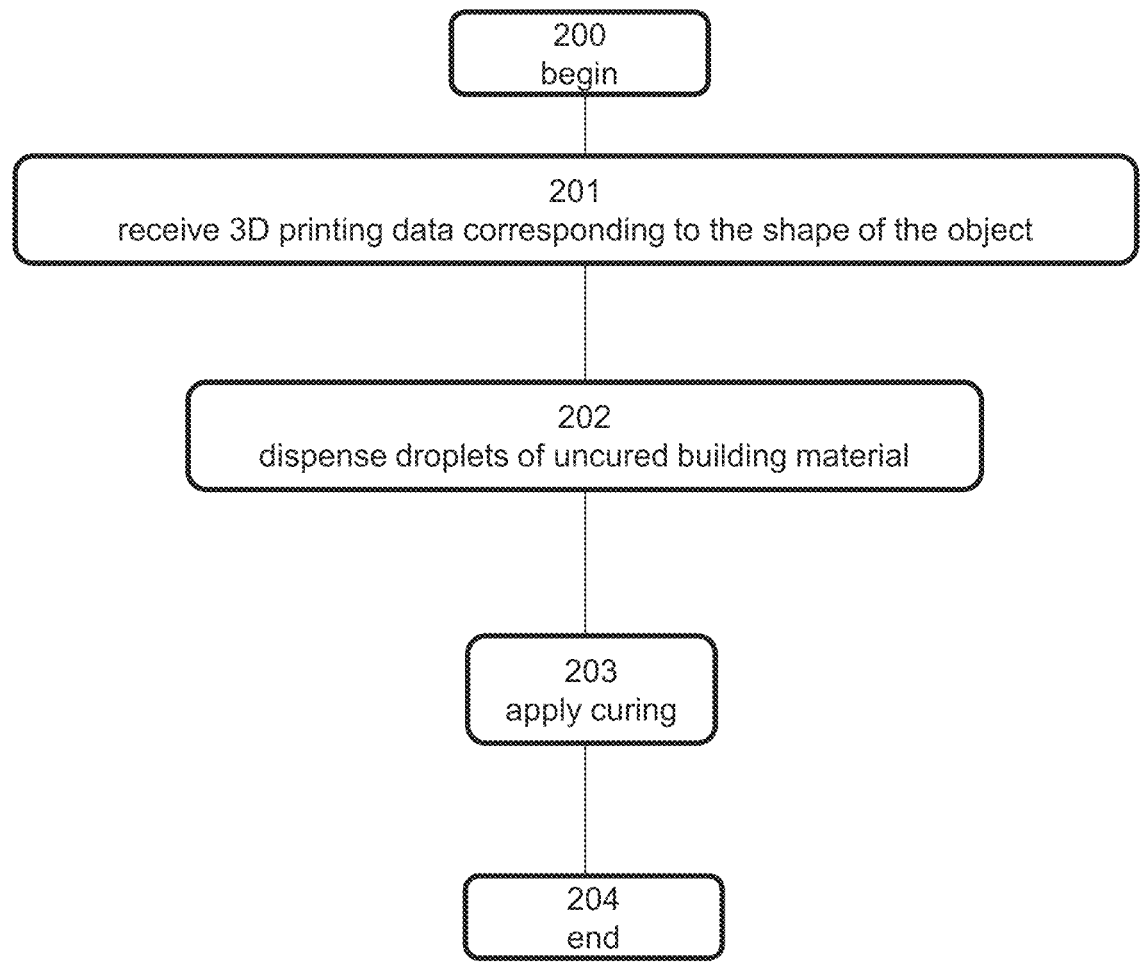
FIG. 4 is a flowchart diagram of a method suitable for fabricating an object by additive manufacturing according to aspects of some embodiments of the present invention.

FIG. 4 presents a flowchart describing an exemplary method according to some embodiments of the present invention.

It is to be understood that, unless otherwise defined, the operations described hereinbelow can be executed either contemporaneously or sequentially in many combinations or orders of execution. Specifically, the ordering of the flowchart diagrams is not to be considered as limiting. For example, two or more operations, appearing in the following description or in the flowchart diagrams in a particular order, can be executed in a different order (e.g., a reverse order) or substantially contemporaneously. Additionally, several operations described below are optional and may not be executed.

Computer programs implementing the method of the present embodiments can commonly be distributed to users on a distribution medium such as, but not limited to, a floppy disk, a CD-ROM, a flash memory device and a portable hard drive. From the distribution medium, the computer programs can be copied to a hard disk or a similar intermediate storage medium. The computer programs can be run by loading the computer instructions either from their distribution medium or their intermediate storage medium into the execution memory of the computer, configuring the computer to act in accordance with the method of this invention. All these operations are well-known to those skilled in the art of computer systems.

The computer implemented method of the present embodiments can be embodied in many forms. For example, it can be embodied in on a tangible medium such as a computer for performing the method operations. It can be embodied on a computer readable medium, comprising computer readable instructions for carrying out the method operations. In can also be embodied in electronic device having digital computer capabilities arranged to run the computer program on the tangible medium or execute the instruction on a computer readable medium.

The method begins at 200 and optionally and preferably proceeds to 201 at which computer object data in any of the aforementioned formats are obtained. An exemplified technique for obtaining the computer object data is described hereinunder with reference to FIGS. 18A and 18B.

The method continues to 202 at which droplets of the uncured building material as described herein (e.g., one or more soft modeling material formulations as described herein, optionally also one or more elastomeric curable formulations as described herein and further optionally also a support material formulation) are dispensed in layers, on a receiving medium, optionally and preferably using an AM system, such as, but not limited to, system 110 or system 10, according to the computer object data (e.g., printing data), and as described herein. The dispensing 202 is optionally and preferably by at least two different multi-nozzle inkjet printing heads. The receiving medium can be a tray of an AM system (e.g., tray 360 or 12) as described herein or a previously deposited layer.

The droplets are optionally and preferably dispensed in a configured pattern corresponding to a slice of an object that has the shape of, or a shape resembling a shape of, a bodily structure as defined herein.

In some embodiments of the present invention, the dispensing 202 is effected under ambient environment.

Optionally, before being dispensed, the uncured building material, or a part thereof (e.g., one or more formulations of the building material), is heated, prior to being dispensed. These embodiments are particularly useful for uncured building material formulations having relatively high viscosity at the operation temperature of the working chamber of a 3D inkjet printing system. The heating of the formulation(s) is preferably to a temperature that allows jetting the respective formulation through a nozzle of a printing head of a 3D inkjet printing system. In some embodiments of the present invention, the heating is to a temperature at which the respective formulation exhibits a viscosity of no more than X centipoises, where X is about 30 centipoises, preferably about 25 centipoises and more preferably about 20 centipoises, or 18 centipoises, or 16 centipoises, or 14 centipoises, or 12 centipoises, or 10 centipoises, or even lower.

The heating can be executed before loading the respective formulation into the printing head of the AM (e.g., 3D inkjet printing) system, or while the formulation is in the printing head or while the composition passes through the nozzle of the printing head.

In some embodiments, the heating is executed before loading of the respective formulation into the dispensing (e.g., inkjet printing) head, so as to avoid clogging of the dispensing (e.g., inkjet printing) head by the formulation in case its viscosity is too high.

In some embodiments, the heating is executed by heating the dispensing (e.g., inkjet printing) heads, at least while passing the modeling material formulation(s) through the nozzle of the dispensing (e.g., inkjet printing) head.

Once the uncured building material is dispensed on the receiving medium according to the computer object data (e.g., printing data), the method optionally and preferably continues to 203 at which a curing condition (e.g., curing energy) is applied to the deposited layers, e.g., by means of a radiation source as described herein. Preferably, the curing condition is applied to each individual layer following the deposition of the layer and prior to the deposition of the previous layer.

In some embodiments, applying a curing condition is effected under a generally dry and inert environment, as described herein.

The method ends at 204.

In some embodiments, the method is executed using an exemplary system as described herein in any of the respective embodiments and any combination thereof.

The modeling material formulation(s) can be contained in a particular container or cartridge of a solid freeform fabrication apparatus or a combination of modeling material formulations deposited from different containers of the apparatus.

In some embodiments, at least one, or at least a few (e.g., at least 10, at least 20, at least 30 at least 40, at least 50, at least 60, at least 80, or more), or all, of the layers is/are formed by dispensing droplets, as in 202, of a single soft modeling material formulation, as described herein in any of the respective embodiments.

In some embodiments, at least one, or at least a few (e.g., at least 10, at least 20, at least 30 at least 40, at least 50, at least 60, at least 80, or more), or all, of the layers is/are formed by dispensing droplets, as in 202, of two or more modeling material formulations, as described herein in any of the respective embodiments, each from a different dispensing (e.g., inkjet printing) head.

These embodiments provide, inter alia, the ability to select materials from a given number of materials and define desired combinations of the selected materials and their properties. According to the present embodiments, the spatial locations of the deposition of each material with the layer is defined, either to effect occupation of different three-dimensional spatial locations by different materials, or to effect occupation of substantially the same three-dimensional location or adjacent three-dimensional locations by two or more different materials so as to allow post deposition spatial combination of the materials within the layer, thereby to form a composite material at the respective location or locations.

Any post deposition combination or mix of modeling materials is contemplated. For example, once a certain material is dispensed it may preserve its original properties. However, when it is dispensed simultaneously with another modeling material or other dispensed materials which are dispensed at the same or nearby locations, a composite material having a different property or properties to the dispensed materials is formed.

Some of the embodiments thus enable the deposition of a broad range of material combinations, and the fabrication of an object which may consist of multiple different combinations of materials, in different parts of the object, according to the properties desired to characterize each part of the object.

In some of these embodiments, the two or more modeling material formulations are dispensed in a voxelated manner, wherein voxels of one of said modeling material formulations are interlaced with voxels of at least one another modeling material formulation.

Some embodiments thus provide a method of layerwise fabrication of a three-dimensional object, in which for each of at least a few (e.g., at least two or at least three or at least 10 or at least 20 or at least 40 or at least 80) of the layers or all the layers, two or more modeling formulations are dispensed, optionally and preferably using system 10 or system 110. Each modeling formulation is preferably dispensed by jetting it out of a plurality of nozzles of a printing head (e.g., head 16). The dispensing is in a voxelated manner, wherein voxels of one of said modeling material formulations are interlaced with voxels of at least one another modeling material formulation, according to a predetermined voxel ratio.

Figure 5:
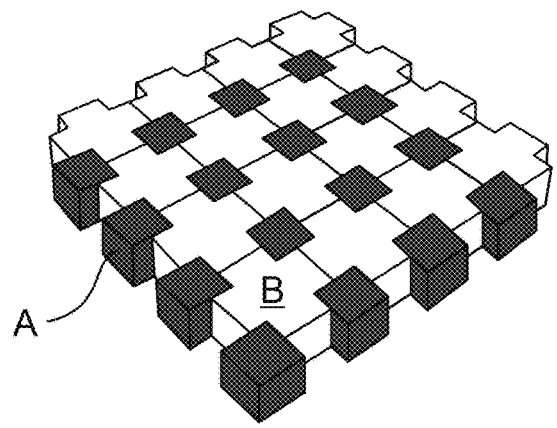
FIG. 5 is a schematic illustration of a region which includes interlaced modeling materials.

Such a combination of two modeling material formulations at a predetermined voxel ratio is referred to as digital material (DM). A representative example of a digital material is illustrated in FIG. 5, showing materials A and B which are interlaced over a region of a layer in a voxelated manner.

In some embodiments, dispensing two modeling material formulations at a predetermined voxel ratio allows obtaining materials featuring mechanical properties as desired, and as exemplified in the Examples section that follows for composite structures made of a soft material formulation and an elastomeric curable formulation.

For any predetermined ratio of the materials, a digital material can be formed for example, by ordered or random interlacing. Also contemplated are embodiments in which the interlacing is semi-random, for example, a repetitive pattern of sub-regions wherein each sub-region comprises random interlacing.

In some embodiments of the present invention the interlaced locations occupied by one of the formulation constitute from about 10% to about 30% or from about 15% to about 25% of an area of the layer. These embodiments are particularly useful when one of the materials is a soft modeling material formulation, as described herein, and the other material is an elastomeric curable formulation, as described herein, in which case the interlaced locations occupied by the elastomeric curable formulation optionally and preferably constitutes from about 10% to about 30% from about 15% to about 25% of the area of the layer.

In some embodiments of the present invention voxel elements containing one of the formulations form a volumetric fibrous pattern in the object. These embodiments are particularly useful when one of the materials is a soft modeling material formulation, as described herein, and the other material is an elastomeric curable formulation, as described herein, in which case the voxel elements containing the elastomeric curable formulation form a volumetric fibrous pattern in the object. The characteristic fiber thickness of the fibrous pattern is, without limitation, from about 0.4 mm to about 0.6 mm.

The fibrous pattern can be vertical with respect to planar surfaces of the layers, or, more preferably, but not necessarily, diagonal with respect to the planar surfaces of the layers. The diagonal fibrous pattern is optionally and preferably generally parallel (e.g., with a deviation of less than 10°) to a tearing force applied by the roller (e.g., roller 326 or 32) on the layer during the straightening operation. Representative of fibrous pattern directions including, without limitation, an angle of from about 30° to about 60°, e.g., about 45° with respect to the planar surfaces.

In some of any of the embodiments described herein, when droplets of two or more modeling material formulations are dispensed, in each of at least a few layers, as described herein, the dispensing is such that forms a core region and one or more envelope regions at least partially surrounding said core region. Such a dispensing results in fabrication of an object constructed from a plurality of layers and a layered core constituting core regions and a layered shell constituting envelope regions.

In some preferred embodiments of the present invention, the shell is formed of the elastomeric curable formulation as described herein. Optionally and preferably the shell can be removed following a completion of the additive manufacturing of the three-dimensional object.

The structure according to some of these embodiments is a shelled structure made of two or more curable materials. The structure typically comprises a layered core which is at least partially coated by one or more layered shells such that at least one layer of the core engages the same plane with a layer of at least one of the shells.

The thickness of each shell, as measured perpendicularly to the surface of the structure, is typically at least 10 µm. In various exemplary embodiments, the core and the shell are different from each other in their thermo-mechanical properties. This is readily achieved by fabricating the core and shell from different modeling material formulations or different combinations of modeling material formulations. The thermo-mechanical properties of the core and shell are referred to herein as "core thermo-mechanical properties" and "shell thermo-mechanical properties," respectively.

A representative and non-limiting example of a structure according to some embodiments of the present invention is shown in FIGS. 6A-D.

Figure 6A:
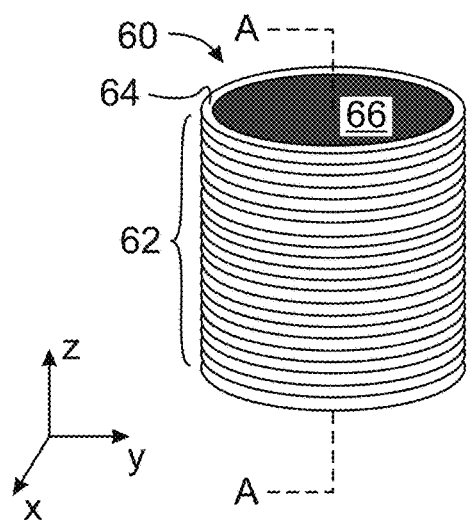
Figure 6B:
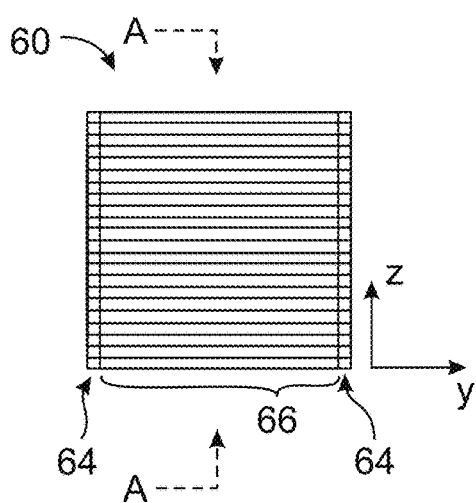

FIG. 6A is a schematic illustration of a perspective view a structure 60, and FIG. 6B is a cross-sectional view of structure 60 along line A-A of FIG. 6A. For clarity of presentation a Cartesian coordinate system is also illustrated.

Structure 60 comprises a plurality of layers 62 stacked along the z direction. Structure 60 is typically fabricated by an AM technique, e.g., using system 10 or 110, whereby the layers are formed in a sequential manner. Thus, the z direction is also referred to herein as the "build direction" of the structure. Layers 62 are, therefore, perpendicular to the build direction. Although structure 60 is shown as a cylinder, this need not necessarily be the case, since the structure of the present embodiments can have any shape.

The shell and core of structure 60 are shown at 64 and 66, respectively. As shown, the layers of core 66 and the layers of shell 64 are co-planar. The AM technique allows the simultaneous fabrication of shell 64 and core 66, whereby for a particular formed layer, the inner part of the layer constitutes a layer of the core, and the periphery of the layer, or part thereof, constitutes a layer of the shell.

A peripheral section of a layer which contributes to shell 64 is referred to herein as an "envelope region" of the layer. In the non-limiting example of FIGS. 6A and 6B, each of layers 62 has an envelope region. Namely, each layer in FIGS. 6A and 6B contributes both to the core and to the shell. However, this need not necessarily be the case, since, for some applications, it may be desired to have the core exposed to the environment in some regions. In these applications, at least some of the layers do not include an envelope region.

Figure 6C:
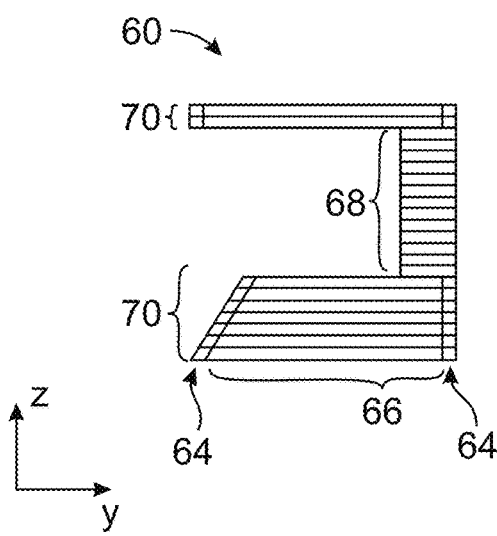

A representative example of such configuration is illustrated in the cross-sectional view of FIG. 6C, showing some layers 68 which contribute to the core but not to the shell, and some layers 70 which contribute to both the core and the shell. In some embodiments, one or more layers do not include a region with core thermo-mechanical properties and comprise only a region with shell thermo-mechanical properties. These embodiments are particularly useful when the structure has one or more thin parts, wherein the layers forming those parts of the structure are preferably devoid of a core region. Also contemplated are embodiments in which one or more layers do not include a region with shell thermo-mechanical properties and comprise only a region with core thermo-mechanical properties.

Figure 6D:
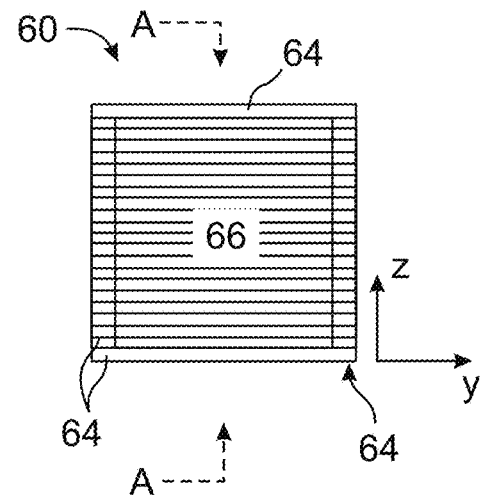

The shell can, optionally and preferably, also cover structure 60 from above and/or below, relative to the z direction. In these embodiments, some layers at the top most and/or bottom most parts of structure 60 have at least one material property which is different from core 66. In various exemplary embodiments of the invention the top most and/or bottom most parts of structure 60 have the same material property as shell 64. A representative example of this embodiment is illustrated in FIG. 6D. The top/bottom shell of structure 60 may be thinner (e.g., 2 times thinner) than the side shell, e.g. when the top or bottom shell comprises a layer above or below the structure, and therefore has the same thickness as required for layers forming the object.

In some embodiments of the present invention the core is made of a soft modeling formulation as described herein in any of the respective embodiments and the shell is made of an elastomeric curable formulation as described herein in any of the respective embodiments.

In some embodiments of the present invention both the core and the shell are DM materials.

In some embodiments of the present invention the core comprises DM materials, made, for example, of soft modeling formulation as described herein in any of the respective embodiments and an elastomeric curable formulation as described herein in any of the respective embodiments, and the shell is made of an elastomeric curable formulation as described herein in any of the respective embodiments.

Whenever a "soft material formulation" or an "elastomeric curable formulation" are described, formulation systems comprising same are contemplated.

When both the core and shell are made of a DM composed of the same modeling material formulations, the relative surface density of any of the modeling materials in the core is different from the relative surface density of that material in the shell or envelope region. In some embodiments, however, the core is formed from a DM and the shell is formed of a single modeling material formulation or vice versa.

In various exemplary embodiments of the invention the thickness of the shell, as measured in the x-y plane (perpendicularly to the build direction z) is non-uniform across the build direction. In other words, different layers of the structure may have envelope regions of different widths. For example, the thickness of the shell along a direction parallel to the x-y plane can be calculated as a percentage of the diameter of the respective layer along that direction, thus making the thickness dependent on the size of the layer. In various exemplary embodiments of the invention the thickness of the shell is non-uniform across a direction which is tangential to the outer surface of the shell and perpendicular to the build direction. In terms of the structure's layers, these embodiments correspond to an envelope region having a width which is non-uniform along the periphery of the respective layer.

In some embodiments of the present invention the shell of the structure, or part thereof, is by itself a 'shelled' structure, comprising more than envelope region. Specifically in these embodiments, the structure comprises an inner core, at least partially surrounded by at least one intermediate envelope region, wherein the intermediate envelope(s) is surrounded by an outer envelope region. The thickness of the intermediate envelope region(s), as measured perpendicularly to the build direction, is optionally and preferably larger (e.g., 10 times larger) than the thickness of the outermost envelope region. In these embodiments, the intermediate envelope region(s) serves as a shell of the structure and therefore has the properties of the shell as further detailed hereinabove. The outermost envelope shell may also serve for protecting the intermediate envelope(s) from breakage under load.

The structure of the present embodiments can be formed, as stated, in a layerwise manner, for example, using system 10 or 110 described above. In various exemplary embodiments of the invention a computer implemented method automatically performs dynamic adaptation of the shell to the specific elements of the structure. The method can optionally and preferably employ user input to calculate the shell for each region of the structure and assigns the voxels of the outer surfaces to the respective modeling material or combination of modeling materials. The computer implemented method can be executed by a control unit which controls the solid freeform fabrication apparatus (e.g., control unit 152 or 20 see FIGS. 1A and 1B) via a data processor (e.g., data processor 154 or 24).

In some embodiments of the present invention one or more additional shell layers are dispensed so as to form a shell also at the top most and/or bottom most parts of the structure. These layers are preferably devoid of a core region since they serve for shelling the core from above or from below. When it is desired to shell the core from above, the additional shell layer(s) are dispensed on top of all other layers, and when it is desired to shell the core from below, the additional layer(s) are dispensed on the working surface (e.g., tray 360 or 12, see FIGS. 1A and 1B) while all other layers are dispensed thereafter.

Any of the envelope regions optionally has a width of at least 10 µm. Preferably, all the envelope regions have a width of at least 10 µm. Any of the core and envelope regions, and optionally also the top most and/or bottom most additional layers, may be fabricated using modeling material formulations or combinations of modeling material formulations (e.g., digital materials) as described herein.

In some embodiments of this invention, the shell is fabricated selectively in different regions of the structure so as to change the material properties only in selected regions areas without affecting the mechanical properties of other regions.

In some of any of the embodiments of the present invention, once the layers are dispensed as described herein, exposure to curing energy as described herein is effected. In some embodiments, the curable materials are UV-curable materials and the curing energy is such that the radiation source emits UV radiation.

In some embodiments, where the building material comprises also support material formulation(s), the method proceeds to removing the support material formulation. This can be performed by mechanical and/or chemical means, as would be recognized by any person skilled in the art.

FIG. 18A is a flowchart diagram of an exemplified procedure which can be used according to some embodiments of the present invention for executing operation 201 above. The procedure is particularly useful for obtaining computer object data for use with system 10 or system 110. It is to be understood that, unless otherwise defined, the operations described hereinbelow can be executed either contemporaneously or sequentially in many combinations or orders of execution. Specifically, the ordering of the flowchart diagram is not to be considered as limiting. For example, two or more operations, appearing in the following description or in the flowchart diagrams in a particular order, can be executed in a different order (e.g., a reverse order) or substantially contemporaneously. Additionally, several operations described below are optional and may not be executed.

The procedure begins at 700 and optionally and preferably continues to 701 at which data in a format suitable for Digital Imaging and Communications in Medicine (hereinafter DICOM data) are received.

The DICOM data can be received from an acquisition console such as, but not limited to, an MRI system, a CT imaging system, a helical CT system, a positron emission tomography (PET) system, a 2D or 3D fluoroscopic imaging system, a 2D, 3D, or 4D ultrasound imaging system, an endoscope system, a bedside monitor system, an x-ray system, and a hybrid-imaging system capable of CT, MR, PET, ultrasound or other imaging techniques. The DICOM data preferably includes one or more digital image data describing one or more bodily structures comprising one or more bodily tissue and/or organ elements.

In some embodiments of the present invention DICOM data preferably includes one or more digital image data describing one or more soft tissues or organs or systems comprising soft tissues, in some embodiments of the present invention DICOM data preferably includes one or more digital image data describing one or more bodily structures comprising one or more bodily organ and/or tissue elements other than a soft tissue, and in some embodiments of the present invention DICOM data preferably includes one or more digital image data describing one or more bodily soft tissues, and also one or more digital image data describing one or more bodily structures comprising one or more bodily organ and/or tissue elements other than a soft tissues.

The procedure optionally and preferably continues to 702 at which the DICOM data are converted to computer object data. For instance, the computer object data can be in any known format, including, without limitation, a Standard Tessellation Language (STL) or a StereoLithography Contour (SLC) format, Virtual Reality Modeling Language (VRML), Additive Manufacturing File (AMF) format, Drawing Exchange Format (DXF), Polygon File Format (PLY) or any other format suitable for Computer-Aided Design (CAD). The conversion from DICOM data to computer object data optionally and preferably includes one or more segmentation procedures, selected from the group consisting of thresholding, region growing, dynamic region growing, and the like.

Thresholding procedures exploit the differences in density of different tissues to select image pixels with a higher or equal value to a prescribed threshold value. For example, a prescribed threshold value of a thresholding procedure can be selected so that image pixels with regard to hard tissue pass the thresholding procedure, and other image pixels relating are filtered out. The thresholding procedure can be applied multiple times each time using a different threshold value, so as to obtain separate datasets for different tissue types.

Region growing procedures are typically applied after thresholding to isolate areas which have the same density range. A region growing procedure can examine neighboring pixels of initial seed points and determines whether the neighboring pixels belong to the region. The procedure is optionally and preferably performed iteratively to segment the image. For example seed points can be selected according to different tissue types and the region growing segmentation techniques can be performed iteratively to separate image pixels as belonging to one of these tissue types. In dynamic region growing, a range of image parameters are selected in addition to the seed points. These parameters are selected to allow recognizing an image pixel as the same as the seed points.

Typically, but not necessarily, an initial background segmentation procedure is applied for removing from the DICOM data elements that do not belong to any of the tissue types of interest. Subsequent segmentation procedures can then be applied for more refined segmentation of one or more refined area of a subject's anatomy by using different segmentation techniques.

Following segmentation, the conversion from DICOM data to computer object data can also include smoothing, wrapping and/or hole-filling to compensate for artifacts within the DICOM data. A format conversion procedure can then be applied to the segmented DICOM data so as to provide the computer object data in any of the aforementioned formats.

In some embodiments of the present invention, the input data are received from a computer readable medium as computer object data, in which case it is not necessary to obtain and convert the DICOM data. In these embodiments, it is not necessary to execute operations 701 and 702.

In any event, the computer object data preferably include data pertaining to a shape of one or more bodily structures comprising one or more bodily tissue element as further detailed hereinabove. Whether obtained by conversion of DICOM data or received directly as such, the computer object data are optionally and preferably arranged in multiple files, each pertaining to a different bodily structure.

At 703 a type of the bodily structure to be mimicked by an additive manufactured object (e.g., soft tissue, bone, muscle tissue, smooth tissue, bone tumor, cartilage, disks, nerves/spinal cord, body liquid vessel) is determined for each data file. The determination can be by extracting information present in the respective computer object data file, or the respective DICOM data file, or from information associated with the respective data file.

At 704, a set of rules associated with the respective bodily structure is selected. The set of AM rules optionally and preferably include building material formulation(s) to be dispensed as well as dispensing parameters and conditions (e.g., temperature, interlacing ratios, interlacing texture). The set of AM rules can be obtained from a look-up table having an entry for each type of bodily structure, and a set of parameters associated with each such entry. In some embodiments of the present invention a subject profile is received. The subject profile typically includes one or more of weight, gender, age, ethnicity, race, clinical history, etc. In some embodiments of the present invention the subject profile also includes a genetic profile, which can encompass the genes in an entire genome of the subject, or it can encompass a specific subset of genes. The genetic profile may include genomic profile, a proteomic profile, an epigenomic profile and/or a transcriptomic profile. In embodiments in which the subject profile is received, the look-up table also includes entries for different profile parameters. Specifically, the lookup table can include several entries for each type of bodily structure, one entry for each profile parameter. As a representative and non-limiting example, a look-up table can include several entries for, say, soft tissue structure, wherein one entry for each age group.

In some embodiments of the present invention the set of AM rules are selected by the operator, for example, via a user interface (e.g., user interface 116). Also contemplated, are embodiments in which both a look-up table and a user interface are employed. For example, the look-up table can be used for narrowing the number of options provided to the operator, and the user interface can be used for selecting the final set of AM rules.

Further contemplated, are embodiments in which the set of rules are received together with the computer object data. For example, each computer object data file can include one or more AM rules, or be associated with AM rule file including one or more AM rules, wherein the AM rules correspond to the respective computer object data.

At 705 a slicing operation is applied, optionally and preferably separately for each computer object data file. The slicing is typically executed by generating, for computer object data file, a set of image files, each describing a 2D voxel map of a plane characterized by a different vertical coordinate (e.g., the aforementioned z coordinate), which plane corresponds to a layer of the object mimicking the respective bodily structure. The image file can be in any 2D format known in the art, such as, but not limited to, a bitmap file (BMP), portable network graphs (PNG), or the like. A preferred slicing technique is provided below with reference to FIG. 18B.

At 706 two or more of the sets of image files are combined into a single image file. For example, image files that correspond to the same vertical coordinate but to objects mimicking different bodily structures can be combined to provide an image file that describe a layer which, once printed, includes sliced sections of two or more objects respectively mimicking two or more bodily structures. At 707 the image file(s) is uploaded to an AM system such as, but not limited to, system 10 or system 110, to fabricate non-biological objects that resembles the bodily structures.

The procedure ends at 708.

FIG. 18B is a flowchart diagram of an exemplified slicing method according to some embodiments of the present invention. The method is particularly useful for executing slicing operation 705 of FIG. 18A. The method begins at 720 and is optionally and preferably applied for each voxel in the computer object data.

At decision 721 a distance field value relative to the 3D object is determined for the respective voxel. The distance field value indicates whether the voxel is within or outside the object mimicking the bodily structure to be printed. For example, negative distance field values can be assigned to voxels outside the object mimicking the bodily structure, positive distance field values can be assigned to voxels within the object mimicking the bodily structure, and zero distance field values can be assigned to voxels on the outermost surface of the object mimicking the bodily structure. A representative example of a technique suitable for determining distance field values is provided in example 5, below.

When the voxel is within or on the outermost surface of the object mimicking the bodily structure (for example, when the distance field value is positive), the method continues to 722 at which a building material formulation is allocated for the respective voxel. The building material formulation can be a modeling material formulation (e.g., a soft modeling material formulation or a formulation system comprising same, an elastomeric curable formulation or a formulation system comprising same, or any combination of these formulations or formulation systems), a support material formulation, or a liquid material formulation, and is optionally and preferably determined based on the position of the voxel in the 3D object and the AM rules obtained at 704 above. From 722 the method continues to 724 at which the method selects a pixel value that corresponds to the allocated building material formulation. The pixel value can be any value that uniquely represents the allocated building material formulation. For example, the pixel value can be a grayscale level or a color value (e.g., RGB value).

When the voxel is outside the object mimicking the bodily structure (for example, when the distance field value is negative), the method continues to decision 723 at which the method determine whether the voxel is to be occupied or left vacant. If the voxel is to be left vacant, the method continues to terminal 726, the method selects a pixel value that uniquely represents a vacant pixel. For example, the method can select a null value to represents a vacant pixel. Alternatively, when the voxel is outside the object mimicking the bodily structure the method can continues from 723 to terminal 728 where it ends, in which case pixels that have not been assigned with any values are to be interested as instructions to leave a voxel vacant.

If the voxel is to be occupied, the method continues to 725 at which a building material is allocated to the voxel, and then to 724 at which the method selects a pixel value that corresponds to the allocated building material formulation as further detailed hereinabove.

From 724, 725 or 726, as the case may be, the method continues to 727 at which the selected pixel value is assigned to a pixel in a 2D image, wherein the location of the pixel in the 2D image corresponds to the location of the voxel within the layer that is represented by the 2D image.

The method ends at 728.

Herein throughout, the term "bodily" when used in the context of, for example, a structure, organ, tissue or material, describes the indicated structure, organ, tissue or material, as being part of a body of a subject, preferably a living subject. This term encompasses biological systems, organs, tissues, cells and materials.

Herein throughout, the term "subject" encompasses animals, preferably mammals, more preferably human beings, at any age. This term encompasses individuals who are at risk to develop the pathology or who suffer from a pathology.

The term "bodily structure" refers to a part of a body of a subject, as described herein, including systems, organs, tissues, cells and a surrounding environment of any of the foregoing. A bodily structure, for example, can comprise several organs acting together in a living body, for example, a gastrointestinal tract, a cardiovascular system, a respiratory tract, and the like. The structure can include, in addition to organs and tissues that form a part of these systems, also structures related to a pathology, for example, tumor cells or tissues. A bodily structure can alternatively include, for example, a heart and blood vessels associated therewith. A bodily structure can alternatively include an organ, such as, for example, an arm or forearm, or leg, and can encompass the related bones system and muscle tissues, blood vessels, tumor tissues (if present) and/or skin tissues in its surroundings.

The term "tissue" describes a part of an organism consisting of cells designed to perform a function or functions. Examples include, but are not limited to, brain tissue, retina, skin tissue, hepatic tissue, pancreatic tissue, bone, cartilage, connective tissue, blood tissue, muscle tissue, cardiac tissue, vascular tissue, renal tissue, pulmonary tissue, gonadal tissue, hematopoietic tissue.

The Soft Modeling Material Formulation:

The building material formulation usable in the additive manufacturing process described herein in any of the respective embodiments comprises at least one modeling material formulation which features (exhibits, characterized by), when hardened, a Shore A hardness lower than 10 or a Shore 00 hardness lower than 40. Such a formulation is also referred to herein as "soft material formulation" or "soft material modeling formulation" or "soft modeling formulation".

Herein and in the art, the term "hardness" describes a resistance of a material to permanent indentation, when measured under the specified conditions. Shore A hardness, which also referred to as Hardness ShA or as Shore scale A hardness, for example, is determined following the ASTM D2240 standard using a digital Shore A hardness durometer. Shore 00 hardness, which also referred to as Hardness Sh00 or as Shore scale 00 hardness, for example, is determined following the ASTM D2240 standard using a digital Shore 00 hardness durometer. D, A and 00 are common scales of hardness values, and each is measured using a respective durometer. FIG. 7 presents Shore hardness values on different scales of exemplary common materials.

In some of any of the embodiments described herein, a soft material formulation as described herein features, when hardened, Shore A hardness in a range of from 0 to about 10, including any intermediate values and subranges therebetween.

In some of any of the embodiments described herein, a soft material formulation as described herein features, when hardened, Shore 00 hardness in a range of from 0 to about 40, or from 0 to about 30, or from 0 to about 20, or, for example, of from about 10 to about 20, or from about 10 to about 30, including any intermediate values and subranges therebetween.

Another parameter demonstrating the low hardness of a soft material obtainable for a hardened soft material formulation as described herein is the compression modulus.

By "Compression Modulus" it is meant herein the ratio of mechanical stress to strain in a material when that material is being compressed. Compression modulus can also be regarded as a modulus of elasticity applied to a material under compression. In some embodiments, compression modulus is determined according to ASTM D695. In some embodiments, compression modulus is determined as described in the Examples section that follows, and can be expressed also as compression stress at 40% strain, or as the slope of a stress vs. strain curve, when measured in a compression mode, taken at strain values of from 0.001 to 0.01.

In some of any of the embodiments described herein, a soft material formulation as described herein features, when hardened, Compression Modulus of at least 0.01 MPa.

In some embodiments, a soft material formulation as described herein features, when hardened, Compression Modulus (as defined herein) of from about 0.01 to about 0.2 MPa, or from about 0.02 to about 0.2 MPa, from about 0.1 to about 0.1 MPa, or from about 0.02 to about 0.1 MPa, or from about 0.03 to about 0.07 MPa, including any intermediate value and subranges therebetween.

In some embodiments, a soft material formulation as described herein features, when hardened, in addition to its low hardness, at least a moderate Tear resistance.

Tear Resistance (TR) describes the force required to tear a material, whereby the force acts substantially parallel to the major axis of the sample. Tear Resistance, when measured according to ASTM D 624 can be used to measure the resistance to the formation of a tear (tear initiation) and the resistance to the expansion of a tear (tear propagation). Typically, a sample is held between two holders and a uniform pulling force is applied until deformation occurs. Tear Resistance is then calculated by dividing the force applied by the thickness of the material. Materials with low Tear Resistance tend to have poor resistance to abrasion.

In some embodiments, the Tear resistance is determined as described in the Examples section that follows.

In some of any of the embodiments described herein, a soft material formulation described herein features, when hardened, Tear resistance of at least 100 N/m, as determined by ASTM D 624 for a specimen having a thickness of 2 mm.

In some embodiments, a soft material formulation described herein features, when hardened, Tear resistance, as determined by ASTM D 624 for a specimen having a thickness of 2 mm, of at least 150 N, and in some embodiments, it features Tear resistance of from 150 N/m to 500 Nm, or from 150 to 400 N/m, or from 200 N/m to 400 N/m, or from 200 N/m to 350 N/m, including any intermediate values and subranges therebetween.

In some embodiments, Tear Resistance measurements are used to determine also the time to break of a specimen under the applied pulling force.

In some embodiments, a soft material formulation as described herein features, when hardened, a time to break, as measured by ASTM D 624 for a specimen having a thickness of 2 mm, of at least 9 seconds, for example, from 9 to 50, or from 9 to 40 or from 9 to 30, or from 15 to 30 seconds.

In some of any of the embodiments described herein, a soft modeling formulation as described herein is characterized by good reactivity, that is, the dispensed layers comprising the formulation are hardened when exposed to a curing condition within a time period of less than 1 second, and/or a hardened layer made of the soft modeling formulation exhibits good adhesion (e.g., as demonstrated in the Examples section that follows).

In some embodiments, a soft modeling formulation as described herein is characterized by a liquid to solid transition within 1 second upon exposure to a curing condition. In some of these embodiments, the curing condition is UV irradiation, for example, UV irradiation at 1 W/cm$^2$. In some embodiments, the UV irradiation is by a UV Mercury (Hg) arc lamp (Medium pressure, metal-halide). In some embodiments, a soft modeling formulation as described herein is characterized by a liquid to solid transition within 1 second upon exposure to a curing condition (e.g., UV irradiation at wavelength of from about 300 nm to about 450 nm and power density of about 1 W/cm$^2$, for example using a 250 W mercury arc lamp).

The time period required for liquid to solid transition can be determined using DSC measurements, as known in the art.

In some of any of the embodiments described herein, a soft modeling material formulation as described herein is characterized by good compatibility with the AM system, that is, it meets the system operation requirements (e.g., in terms of viscosity and viscosity stability, thermal stability, etc., as described hereinabove).

In some of any of the embodiments described herein, a soft modeling material formulation as described herein is characterized by good compatibility with an AM which is 3D inkjet printing, that is, it is jettbale, compatible with inkjet printing heads, and features a viscosity suitable for use with inkjet printing heads as described herein and a viscosity stability at 25-75° C., for at least 24, preferably at least 48, hours.

In some of any of the embodiments described herein, a soft modeling formulation as described herein is characterized by stability (shelf-life stability) of at least one month, or at least 2, 3, 4, 5 and even at least 6 months, that is, the formulation features substantially the same properties (e.g., any of the properties described herein) upon storage for the indicated time period.

In some of any of the embodiments described herein, a soft modeling formulation as described herein is characterized by stability (shelf-life stability) of at least one month, or at least 2, 3, 4, 5 and even at least 6 months, that is, the formulations features substantially the same appearance (e.g., color) upon storage (e.g., at room temperature) for the indicated time period.

According to some of any of the embodiments described herein, the soft material formulation is a curable formulation and in some embodiments the formulation is curable by comprising materials that are polymerizable when exposed to a curing condition (e.g., curing energy), as described herein. It is noted that, as described in further detail hereinbelow, not all the materials in the curable formulation should be curable to render a formulation curable. Thus, herein throughout, and with respect to any formulation described herein, a formulation is defined as curable when at least one of the materials in the formulation is curable, or polymerizable, when exposed to a curing condition.

Herein throughout, a "curable material" is a compound (typically a monomeric or oligomeric compound, yet optionally a polymeric material) which, when exposed to a curing condition (e.g., curing energy), as described herein, solidifies or hardens to form a hardened (e.g., cured) material. Curable materials are typically polymerizable materials, which undergo polymerization and/or cross-linking when exposed to suitable curing condition (e.g., energy source).

A curable material, according to the present embodiments, also encompasses materials which harden or solidify (cure) without being exposed to a curing energy, but rather to a curing condition (for example, upon exposure to a chemical reagent), or simply upon exposure to the environment.

The terms "curable" and "solidifiable" as used herein are interchangeable.

According to some embodiments of the present invention, a curable material as described herein hardens upon undergoing polymerization, and is also referred to herein as a polymerizable material.

The polymerization can be, for example, free-radical polymerization, cationic polymerization or anionic polymerization, and each can be induced when exposed to curing energy such as, for example, radiation, heat, etc., as described herein, or to a curing condition other than curing energy.

In some of any of the embodiments described herein, a curable material is a photopolymerizable material, which polymerizes and/or undergoes cross-linking upon exposure to radiation, as described herein, and in some embodiments the curable material is a UV-curable material, which polymerizes and/or undergoes cross-linking upon exposure to UV or UV-vis radiation, as described herein.

In some embodiments, a curable material as described herein is a photopolymerizable material that polymerizes via photo-induced free-radical polymerization. Alternatively, the curable material is a photopolymerizable material that polymerizes via photo-induced cationic polymerization.

In some of any of the embodiments described herein, a curable material can be a monomer, an oligomer or a short-chain polymer, each being polymerizable and/or cross-linkable as described herein.

In some of any of the embodiments described herein, when a curable material is exposed to a curing condition (e.g., radiation), it hardens (cures, solidifies) by any one, or combination, of chain elongation and cross-linking.

In some of any of the embodiments described herein, a curable material is a monomer or a mixture of monomers which can form a polymeric or co-polymeric material upon a polymerization or co-polymerization reaction, when exposed to a condition (e.g., curing energy) at which the polymerization reaction occurs. Such curable materials are also referred to herein as monomeric curable materials.

In some of any of the embodiments described herein, a curable material is an oligomer or a mixture of oligomers which can form a polymeric or co-polymeric material upon a polymerization or co-polymerization reaction, when exposed to a curing condition (e.g., curing energy) at which the polymerization or co-polymerization reaction occurs. Such curable materials are also referred to herein as oligomeric curable materials.

In some of any of the embodiments described herein, a curable material, whether monomeric or oligomeric, can be a mono-functional curable material or a multi-functional curable material.

Herein, a mono-functional curable material comprises one functional group that can undergo polymerization when exposed to curing energy (e.g., radiation).

A multi-functional curable material comprises two or more, e.g., 2, 3, 4 or more, functional groups that can undergo polymerization when exposed to curing energy. Multi-functional curable materials can be, for example, di-functional, tri-functional or tetra-functional curable materials, which comprise 2, 3 or 4 groups that can undergo polymerization, respectively. The two or more functional groups in a multi-functional curable material are typically linked to one another by a linking moiety, as defined herein. When the linking moiety is an oligomeric or polymeric moiety, the multi-functional group is an oligomeric or polymeric multi-functional curable material. Multi-functional curable materials can undergo polymerization when subjected to curing energy and/or act as cross-linkers.

According to some of any of the embodiments described herein, the formulation is a synthetic, non-biological, formulation, and is comprised essentially of synthetic materials.

As used herein, the term "synthetic material" describes a material, typically an organic material, that is not inherently present in a living subject. This term encompasses non-biological (e.g., organic) materials, non-naturally occurring (e.g., organic) materials, and/or synthetically prepared (e.g., organic) materials.

According to some of any of the embodiments described herein, the formulation is devoid of biological materials.

By "biological material", as used herein, it is meant materials, typically organic materials, that are inherently present in living subjects as defined herein. Such organic materials encompass, for example, cells and cellular components, proteins (including enzymes, hormones, receptor ligands and the like) peptides, nucleic acids, genes, amino acids.

By "devoid of" it is meant less than 1%, or less than 0.5%, or less than 0.1%, or less than 0.05%, or less than 0.01%, or less than 0.005%, or less than 0.001%, and less, including null, by weight, of the total weight of the formulation.

It is to be understood that some of the present embodiments contemplate a formulation that contains water.

According to some of any of the embodiments described herein, the formulation is un-cellularized, namely, is devoid of biological cells or cellular components.

According to some of any of the embodiments described herein, the formulation comprises water in an amount of less than 10%, or less than 8%, or less than 5%, or even less, by weight, or is devoid of, as defined herein, water.

According to some of any of the embodiments described herein, the formulation is such that does not form a hydrogel when exposed to a curing condition.

As used herein and in the art, the term "hydrogel" describes a material comprising a three-dimensional fibrous network as a solid phase, and an aqueous solution encaged within the fibrous network. A hydrogel typically includes at least 80%, typically at least 85%, by weight, water.

Any formulation that features Shore hardness as indicated, preferably in combination with one or more, preferably all, of the other features described herein is contemplated in the additive manufacturing process described herein.

According to some embodiments of any of the embodiments described herein, a soft modeling material formulation comprises a combination of curable materials and non-curable polymeric material.

Herein, the phrase "non-curable" with respect to a material in the soft formulation means that the material does not solidify when exposed to a curing condition at which the curable materials solidify. A non-curable material can be a material that is devoid of polymerizable and/or cross-linkable groups, or can include polymerizable and/or cross-linkable groups yet polymerization and/or cross-linking is not effected when exposed to a curing condition at which the curable materials solidify.

In some embodiments, the non-curable material is devoid of polymerizable and/or cross-linkable groups.

Exemplary soft material formulations suitable for use in the context of the present embodiments, and which meet the process requirements, the object requirements (e.g., as featuring a hardness of a soft bodily tissue as described herein), and are compatible with an elastomeric curable formulation, and the design thereof, are presented in the Examples section that follows.

Such soft modeling formulations are obtained by manipulating the type and amount of the non-curable material(s) and the type and amount of curable materials, such that properties such as printability, compatibility with other curable formulations, and mechanical performance of the printed object are provided. According to some of any of the embodiments described herein, the soft modeling material formulation comprises curable materials and non-curable materials, and a total amount of the non-curable materials ranges from about 10 to about 49, or from about 10 to about 30, % by weight, of the total weight of the soft modeling formulation, including any intermediate values and subranges therebetween.

In some embodiments, a total amount of the non-curable polymeric materials ranges from 20 to 40, or from 25 to 40, % by weight, of the total weight of the soft modeling formulation, including any intermediate values and subranges therebetween.

According to some of any of the embodiments described herein, the soft modeling material formulation comprises curable materials and non-curable materials, and a ratio of the total amount of the curable materials and the total amount of the non-curable polymeric material ranges from 4:1 to 1.1:1, or from 3:1 to 2:1, including any intermediate values and subranges therebetween.

According to some of any of the embodiments described herein, a total amount of the curable materials ranges from about 55 to about 70 weight percents, of the total weight of the soft modeling formulation, including any intermediate values and subranges therebetween.

According to some of any of the embodiments described herein, the curable materials comprise at least one mono-functional curable material and at least one multi-functional curable material.

According to some of any of the embodiments described herein, an amount of the mono-functional curable material ranges from 50% to 89% by weight of the total weight of the soft material formulation, including any intermediate values and subranges therebetween.

According to some of any of the embodiments described herein, an amount of the multi-functional curable material ranges from about 1% to about 10% by weight of the total weight of the soft material formulation, including any intermediate values and subranges therebetween.

According to some of any of the embodiments described herein, a soft modeling material formulation as described herein comprises a mono-functional curable material, a multi-functional curable material and a non-curable polymeric material.

In some of any of the embodiments described herein, the formulation comprises more than 50%, by weight, of curable materials, that is, a total amount of the mono-functional and multi-functional curable materials is at least 51%, by weight, of the total weight of the formulation.

In some of any of the embodiments described herein, a total amount of the mono-functional and multi-functional curable materials ranges from 51% to 90% or to 89%, by weight, and in some embodiments, it ranges from 55% to 70%, by weight, of the total weight of the formulation, including any intermediate values and subranges therebetween.

In some of any of the embodiments described herein, a total amount of the mono-functional curable material(s) ranges from 50% to 60%, or from 55% to 60%, by weight, of the total weight of the formulation, including any intermediate value and subranges therebetween.

In some of any of the embodiments described herein, a total amount of the multi-functional curable material(s) ranges from 3% to 10%, or from 5% to 10%, or is, for example, 7%, by weight, of the total weight of the formulation, including any intermediate value and subranges therebetween.

In some of any of the embodiments described herein, a total amount of the non-curable material ranges from 10% to 49%, or from 20% to 45%, or from 25% to 40%, by weight, of the total weight of the formulation, including any intermediate value and subranges therebetween.

In some of any of the embodiments described herein, the formulation comprises:
a mono-functional curable material, as described herein in any of the respective embodiments, in an amount of from 50 to 89 weight percents of the total weight of the formulation, including any intermediate value and subranges therebetween;
a non-curable polymeric material, as described herein in any of the respective embodiments, in an amount ranging from 10 to 49 weight percents of the total weight of the formulation, including any intermediate value and subranges therebetween; and
a multi-functional curable material, as described herein in any of the respective embodiments, in an amount ranging from 1 to 10 weight percents of the total weight of the formulation, including any intermediate value and subranges therebetween.

In some of any of the embodiments described herein, a ratio of the total amount of said mono-functional and said multi-functional curable materials and the amount of said non-curable polymeric material ranges from 4:1 to 1.1:1, or from 3:1 to 2:1, including any intermediate values and subranges therebetween.

In some of any of the embodiments described herein, the curable and/or non-curable materials comprised in the formulation are selected such that:
(i) the non-curable polymeric material features a molecular weight of at least 1000, or at least 1500 or at least 2000 Daltons; and/or
(ii) the non-curable polymeric material features a Tg lower than 0, or lower than −10, or lower than −20, ° C.; and/or
(iii) at least 80 weight percents of the total amount of the mono-functional and the multi-functional curable materials include curable materials featuring, when hardened, a Tg lower than 0, or lower than −10, or lower than −20, ° C.

In some of any of the embodiments described herein, the curable and/or non-curable materials comprised in the formulation are selected such that:
the non-curable polymeric material features a molecular weight of at least 1000, or at least 1500 or at least 2000 Daltons; and the non-curable polymeric material features a Tg lower than 0, or lower than −10, or lower than −20, ° C.; and/or
at least 80 weight percents of the total amount of the mono-functional and the multi-functional curable materials include curable materials featuring, when hardened, a Tg lower than 0, or lower than −10, or lower than −20, ° C.

In some of any of the embodiments described herein, the curable and/or non-curable materials comprised in the formulation are selected such that at least 80 weight percents of the total amount of the mono-functional and the multi-functional curable materials include curable materials featuring, when hardened, a Tg lower than 0, or lower than −10, or lower than −20, ° C.

In some such embodiments, at least 85%, or at least 90%, or at least 95%, or 100%, by weight, of the total weight of the mono-functional and multi-functional curable materials include curable materials featuring, when hardened, a Tg lower than 0, or lower than −10, or lower than −20, ° C.

In some of any of the embodiments described herein, the curable and/or non-curable materials comprised in the formulation are selected such that at least 80 weight percents of the total amount of the mono-functional and the multifunctional curable materials, as described herein, include curable materials featuring, when hardened, a Tg lower than −20° C.

In some of any of the embodiments described herein, the curable and/or non-curable materials comprised in the formulation are selected such that:

the non-curable polymeric material features a molecular weight of at least 1000, or at least 1500 or at least 2000 Daltons, as described herein; and the non-curable polymeric material features a Tg lower than 0, or lower than −10, or lower than −20, ° C., as described herein; and at least 80 weight percents of the total amount of the mono-functional and the multi-functional curable materials, as described herein, include curable materials featuring, when hardened, a Tg lower than −20° C.

In some of any of the embodiments described herein, the curable and/or non-curable materials comprised in the formulation are selected such that:

the non-curable polymeric material features a molecular weight of at least 2000 Daltons, as described herein, the non-curable polymeric material features a Tg lower than −20° C., as described herein; and at least 80 weight percents of the total amount of the mono-functional and the multi-functional curable materials, as described herein, include curable materials featuring, when hardened, a Tg lower than 0, or lower than −10, or lower than −20, ° C., as described herein.

Herein throughout, "Tg" refers to glass transition temperature defined as the location of the local maximum of the E" curve, where E" is the loss modulus of the material as a function of the temperature.

Broadly speaking, as the temperature is raised within a range of temperatures containing the Tg temperature, the state of a material, particularly a polymeric material, gradually changes from a glassy state into a rubbery state.

Herein, "Tg range" is a temperature range at which the E" value is at least half its value (e.g., can be up to its value) at the Tg temperature as defined above.

Without wishing to be bound to any particular theory, it is assumed that the state of a polymeric material gradually changes from the glassy state into the rubbery state within the Tg range as defined above. Herein, the term "Tg" refers to any temperature within the Tg range as defined herein.

Herein, the phrase "molecular weight", abbreviated as MW, when referring to a polymeric material, refers to the value known in the art as Mw, describing Weight Average Molecular Weight of the polymeric material.

Herein throughout, whenever the phrase "weight percents", or "% by weight" or "% wt.", is indicated in the context of embodiments of a modeling formulation, it is meant weight percents of the total weight of the respective uncured modeling formulation.

The Non-Curable Polymeric Material:

In some of any of the embodiments described herein, the non-curable material features a molecular weight of at least 500, or at least 1000, or at least 1500 or at least 2000 Daltons, for example, a molecular weight that ranges from 500 to 4000, or from 900 to 4000, preferably from 1000 to 4000, or from 1500 to 4000 or, more preferably from 2000 to 4000, or from 2500 to 4000, or from 1500 to 3500, Daltons, including any intermediate value and subranges therebetween.

In some of any of the embodiments described herein, the non-curable material features a Tg lower than 0, or lower than −10, or lower than −20, ° C., for example, a Tg in the range of from 0 to −40° C., or from −20 to −40° C., including any intermediate value and subranges therebetween.

In some of any of the embodiments described herein, the non-curable material features a molecular weight of at least 1000, or at least 1500 or at least 2000 Daltons, as described herein; and a Tg lower than 0, or lower than −10, or lower than −20, ° C., as described herein.

In some embodiments, the non-curable material features essentially the same properties (e.g., molecular weight and/or Tg) in the modeling material formulation and in the hardened (soft) material obtained upon curing.

As used herein, the term "polymeric" with reference to a material encompasses polymers and co-polymers, including block co-polymers.

Herein, the term "block co-polymer" describes a copolymer consisting of regularly or statistically alternating two or more different homopolymer blocks that differ in composition or structure. Each homopolymer block in a block copolymer represents polymerized monomers of one type.

Polymeric materials featuring the above-mentioned MW and/or Tg, include, for example, polymers or block co-polymers that comprise one or more poly (alkylene glycol)s, as defined herein, including, for example, poly (ethylene glycol), poly(propylene glycol) and block co-polymers thereof (e.g., Pluronic® block copolymers).

In some of any of the embodiments described herein, the non-curable polymeric material comprises polypropylene glycol.

In some embodiments, the non-curable polymeric material is poly(propylene glycol), and in some embodiments it is a polypropylene glycol having a MW of about 2000 Daltons, or higher (e.g., 2000, 2200, 2400, 2500, 2600, 2800, or 3000, Daltons, or any intermediate value between these values, or of higher MW).

In some embodiments, the non-curable polymeric material is a block co-polymer that comprises at least one polypropylene glycol block.

In some embodiments, the non-curable polymeric material is a block co-polymer that comprises one or more polypropylene glycol block(s) and one or more polyethylene glycol block(s). Such block copolymer can be, for example, comprised of PEG-PPG-PEG, or of PEG-PPG, or of PEG-PPG-PEG-PPG, or of PPG-PEG-PPG, or of any other number of blocks, in any combination and in any order.

In some of these embodiments, a total amount of poly (ethylene glycol) in the block co-polymer is no more than 10 weight percents.

Thus, for example, in the exemplary block copolymers listed hereinabove, the length of the PEG blocks is such that the total amount of PEG is no more than 10% by weight. As representative, non-limiting example, a PEG-PPG-PEG block copolymer according to these embodiments comprises PEG (A % wt.)-PPG (B % wt.)-PEG (C % wt.), wherein A+C≤10 and B≥90, respectively, for example, A+C=10 and B=90, or wherein A+C=7 and B=93, or wherein A+C=5 and B=95. Similarly, a PPG-PEG-PPG block copolymer comprises PPG (A % wt.)-PEG (B % wt.)-PPG (C % wt.), wherein A+C≥90 and B≤10, respectively, for example, A+C=90 and B=10, or wherein A+C=93 and B=7, or wherein A+C=95 and B=5.

In some of any of the embodiments described herein, the block co-polymer has a MW of at least 2000 Daltons.

In some of any of the embodiments described herein for a PEG and PPG block copolymer, a ratio of the number of polypropylene glycol blocks and the number of polyethylene glycol blocks is at least 1.2:1, or at least 1.5:1 or at least 2:1. An exemplary such block copolymer is PPG-PEG-PPG. Another exemplary block copolymer is PPG-PEG-PPG-PEG-PPG.

Alternatively, or in addition, in some of any of the embodiments described herein for a PEG and PPG block copolymer, a ratio of the total number of polypropylene glycol backbone units and the total number of polyethylene glycol backbone units in the block copolymer is at least 2:1, or at least 3:1 or at least 4:1, or at least 5:1, or at least 6:1. An exemplary such block copolymer is PEG-PPG-PEG co-polymer, or PEG-PPG-PEG-PPG, or PEG-PPG-PEG-PPG-PEG, featuring such a ratio.

In some of any of the embodiments described herein, the non-curable material is characterized by low solubility (e.g., lower than 20% or lower than 10%, or lower), or insolubility, in water.

In the context of these embodiments, the phrase "water solubility" describes the weight % of a polymeric material that is added to 100 grams water before the solution becomes turbid (non-transparent).

In some of any of the embodiments described herein, the non-curable material is characterized by low miscibility (e.g., lower than 20% or lower than 10%, or lower), or is immiscible, in water.

The Mono-Functional Polymeric Material:

In some of any of the embodiments described herein, the mono-functional curable material features, when hardened, a Tg lower than −10, or lower than −20° C., for example, a Tg in the range of from 0 to −40° C., or from −20 to −40° C., including any intermediate value and subranges therebetween.

In some of any of the embodiments described herein, mono-functional curable materials usable in the context of the present embodiments can be represented by the Formula:

wherein P is a polymerizable group and R is a hydrocarbon, as described herein, optionally substituted by one or more substituents as described herein, and further optionally interrupted by one or more heteroatoms.

In some of any of the embodiments described herein, P is a photopolymerizable group, and in some embodiments, it is a UV-curable group, such that the curable material is photopolymerizable or is UV-curable. In some embodiments, P is an acrylic polymerizable group such as acrylate, methacrylate, acrylamide or methacrylamide, and such curable materials can be collectively represented by Formula A:

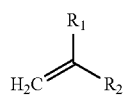

Formula A wherein at least one of $R_1$ and $R_2$ is and/or comprises a hydrocarbon, as described herein.

The (=$CH_2$) group in Formula I represents a polymerizable group, and is, according to some embodiments, a UV-curable group, such that the mono-functional curable material is a UV-curable material.

In some embodiments, $R_1$ is a carboxylate and $R_2$ is hydrogen, and the compound is a mono-functional acrylate. In some embodiments, $R_1$ is a carboxylate and $R_2$ is methyl, and the compound is mono-functional methacrylate. Curable materials in which $R_1$ is carboxylate and $R_2$ is hydrogen or methyl are collectively referred to herein as "(meth)acrylates".

In some of any of these embodiments, the carboxylate group is represented as —C(=O)—ORa, and Ra is a hydrocarbon as described herein.

In some embodiments, $R_1$ is amide and $R_2$ is hydrogen, and the compound is a mono-functional acrylamide. In some embodiments, $R_1$ is amide and $R_2$ is methyl, and the compound is a mono-functional methacrylamide. Curable materials in which $R_1$ is amide and $R_2$ is hydrogen or methyl are collectively referred to herein as "(meth)acrylamide".

In some of any of these embodiments, the amide group is represented as —C(=O)—NRbRa, and Ra and Rb are each independently selected from hydrogen and hydrocarbon, at least one being a hydrocarbon as described herein.

(Meth)acrylates and (meth)acrylamides are collectively referred to herein as (meth)acrylic materials.

When one or both of $R_1$ and $R_2$ comprise a polymeric or oligomeric moiety, the mono-functional curable compound of Formula A is an exemplary polymeric or oligomeric mono-functional curable material, respectively. Otherwise, it is an exemplary monomeric mono-functional curable material.

Generally, the chemical composition of the hydrocarbon (R is the P—R Formula, or Ra/Rb, if present, in Formula A) determines if the curable material, and the hardened material formed thereof, is hydrophilic, hydrophobic or amphiphilic.

As used herein throughout, the term "hydrophilic" describes a physical property of a material or a portion of a material (e.g., a chemical group in a compound) which accounts for transient formation of bond(s) with water molecules, typically through hydrogen bonding.

Hydrophilic materials dissolve more readily in water than in oil or other hydrophobic solvents. Hydrophilic materials can be determined by, for example, as having Log P lower than 0.5, when Log P is determined in octanol and water phases.

Hydrophilic materials can alternatively, or in addition, be determined as featuring a lipophilicity/hydrophilicity balance (HLB), according to the Davies method, of at least 10, or of at least 12.

As used herein throughout, the term "amphiphilic" describes a property of a material that combines both hydrophilicity, as described herein for hydrophilic materials, and hydrophobicity or lipophilicity, as defined herein for hydrophobic materials.

Amphiphilic materials typically comprise both hydrophilic groups as defined herein and hydrophobic groups, as defined herein, and are substantially soluble in both water and a water-immiscible solvent (oil).

Amphiphilic materials can be determined by, for example, as having Log P of 0.8 to 1.2, or of about 1, when Log P is determined in octanol and water phases.

Amphiphilic materials can alternatively, or in addition, be determined as featuring a lipophilicity/hydrophilicity balance (HLB), according to the Davies method, of 3 to 12, or 3 to 9.

A hydrophilic material or portion of a material (e.g., a chemical group in a compound) is one that is typically charge-polarized and capable of hydrogen bonding.

Amphiphilic materials typically comprise one or more hydrophilic groups (e.g., a charge-polarized group), in addition to hydrophobic groups.

Hydrophilic materials or groups, and amphiphilic materials, typically include one or more electron-donating heteroatoms which form strong hydrogen bonds with water molecules. Such heteroatoms include, but are not limited to, oxygen and nitrogen. Preferably, a ratio of the number of carbon atoms to a number of heteroatoms in a hydrophilic materials or groups is 10:1 or lower, and can be, for example, 8:1, more preferably 7:1, 6:1, 5:1 or 4:1, or lower. It is to be noted that hydrophilicity and amphiphilicity of materials and groups may result also from a ratio between hydrophobic and hydrophilic moieties in the material or chemical group, and does not depend solely on the above-indicated ratio.

A hydrophilic or amphiphilic material can have one or more hydrophilic groups or moieties. Hydrophilic groups are typically polar groups, comprising one or more electron-donating heteroatoms such as oxygen and nitrogen.

Exemplary hydrophilic groups include, but are not limited to, an electron-donating heteroatom, a carboxylate, a thiocarboxylate, oxo (=O), a linear amide, hydroxy, a (C1-4) alkoxy, an (C1-4)alcohol, a heteroalicyclic (e.g., having a ratio of carbon atoms to heteroatoms as defined herein), a cyclic carboxylate such as lactone, a cyclic amide such as lactam, a carbamate, a thiocarbamate, a cyanurate, an isocyanurate, a thiocyanurate, urea, thiourea, an alkylene glycol (e.g., ethylene glycol or propylene glycol), and a hydrophilic polymeric or oligomeric moiety, as these terms are defined hereinunder, and any combinations thereof (e.g., a hydrophilic group that comprises two or more of the indicated hydrophilic groups).

In some embodiments, the hydrophilic group is, or comprises, an electron donating heteroatom, a carboxylate, a heteroalicyclic, an alkylene glycol and/or a hydrophilic oligomeric moiety.

An amphiphilic moiety or group typically comprises one or more hydrophilic groups as described herein and one or more hydrophobic groups, or, can a heteroatom-containing group or moiety in which the ratio of number of carbon atoms to the number of heteroatoms accounts for amphiphilicity.

A hydrophilic or amphiphilic mono-functional curable material according to some embodiments of the present invention can be a hydrophilic acrylate represented by Formula A1:

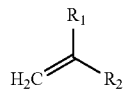

Formula A1 wherein $R_1$ and $R_2$ are as defined herein and at least one of $R_1$ and $R_2$ is and/or comprises a hydrophilic or amphiphilic moiety or group, as defined herein.

In some of any of these embodiments, the carboxylate group, —C(=O)—ORa, comprises Ra which is a hydrophilic or amphiphilic moiety or group, as defined herein. Exemplary Ra groups in the context of these embodiments include, but are not limited to, heteroalicyclic groups (having a ratio of 10:1 or 8:1 or 6:1 or 5:1 or lower of carbon atoms to electron-donating heteroatoms, such as morpholine, tetrahydrofurane, oxalidine, and the likes), hydroxyl, C(1-4)alkoxy, thiol, alkylene glycol or a hydrophilic or amphiphilic polymeric or oligomeric moiety, as described herein. An exemplary hydrophilic monomeric mono-functional acrylate is acryloyl morpholine (ACMO).

Exemplary hydrophilic or amphiphilic oligomeric mono-functional curable materials include, but are not limited to, a mono-(meth)acrylated urethane oligomer derivative of polyethylene glycol, a mono-(meth)acrylated polyol oligomer, a mono-(meth)acrylated oligomer having hydrophilic substituents, a mono-(meth)acrylated polyethylene glycol (e.g., methoxypolyethylene glycol), and a mono urethane acrylate.

In some embodiments, Ra in Formula A1 is or comprises a poly(alkylene glycol), as defined herein.

In some embodiments, Ra in Formula A1 comprises both an amphiphilic group or moiety and a hydrophobic group or moiety, as described herein. Such materials are referred to herein as amphiphilic curable materials that comprise a hydrophobic moiety or group.

As used herein throughout, the term "hydrophobic" describes a physical property of a material or a portion of a material (e.g., a chemical group or moiety in a compound) which accounts for lack of transient formation of bond(s) with water molecules, and thus for water-immiscibility, and is miscible or dissolvable in hydrocarbons.

A hydrophobic material or portion of a material (e.g., a chemical group or moiety in a compound) is one that is typically non-charged or non charge-polarized and does not tend to form hydrogen bonds.

Hydrophobic materials or groups typically include one or more of an alkyl, cycloalkyl, aryl, alkaryl, alkene, alkynyl, and the like, which are either un-substituted, or which, when substituted are substituted by one or more of alkyl, cycloalkyl, aryl, alkaryl, alkenyl, alkynyl, and the like, or by other substituents, such as electron-donating atom-containing substituents, yet a ratio of the number of carbon atoms to a number of heteroatoms in a hydrophobic materials or groups is at least 10:1, and can be, for example, 12:1, more preferably 15:1, 16:1, 18:1 or 20:1, or higher.

Hydrophobic materials dissolve more readily in oil than in water or other hydrophilic solvents. Hydrophobic materials can be determined by, for example, as having Log P higher than 1, when Log P is determined in octanol and water phases.

Hydrophobic materials can alternatively, or in addition, be determined as featuring a lipophilicity/hydrophilicity balance (HLB), according to the Davies method, lower than 9, preferably lower than 6.

A hydrophobic material can have one or more hydrophobic groups or moieties that render the material hydrophobic. Such groups are typically non-polar groups or moieties, as described hereinabove.

In some embodiments, the hydrophobic group or moiety is, or comprises, a hydrocarbon, as defined herein, preferably of at least 6 atoms, such as an alkylene chain of, for example, at least 6 carbon atoms in length. When the hydrocarbon is substituted or interrupted by heteroatoms or heteroatom-containing groups, the above-indicated ratio between the number of carbon atoms and heteroatoms applies.

A hydrophobic mono-functional curable material according to some embodiments of the present invention can be a hydrophobic acrylate represented by Formula A2:

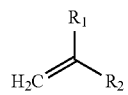

Formula A2 wherein $R_1$ and $R_2$ are as defined herein and at least one of $R_1$ and $R_2$ is and/or comprises a hydrophobic group or moiety, as defined herein.

In some of any of these embodiments, the carboxylate group, —C(=O)—ORa, comprises Ra which is a hydrophobic group, as defined herein. Exemplary hydrophobic monomeric mono-functional acrylate include isodecyl acrylate, lauryl acrylate, stearyl acrylate, linolenyl acrylate, bisphenyl acrylate and the like.

In some embodiments, Ra in Formula A2 is or comprises an alkylene chain of at least 6 carbon atoms in length, preferably unsubstituted.

In some of any of the embodiments described herein, the mono-functional curable material comprises a hydrophobic mono-functional curable material.

In some of these embodiments, the hydrophobic mono-functional curable material is a hydrophobic mono-functional acrylate, which is also referred to herein as "mono-functional acrylate type II".

In some of any of the embodiments described herein, the mono-functional curable material comprises a hydrophilic or amphiphilic mono-functional curable material.

In some of any of the embodiments described herein, the mono-functional curable material comprises an amphiphilic mono-functional curable material.

In some of these embodiments, the amphiphilic mono-functional curable material is an amphiphilic mono-functional acrylate which does not comprise a hydrophobic group as described herein, which is also referred to herein as "monofunctional acrylate type I".

In some of any of the embodiments described herein, the mono-functional curable material comprises an amphiphilic mono-functional curable material which comprises a hydrophobic moiety or group as described herein, which is also referred to herein as "monofunctional acrylate type II".

In some of any of the embodiments described herein, the mono-functional curable material comprises a combination of an amphiphilic mono-functional curable material and a hydrophobic mono-functional curable material (e.g., a combination of mono-functional acrylate of type I and a mono-functional acrylate of type II).

In some of these embodiments, a weight ratio of the amphiphilic mono-functional curable material and the hydrophobic mono-functional curable material can range from 2:1 to 1:2, and preferably ranges from 2:1 to 1:1 or from 1.5:1 to 1:1, or from 1.5:1 to 1.1:1, including any intermediate values and subranges between any of the forgoing.

In some of any of the embodiments described herein, the mono-functional curable material comprises a combination of a hydrophobic mono-functional acrylate and an amphiphilic mono-functional acrylate which comprises a hydrophobic group as described herein (e.g., a combination of two mono-functional acrylate of type II).

In some of these embodiments, a weight ratio of the amphiphilic mono-functional curable material and the hydrophobic mono-functional curable material can range from 2:1 to 1:2, and preferably ranges from 2:1 to 1:1 or from 1.5:1 to 1:1, or from 1.5:1 to 1.1:1, including any intermediate values and subranges between any of the forgoing.

In some of any of the embodiments described herein, the mono-functional curable material comprises an amphiphilic mono-functional acrylate which comprises a hydrophobic group as described herein (e.g., a mono-functional acrylate of type II).

In some of any of the embodiments described herein, the mono-functional curable material is such that features, when hardened, a Tg lower than 0° C., preferably lower than −10° C., or lower than −20° C., or lower, e.g., ranging from −20 to −70° C. In cases where the mono-functional curable material comprises a combination of two or more materials, at least one of these materials features, when hardened, a low Tg as described herein, and optionally and preferably, all of the materials feature such a Tg. Further embodiments of mono-functional curable materials are described in the Examples section that follows.

The Multi-Functional Curable Material:

As described herein, multi-functional curable materials are monomeric, oligomeric or polymeric curable materials featuring two or more polymerizable groups. Such materials are also referred to herein as cross-linking agents.

According to some of any of the embodiments described herein, the multi-functional curable material is a di-functional curable material. Such materials provide for a low degree of cross-linking and thereby provide for lower hardness of the hardened material.

According to some of any of the embodiments described herein, the multi-functional curable material features, when hardened, a Tg lower than −10, or lower than −20° C., and can be, for example, in a range of from −10 to −70° C.

Exemplary multi-functional curable material according to some embodiments of the present invention can be represented by Formula B:

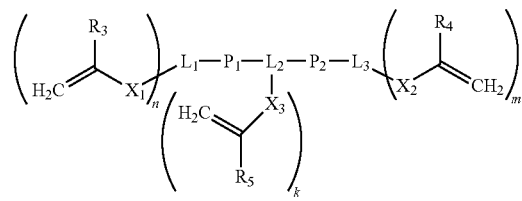

Formula B wherein:

each of $R_3$, $R_4$ and $R_5$ is independently hydrogen or a C(1-4)alkyl;

$L_1$ is a linking moiety, a branching unit or moiety (in case n is greater than 1) or absent;

$L_2$ is a linking moiety, a branching unit or moiety (in case k is other than 0) or is absent;

$L_3$ is a linking moiety, a branching unit or moiety (in case m is greater than 1) or absent;

each of $P_1$ and $P_2$ is independently a hydrocarbon, or an oligomeric or polymeric group or moiety, as there terms are defined herein, or absent;

each of $X_1$, $X_2$ and $X_3$ is independently a carboxylate, an amide, or absent; and each of n, m and k is 0, 1, 2, 3 or 4, provided that n+m+k is at least 2.

Multi-functional curable materials of Formula B in which one, two or all of $X_1$, $X_2$ and $X_3$, when present, is a carboxylate, are multi-functional acrylates. When one or more of $R_3$, $R_4$ and $R_5$, when present, is methyl, the curable materials are multi-functional methacrylates.

Multifunctional curable materials in which one, two or all of $X_1$, $X_2$ and $X_3$, when present, is carboxylate, can include a combination of acrylate and methacrylate functional moieties.

In some embodiments, the acrylate or methacrylate multifunctional curable material is monomeric, such that none of $P_1$ and $P_2$ is a polymeric or oligomeric moiety. In some of these embodiments, one or both of $P_1$ and $P_2$ is a hydrophilic or amphiphilic group as described herein, for example, an alkylene glycol, or any other hydrophilic or amphiphilic linking group, or is a short chain (e.g., of 1-6 carbon atoms), substituted or unsubstituted hydrocarbon moiety, as defined herein.

In some embodiments, one or both of $P_1$ and $P_2$ is a polymeric or oligomeric moiety as defined herein, and the curable compound is an oligomeric multi-functional curable material, for example, an oligomeric multi-functional acrylate or methacrylate, as described herein for $X_1$, $X_2$ and/or $X_3$. If both $P_1$ and $P_2$ are present, $L_2$ can be, for example, a linking moiety such as a hydrocarbon, comprising alkyl, cycloalkyl, aryl and any combination thereof. Exemplary such curable materials include ethoxylated or methoxylated polyethylene glycol diacrylate, and ethoxylated bisphenol A diacrylate.

Other non-limiting examples include polyethylene glycol diacrylate, polyethylene glycol dimethacrylate, polyethylene glycol-polyethylene glycol urethane diacrylate, an acrylated oligourethane, and a partially acrylated polyol oligomer.

In some embodiments, one or more of $P_1$ and $P_2$ is, or comprises, a poly(alkylene glycol) moiety, as defined herein.

Exemplary multi-functional acrylates are described in the Examples section that follows.

In some of any of the embodiments described herein, the mono-functional curable material(s) and the multi-functional curable material(s) are curable when exposed to the same curing condition.

In some embodiments, the mono-functional curable material(s) and the multi-functional curable material(s) are both photopolymerizable and in some embodiments are both UV-curable.

In some embodiments, the mono-functional curable material(s) and the multi-functional curable material(s) are both acrylic compounds, and in some embodiments are both (meth)acrylates or both are acrylates.

Initiators:

In some of any of the embodiments described herein, the soft modeling material formulation further comprises one or more agents which promote the polymerization of the curable materials, and are referred to herein as initiators.

In some of any of the embodiments described herein, the curable materials as described herein and an initiator form together a curable system. Such a system can further comprise an inhibitor, as described hereinafter.

It is to be noted that compounds/agents that form a part of a curable system, even if not curable by themselves, are not considered herein as non-curable materials, let alone non-curable polymeric materials as described herein.

In some of any of the embodiments described herein, a "curable system" comprises one or more curable materials and optionally one or more initiators and/or catalysts for initiating curing of the curable materials, and, further optionally, one or more conditions (also referred to herein as curing conditions) for inducing the curing, as described herein.

The one or more initiators are selected in accordance with the selected curable materials. Typically, initiators are further selected in accordance with the polymerization type of the curable materials. For example, a free radical initiator is selected for initiating free-radical polymerization (e.g., as in the case of acrylic curable materials); cationic initiator is selected for initiating cationic polymerization, and so forth. Further, photoinitiators are used in case one or more of the curable materials is photopolymerizable.

In some of any of the embodiments described herein, the curable system is a photocurable system, and the initiator is a photoinitiator.

In some embodiments, the curable system comprises acrylic compounds and the photoinitiator is a free-radical photoinitiator.

A free-radical photoinitiator may be any compound that produces a free radical on exposure to radiation such as ultraviolet or visible radiation and thereby initiates a polymerization reaction. Non-limiting examples of suitable photoinitiators include benzophenones (aromatic ketones) such as benzophenone, methyl benzophenone, Michler's ketone and xanthones; acylphosphine oxide type photo-initiators such as 2,4,6-trimethylbenzolydiphenyl phosphine oxide (TMPO), 2,4,6-trimethylbenzoylethoxyphenyl phosphine oxide (TEPO), and bisacylphosphine oxides (BAPO's); benzoins and bezoin alkyl ethers such as benzoin, benzoin methyl ether and benzoin isopropyl ether and the like. Examples of photoinitiators are alpha-amino ketone, and bisacylphosphine oxide (BAPO's). Further examples include photoinitiators of the Irgacure® family.

A free-radical photo-initiator may be used alone or in combination with a co-initiator. Co-initiators are used with initiators that need a second molecule to produce a radical that is active in the photocurable free-radical systems. Benzophenone is an example of a photoinitiator that requires a second molecule, such as an amine, to produce a free radical. After absorbing radiation, benzophenone reacts with a ternary amine by hydrogen abstraction, to generate an alpha-amino radical which initiates polymerization of acrylates. Non-limiting example of a class of co-initiators are alkanolamines such as triethylamine, methyldiethanolamine and triethanolamine.

In some of any of the embodiments described herein, the modeling material formulations comprises a free-radical curable system, and further comprises a radical inhibitor, for preventing or slowing down polymerization and/or curing prior to exposing to the curing condition.

In some of any of the embodiments described herein, the curable system polymerizable or cured via cationic polymerization, and are referred to herein also as cationic polymerizable or cationic curable systems.

In some embodiments, a cationic polymerizable material is polymerizable or curable by exposure to radiation. Systems comprising such a material can be referred to as photopolymerizable cationic systems, or photoactivatable cationic systems.

In some embodiments, a cationic curable system further comprises a cationic initiator, which produces cations for initiating the polymerization and/or curing.

In some embodiments, the initiator is a cationic photoinitiator, which produces cations when exposed to radiation.

Suitable cationic photoinitiators include, for example, compounds which form aprotic acids or Bronsted acids upon exposure to ultraviolet and/or visible light sufficient to initiate polymerization. The photoinitiator used may be a single compound, a mixture of two or more active compounds, or a combination of two or more different compounds, i.e. co-initiators. Non-limiting examples of suitable cationic photoinitiators include aryldiazonium salts, diaryliodonium salts, triarylsulphonium salts, triarylselenonium salts and the like. An exemplary cationic photoinitiator is a mixture of triarylsolfonium hexafluoroantimonate salts.

Non-limiting examples of suitable cationic photoinitiators include P-(octyloxyphenyl) phenyliodonium hexafluoroantimonate UVACURE 1600 from Cytec Company (USA), iodonium (4-methylphenyl)(4-(2-methylpropyl)phenyl)-hexafluorophosphate known as Irgacure 250 or Irgacure 270 available from Ciba Speciality Chemicals (Switzerland), mixed arylsulfonium hexafluoroantimonate salts known as UVI 6976 and 6992 available from Lambson Fine Chemicals (England), diaryliodonium hexafluoroantimonate known as PC 2506 available from Polyset Company (USA), (tolylcumyl) iodonium tetrakis (pentafluorophenyl) borate known as Rhodorsil® Photoinitiator 2074 available from Bluestar Silicones (USA), iodonium bis(4-dodecylphenyl)-(OC-6-11)-hexafluoro antimonate known as Tego PC 1466 from Evonik Industries AG (Germany).

In some of any of the embodiments described herein, an amount of an initiator (e.g., free-radical photoinitiator) ranges from 1 to 5, or from 1 to 3, weight percents, including any intermediate values and subranges therebetween. In exemplary embodiments, a combination of two or more initiators (e.g., photoinitiators) is used, and an amount of each ranges from 1 to 3, weight percents.

Additional Components:

According to some of any of the embodiments described herein, the soft modeling material formulation further comprises additional, non-curable components, such as, for example, inhibitors, surfactants, dispersants, colorants (coloring agents), stabilizers, and the like. Commonly used surfactants, dispersants, colorants and stabilizers are contemplated. Exemplary concentrations of each component, if present, range from about 0.01 to about 1, or from about 0.01 to about 0.5, or from about 0.01 to about 0.1, weight percents, of the total weight of the formulation containing same. Exemplary components are described hereinafter.

In some of any of the embodiments described herein, the formulation comprises a curing inhibitor, that is, an agent that inhibits or reduces an amount of the curing in the absence of a curing condition. In some embodiments, the inhibitor is a free radical polymerization inhibitor. In some embodiments, an amount of an inhibitor (e.g., a free radical inhibitor) ranges from 0.01 to 2, or from 1 to 2, or from 0.05 to 0.15, or is 0.1, weight percent, including any intermediate values and subranges therebetween, depending on the type of inhibitor used. Commonly used inhibitors, such as radical inhibitors, are contemplated.

In exemplary embodiments, a free radical inhibitor such as NPAL, or equivalents thereof, is used in an amount of from 0.01 to 1, or from 0.05 to 0.2, or from 0.05 to 0.15, or is 0.1, weight percent.

In alternative embodiments, a free radical inhibitor that is devoid of nitro or nitroso groups is employed. Exemplary such inhibitors are those of the Genorad™ family (e.g., Genorad18).

In exemplary embodiments, such a free radical inhibitor is used in an amount of from 0.1 to 3, or from 0.1 to 2, or from 0.5 to 2, or from 1 to 1.5, weight percents, including any intermediate values and subranges therebetween.

In exemplary embodiments, the soft modeling material formulation comprises a surfactant. Exemplary surfactants are those marketed as BYK surface additives. In some embodiments, the surfactant is a curable material, preferably curable upon exposure to the same curing condition as the curable materials in the formulation. In some embodiments, the surfactant is a UV-curable surfactant, and in some embodiments, the surfactant is a UV-curable BYK surfactant (e.g., BYK UV-3150 or BYK UV-3500).

In some embodiments, an amount of the surfactant in the formulation ranges from 0.1 to 1%, by weight, as described herein.

Exemplary Soft Modeling Formulations:

In some of any of the embodiments described herein, the soft modeling material formulation comprises non-curable polymeric material(s) as described herein, and an acrylic curable system which comprises a mono-functional acrylate (e.g., a combination of an amphiphilic and a hydrophobic mono-functional acrylate), a free-radical photoinitiator and optionally a free-radical inhibitor.

In some embodiments, the formulation further comprises one or more of the additional components as described herein.

In some embodiments, the formulation further comprises a coloring agent, as described herein, for example, such that provides a red tint, flesh-like color to the formulations, or a skin or skin pigmentation tint, to the formulations and objects or portions thereof made thereof.

Exemplary flesh-like colors that are suitable for use with acrylic materials include, without limitation, those manufactured by Prosthetic Research Specialists, Inc. as "Flesh color system"; and color pigments marketed by Kingsley Mfg. Co.

In some embodiments, a concentration of the coloring depends on the intended use of the formulation and the desired visual properties of the object, and can range from 0.01 to 5, or from 0.01 to 1, or from 0.1 to 1, including any intermediate values and subranges therebetween.

In some of any of the embodiments described herein, the soft modeling material formulation comprises:

a mono-functional amphiphilic acrylate, as described herein in any of the respective embodiments, in an amount of 25-35 weight percents;

a mono-functional hydrophobic acrylate, as described herein in any of the respective embodiments, in an amount of 25-30 weight percents;

a multi-functional acrylate, as described herein in any of the respective embodiments, in an amount of 5-10 weight percents; and a non-curable polymeric material featuring a molecular weight of at least 1000, or at least 1500 or at least 2000 Daltons; and a Tg lower than 0, or lower than −10, or lower than −20, ° C., as described herein in any of the respective embodiments, in an amount of 30-35 weight percents.

In some of these embodiments, the non-curable polymeric material comprises a polypropylene glycol and/or a block co-polymer comprising at least one polypropylene glycol block, each featuring a molecular weight of at least 2000 Daltons, as described herein in any of the respective embodiments.

In some of these embodiments, the multi-functional acrylate is a di-functional acrylate, and in some embodiments it is a urethane diacrylate.

In some of these embodiments, the mono-functional amphiphilic acrylate comprises a hydrocarbon chain of at least 6 carbon atoms and at least 2 alkylene glycol groups.

In some of these embodiments, the mono-functional hydrophobic acrylate comprises a hydrocarbon chain of at least 8 carbon atoms.

Exemplary formulations are presented in Example 2 in the Examples section that follows.

According to some of any of the embodiments described herein, the uncured building material comprises two or more soft modeling material formulations as described herein, each comprising a different combination of curable and non-curable materials according to the present embodiments, and optionally each feature, when hardened, a different Shore A hardness values in the range of 1-10 and/or different Shore 00 hardness values in the range of 0-40.

In some embodiments, such two of more building material formulations represent a formulation system of a soft modeling formulation.

The Elastomeric Curable Formulation:

Herein throughout, the phrase "elastomeric curable formulation" is also referred to herein as "elastomeric modeling material formulation", "elastomeric modeling formulation" or simply as "elastomeric formulation", and describes a formulation which, when hardened, features properties of a rubber or rubbery-like materials, also referred to herein and in the art as elastomers.

Elastomers, or rubbers, are flexible materials that are characterized by low Tg (e.g., lower than room temperature, preferably lower than 10° C., lower than 0° C. and even lower than −10° C.).

Exemplary such formulations are those marketed as Tango™, Tango+™ and Agilus™ families.

Exemplary such formulations are described in PCT/IL2017/050604, which is incorporated by reference as if fully set forth herein.

Whenever "Agilus" or "Agilus formulation" is indicated, it is meant a formulation of the Agilus™ family (e.g., a formulation as described in WO2017/208238), for example, Agilus™30.

According to some of any of the embodiments described herein, the elastomeric curable modeling formulation comprises at least one elastomeric curable material.

The phrase "elastomeric curable material" describes a curable material, as defined herein, which, upon exposure to curing energy, provides a cured material featuring properties of an elastomer (a rubber, or rubber-like material).

Elastomeric curable materials typically comprise one or more polymerizable (curable) groups, which undergo polymerization upon exposure to a suitable curing condition (e.g., curing energy), linked to a moiety that confers elasticity to the polymerized and/or cross-linked material. Such moieties typically comprise alkyl, alkylene chains, hydrocarbon, alkylene glycol groups or chains (e.g., oligo or poly(alkylene glycol) as defined herein, urethane, oligourethane or polyurethane moieties, as defined herein, and the like, including any combination of the foregoing, and are also referred to herein as "elastomeric moieties".

An elastomeric curable material can be a mono-functional or multi-functional material, or a combination thereof.

An elastomeric mono-functional curable material according to some embodiments of the present invention can be a vinyl-containing compound represented by Formula I:

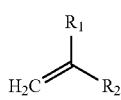

Formula I wherein at least one of $R_1$ and $R_2$ in Formula I is and/or comprises an elastomeric moiety, as described herein.

The (=CH$_2$) group in Formula I represents a polymerizable group, and is, according to some embodiments, a UV-curable group, such that the elastomeric curable material is a UV-curable material.

For example, $R_1$ in Formula I is or comprises an elastomeric moiety as defined herein and $R_2$ is, for example, hydrogen, C(1-4) alkyl, C(1-4) alkoxy, or any other substituent, as long as it does not interfere with the elastomeric properties of the cured material.

In some embodiments, $R_1$ in Formula I is a carboxylate as described herein, $R_2$ is hydrogen, and the compound is a mono-functional acrylate monomer. In some embodiments, $R_1$ in Formula I is a carboxylate as described herein, and $R_2$ is methyl, and the compound is mono-functional methacrylate monomer. Curable materials in which $R_1$ is carboxylate and $R_2$ is hydrogen or methyl are collectively referred to herein as "(meth)acrylates".

In some of any of these embodiments, the carboxylate group is represented by —C(=O)—ORc, and Rc is an elastomeric moiety as described herein.

In some embodiments, $R_1$ in Formula I is amide as described herein, $R_2$ is hydrogen, and the compound is a mono-functional acrylamide monomer. In some embodiments, $R_1$ in Formula I is amide as described herein, $R_2$ is methyl, and the compound is mono-functional methacrylamide monomer. Curable materials in which $R_1$ is amide and $R_2$ is hydrogen or methyl are collectively referred to herein as "(meth)acrylamide".

(Meth)acrylates and (meth)acrylamides are collectively referred to herein as (meth)acrylic materials.

In some embodiments, the amide is presented by —C(=O)—NRdRe, and Rd and Re are selected from hydrogen and an elastomeric moiety, at least one being an elastomeric moiety, as defined herein. When one or both of $R_1$ and $R_2$ in Formula I comprise a polymeric or oligomeric moiety, the mono-functional curable compound of Formula I is an exemplary polymeric or oligomeric mono-functional curable material. Otherwise, it is an exemplary monomeric mono-functional curable material.

In multi-functional elastomeric materials, the two or more polymerizable groups are linked to one another via an elastomeric moiety, as described herein.

In some embodiments, a multifunctional elastomeric material can be represented by Formula I as described herein, in which $R_1$ comprises an elastomeric material that terminates by a polymerizable group, as described herein.

For example, a di-functional elastomeric curable material can be represented by Formula I*:

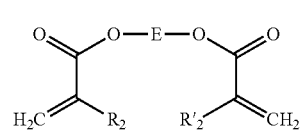

Formula I* wherein E is an elastomeric linking moiety as described herein, and R'$_2$ is as defined herein for $R_2$ in Formula I.

In another example, a tri-functional elastomeric curable material can be represented by Formula II:

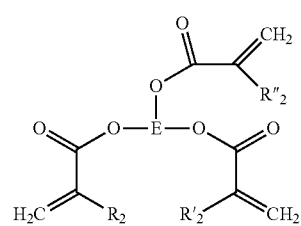

Formula II wherein E is an elastomeric linking moiety as described herein, and R'$_2$ and R"$_2$ are each independently as defined herein for $R_2$ in Formula I.

In some embodiments, a multi-functional (e.g., di-functional, tri-functional or higher) elastomeric curable material can be collectively represented by Formula III:

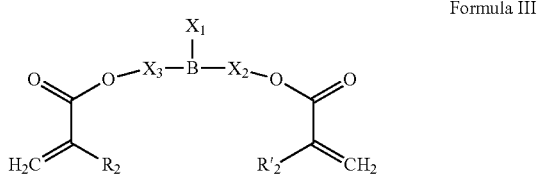

Formula III

Wherein:

$R_2$ and $R'_2$ are as defined herein;

B is a di-functional or tri-functional branching unit as defined herein (depending on the nature of $X_1$);

$X_2$ and $X_3$ are each independently absent, an elastomeric moiety as described herein, or is selected from an alkyl, a hydrocarbon, an alkylene chain, a cycloalkyl, an aryl, an alkylene glycol, a urethane moiety, and any combination thereof; and $X_1$ is absent or is selected from an alkyl, a hydrocarbon, an alkylene chain, a cycloalkyl, an aryl, an alkylene glycol, a urethane moiety, and an elastomeric moiety, each being optionally being substituted (e.g., terminated) by a meth (acrylate) moiety (O—C(=O) CR"$_2$=CH$_2$), and any combination thereof, or, alternatively, $X_1$ is:

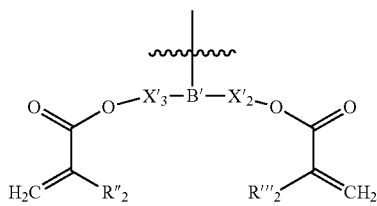

wherein:

the curved line represents the attachment point;

B' is a branching unit, being the same as, or different from, B;

$X'_2$ and $X'_3$ are each independently as defined herein for $X_2$ and $X_3$; and $R''_2$ and $R'''_2$ are as defined herein for $R_2$ and $R'_2$.

provided that at least one of $X_1$, $X_2$ and $X_3$ is or comprises an elastomeric moiety as described herein.

The term "branching unit" as used herein throughout describes a multi-radical, preferably aliphatic or alicyclic, linking moiety. By "multi-radical" it is meant that the linking moiety has two or more attachment points such that it links between two or more atoms and/or groups or moieties.

That is, the branching unit is a chemical moiety that, when attached to a single position, group or atom of a substance, creates two or more functional groups that are linked to this single position, group or atom, and thus "branches" a single functionality into two or more functionalities.

In some embodiments, the branching unit is derived from a chemical moiety that has two, three or more functional groups. In some embodiments, the branching unit is a branched alkyl or a branched linking moiety as described herein.

Multi-functional elastomeric curable materials featuring 4 or more polymerizable groups are also contemplated, and can feature structures similar to those presented in Formula III, while including, for example, a branching unit B with higher branching, or including an $X_1$ moiety featuring two (meth)acrylate moieties as defined herein, or similar to those presented in Formula II, while including, for example, another (meth)acrylate moiety that is attached to the elastomeric moiety.

In some embodiments, the elastomeric moiety, e.g., Rc in Formula I or the moiety denoted as E in Formulae I*, II and III, is or comprises an alkyl, which can be linear or branched, and which is preferably of 3 or more or of 4 or more carbon atoms; an alkylene chain, preferably of 3 or more or of 4 or more carbon atoms in length; an alkylene glycol as defined herein, an oligo(alkylene glycol), or a poly(alkylene glycol), as defined herein, preferably of 4 or more atoms in length, a urethane, an oligourethane, or a polyurethane, as defined herein, preferably of 4 or more carbon atoms in length, and any combination of the foregoing.

In some of any of the embodiments described herein, the elastomeric curable material is a (meth)acrylic curable material, as described herein, and in some embodiments, it is an acrylate.

In some of any of the embodiments described herein, the elastomeric curable material is or comprises a mono-functional elastomeric curable material, and is some embodiments, the mono-functional elastomeric curable material is represented by Formula I, wherein $R_1$ is —C(=O)—ORa and Ra is an alkylene chain (e.g., of 4 or more, preferably 6 or more, preferably 8 or more, carbon atoms in length), or a poly(alkylene glycol) chain, as defined herein.

In some embodiments, the elastomeric curable material is or comprises a multi-functional elastomeric curable material, and is some embodiments, the multi-functional elastomeric curable material is represented by Formula I*, wherein E is an alkylene chain (e.g., of 4 or more, or 6 or more, carbon atoms in length), and/or a poly(alkylene glycol) chain, as defined herein.

In some embodiments, the elastomeric curable material is or comprises a multi-functional elastomeric curable material, and is some embodiments, the multi-functional elastomeric curable material is represented by Formula II, wherein E is a branched alkyl (e.g., of 3 or more, or of 4 or more, or of 5 or more, carbon atoms in length).

In some of any of the embodiments described herein, the elastomeric curable material is an elastomeric acrylate or methacrylate (also referred to as acrylic or methacrylic elastomer), for example, of Formula I, I*, II or III, and in some embodiments, the acrylate or methacrylate is selected such that when hardened, the polymeric material features a Tg lower than 0° C. or lower than −10° C.

Exemplary elastomeric acrylate and methacrylate curable materials include, but are not limited to, 2-propenoic acid, 2-[[(butylamino)carbonyl]oxy]ethyl ester (an exemplary urethane acrylate), and compounds marketed under the trade names SR335 (Lauryl acrylate) and SR395 (isodecyl acrylate) (by Sartomer). Other examples include compounds marketed under the trade names SR350D (a trifunctional trimethylolpropane trimethacrylate (TMPTMA), SR256 (2-(2-ethoxyethoxy)ethyl acrylate, SR252 (polyethylene glycol (600) dimethacrylate), SR561 (an alkoxylated hexane diol diacrylate) (by Sartomer).

It is to be notes that other acrylic materials, featuring, for example, one or more acrylamide groups instead of one or more acrylate or methacrylate groups are also contemplated.

In some of any of the embodiments described herein, the elastomeric curable material comprises one or more mono-functional elastomeric curable material(s) (e.g., a mono-functional elastomeric acrylate, as represented, for example, in Formula I) and one or more multi-functional (e.g., di-functional) elastomeric curable materials(s) (e.g., a di-functional elastomeric acrylate, as represented, for example, in Formula I*, II or III) and in any of the respective embodiments as described herein.

In some of any of the embodiments described herein, a total amount of the elastomeric curable material(s) is at least 40%, or at last 50%, or at least 60%, and can be up to 70% or even 80%, of the total weight of an elastomeric modeling material formulation as described herein.

In some of any of the embodiments described herein, the elastomeric curable modeling formulation further comprises silica particles.

In some of any of the embodiments described herein, the silica particles have an average particle size lower than 1 micron, namely, the silica particles are sub-micron particles. In some embodiments, the silica particles are nano-sized particles, or nanoparticles, having an average particle size in the range of from 0.1 nm to 900 nm, or from 0.1 nm to 700 nm, or from 1 nm to 700 nm, or from 1 nm to 500 nm or from 1 nm to 200 nm, including any intermediate value and subranges therebetween.

In some embodiments, at least a portion of such particles may aggregate, upon being introduced to the formulation. In some of these embodiments, the aggregate has an average size of no more than 3 microns, or no more than 1.5 micron.

Any commercially available formulations of sub-micron silica particles are usable in the context of the present embodiments, including fumed silica, colloidal silica, precipitated silica, layered silica (e.g., montmorillonite), and aerosol assisted self-assembly of silica particles.

The silica particles can be such that feature a hydrophobic or hydrophilic surface. The hydrophobic or hydrophilic nature of the particles' surface is determined by the nature of the surface groups on the particles.

When the silica is untreated, namely, is composed substantially of Si and O atoms, the particles typically feature silanol (Si—OH) surface groups and are therefore hydrophilic. Untreated (or uncoated) colloidal silica, fumed silica, precipitated silica and layered silica all feature a hydrophilic surface, and are considered hydrophilic silica.

Layered silica may be treated so as to feature long-chain hydrocarbons terminating by quaternary ammonium and/or ammonium as surface groups, and the nature of its surface is determined by the length of the hydrocarbon chains. Hydrophobic silica is a form of silica in which hydrophobic groups are bonded to the particles' surface, and is also referred to as treated silica or functionalized silica (silica reacted with hydrophobic groups).

Silica particles featuring hydrophobic surface groups such as, but not limited to, alkyls, preferably medium to high alkyls of 2 or more carbon atoms in length, preferably of 4 or more, or 6 or more, carbon atoms in length, cycloalkyls, aryl, and other hydrocarbons, as defined herein, or hydrophobic polymers (e.g., polydimethylsiloxane), are particles of hydrophobic silica.

Silica particles as described herein can therefore by untreated (non-functionalized) and as such are hydrophilic particles.

Alternatively, silica particles as described herein can be treated, or functionalized, by being reacted so as to form bonds with the moieties on their surface.

When the moieties are hydrophilic moieties, the functionalized silica particles are hydrophilic.

Silica particles featuring hydrophilic surface groups such as, but not limited to, hydroxy, amine, ammonium, carboxy, silanol, oxo, and the like, are particles of hydrophilic silica.

When the moieties are hydrophobic moieties, as described herein, the functionalized silica particles are hydrophobic.

In some of any of the embodiments described herein, at least a portion, or all, of the silica particles feature a hydrophilic surface (namely, are hydrophilic silica particles, for example, of untreated silica such as colloidal silica).

In some of any of the embodiments described herein, at least a portion, or all, of the silica particles feature a hydrophobic surface (namely, are hydrophobic silica particles).

In some embodiments, the hydrophobic silica particles are functionalized silica particles, namely, particles of silica treated with one or more hydrophobic moieties.

In some of any of the embodiments described herein, at least a portion, or all, of the silica particles are hydrophobic silica particles, functionalized by curable functional groups (particles featuring curable groups on their surface).

The curable functional groups can be any polymerizable group as described herein. In some embodiments, the curable functional groups are polymerizable by the same polymerization reaction as the curable monomers in the formulation, and/or when exposed to the same curing condition as the curable monomers. In some embodiments, the curable groups are (meth)acrylic (acrylic or methacrylic) groups, as defined herein.

Hydrophilic and hydrophobic, functionalized and untreated silica particles as described herein can be commercially available materials or can be prepared using methods well known in the art.

By "at least a portion", as used in the context of these embodiments, it is meant at least 10%, or at least 20%, or at least 30%, or at least 40%, or at least 50%, or at least 60%, or at least 70%, or at least 80%, or at least 90%, or at least 95%, or at least 98%, of the particles.

The silica particles may also be a mixture of two or more types of silica particles, for example, two or more types of any of the silica particles described herein.

In some of any of the embodiments described herein, an amount of the silica particles in a modeling material formulation comprising same ranges from about 1% to about 20%, or from about 1% to about 15%, or from about 1% to about 10%, by weight, of the total weight of the modeling material formulation.

In some of any of the embodiments described herein, an amount of the silica particles in a formulation system as described herein ranges from about 1% to about 20%, or from about 1% to about 15%, or from about 1% to about 10%, by weight, of the total weight of the formulation system.

In some embodiments, the formulation system comprises one formulation. In some embodiments, the formulation system comprises two or more formulations, and the silica particles are comprised within 1, 2 or all the formulations.

The amount of the silica particles can be manipulated as desired so as to control the mechanical properties of the cured modeling material and/or the object or part therein comprising same. For example, higher amount of silica particles may result in higher elastic modulus of the cured modeling material and/or the object or part thereof comprising same.

In some of any of the embodiments described herein, an amount of the silica particles is such that a weight ratio of the elastomeric curable material(s) and the silica particles in the one or more modeling material formulation(s) ranges from about 50:1 to about 4:1 or from about 30:1 to about 4:1 or from about 20:1 to about 2:1, including any intermediate values and subranges therebetween.

According to some of any of the embodiments described herein, the elastomeric modeling material formulation further comprises one or more additional curable material(s).

The additional curable material can be a mono-functional curable material, a multi-functional curable material, or a mixture thereof, and each material can be a monomer, an oligomer or a polymer, or a combination thereof.

Preferably, but not obligatory, the additional curable material is polymerizable when exposed to the same curing energy at which the curable elastomeric material is polymerizable, for example, upon exposure to irradiation (e.g., UV-vis irradiation).

In some embodiments, the additional curable material is such that when hardened, the polymerized material features Tg higher than that of an elastomeric material, for example, a Tg higher than 0° C., or higher than 5° C. or higher than 10° C.

In some embodiments, the additional curable material is a non-elastomeric curable material, featuring, for example, when hardened, Tg and/or Elastic Modulus that are different from those representing elastomeric materials.

In some embodiments, the additional curable material is a mono-functional acrylate or methacrylate ((meth)acrylate). Non-limiting examples include isobornyl acrylate (IBOA), isobornylmethacrylate, acryloyl morpholine (ACMO), phenoxyethyl acrylate, marketed by Sartomer Company (USA) under the trade name SR-339, urethane acrylate oligomer such as marketed under the name CN 131B, and any other acrylates and methacrylates usable in AM methodologies.

In some embodiments, the additional curable material is a multi-functional acrylate or methacrylate ((meth)acrylate). Non-limiting examples of multi-functional (meth)acrylates include propoxylated (2) neopentyl glycol diacrylate, marketed by Sartomer Company (USA) under the trade name SR-9003, Ditrimethylolpropane Tetra-acrylate (DiTMPTTA), Pentaerythitol Tetra-acrylate (TETTA), and Dipentaerythitol Penta-acrylate (DiPEP), and an aliphatic urethane diacrylate, for example, such as marketed as Ebecryl 230. Non-limiting examples of multi-functional (meth)acrylate oligomers include ethoxylated or methoxylated polyethylene glycol diacrylate or dimethacrylate, ethoxylated bisphenol A diacrylate, polyethylene glycol-polyethylene glycol urethane diacrylate, a partially acrylated polyol oligomer, polyester-based urethane diacrylates such as marketed as CNN91.

Any other curable materials, preferably curable materials featuring a Tg as defined herein, are contemplated as an additional curable material.

In some of any of the embodiments described herein, the elastomeric modeling material formulation further comprises an initiator, for initiating polymerization of the curable materials.

When all curable materials (elastomeric and additional, if present) are photopolymerizable, a photoinitiator is usable in these embodiments.

When all curable materials (elastomeric and additional, if present) are acrylic compounds or otherwise are photopolymerizable by free radical polymerization, a free radical photoinitiator, as described herein, is usable in these embodiments.

A concentration of a photoinitiator in a curable elastomeric formulation containing same may range from about 0.1 to about 5 weight percents, or from about 1 to about 5 weight percents, including any intermediate value and subranges therebetween.

According to some of any of the embodiments described herein, the elastomeric modeling material formulation further comprises one or more additional, non-curable material(s), for example, one or more of a colorant, a dispersant, a surfactant, a stabilizer and an inhibitor, as described herein for a soft modeling material formulation.

In some of any of the embodiments described herein, the elastomeric curable material is a UV curable material, and in some embodiments, it is an elastomeric (meth)acrylate, for example, an elastomeric acrylate.

In some of any of the embodiments described herein, an additional curable component is included in the elastomeric modeling material formulation, and in some embodiments, this component is a UV-curable acrylate or methacrylate.

In some of any of the embodiments described herein, the silica particles are (meth)acrylate-functionalized silica particles.

In some of any of the embodiments described herein, the elastomeric modeling material formulation comprises one or more mono-functional elastomeric acrylate, one or more multi-functional elastomeric acrylate, one or more mono-functional acrylate or methacrylate and one or more multi-functional acrylate or methacrylate.

In some of these embodiments, the elastomeric modeling material formulation further comprises one or more photoinitiators, for example, of the Irgacure® family.

In some of any of the embodiments described herein, all the curable materials and the silica particles the elastomeric modeling formulation are included in a single material formulation.

In some of any of the embodiments described herein, the elastomeric modeling formulation comprises two or more modeling material formulations and forms an elastomeric formulation system comprising an elastomeric curable formulation as described herein.

In some of these embodiments, one modeling material formulation (e.g., a first formulation, or Part A) comprises an elastomeric curable material (e.g., an elastomeric acrylate) and another modeling material formulation (e.g., a second formulation, or Part B) comprises an additional curable material.

Alternatively, each of the two modeling material formulations comprises an elastomeric curable material and one of the formulations further comprises an additional curable material.

Further alternatively, each of the two modeling material formulations in the elastomeric formulation system comprises an elastomeric curable material, yet, the elastomeric materials are different in each formulation. For example, one formulation comprises a mono-functional elastomeric curable material and another formulation comprises a multi-functional elastomeric material. Alternatively, one formulation comprises a mixture of mono-functional and multi-functional elastomeric curable materials at a ratio W and another formulation comprises a mixture of mono-functional and multi-functional elastomeric curable materials at a ratio Q, wherein W and Q are different.

Whenever each of the modeling material formulations comprises an elastomeric material as described herein, one or more of the modeling material formulations in the elastomeric formulation system can further comprise an additional curable material. In exemplary embodiments, one of the formulations comprises a mono-functional additional material and another comprises a multi-functional additional material. In further exemplary embodiments, one of the formulations comprises an oligomeric curable material and another formulation comprises a monomeric curable material.

Any combination of elastomeric and additional curable materials as described herein is contemplated for inclusion in the two or more modeling material formulations forming the elastomeric formulation system. Selecting the composition of the modeling material formulations and the printing mode allows fabrication of objects featuring a variety of properties in a controllable manner, as is described in further detail hereinbelow.

In some embodiments, the one or more modeling material formulations in an elastomeric formulation system are selected such that a ratio of an elastomeric curable material and an additional curable material provides a rubbery-like material as described herein.

In some embodiments, silica particles, one or more photoinitiators, and optionally other components, are included in one or both modeling material formulations.

In exemplary modeling material formulations according to some of any of the embodiments described herein, all curable materials are (meth)acrylates.

In any of the exemplary modeling material formulations described herein, a concentration of a photoinitiator ranges from about 1% to about 5% by weight, or from about 2% to about 5%, or from about 3% to about 5%, or from about 3% to about 4% (e.g., 3, 3.1, 3.2, 3.25, 3.3, 3.4, 3.5, 3.6, 3.7, 3.8, 3.85, 3.9, including any intermediate value therebetween) %, by weight, of the total weight of the formulation or formulation system comprising same.

In any of the exemplary modeling material formulations described herein, a concentration of an inhibitor ranges from 0 to about 2% weight, or from 0 to about 1%, and is, for example, 0, 0.1, 0.2, 0.3, 0.4, 0.5, 0.6, 0.7, 0.8, 0.9 or about 1%, by weight, including any intermediate value therebetween, of the total weight of the formulation or a formulation system comprising same.

In any of the exemplary modeling material formulations described herein, a concentration of a surfactant ranges from 0 to about 1% weight, and is, for example, 0, 0.01, 0.05, 0.1, 0.5 or about 1%, by weight, including any intermediate value therebetween, of the total weight of the formulation or formulation system comprising same.

In any of the exemplary modeling material formulations described herein, a concentration of a dispersant ranges from 0 to about 2% weight, and is, for example, 0, 0.1, 0.5, 0.7, 1, 1.2, 1.3, 1.35, 1.4, 1.5, 1.7, 1.8 or about 2%, by weight, including any intermediate value therebetween, of the total weight of the formulation or formulation system comprising same.

In exemplary modeling material formulations according to some of any of the embodiments described herein, a total concentration of an elastomeric curable material ranges from about 30% to about 90% by weight, or from about 40% to about 90%, by weight, or from about 40% to about 85%, by weight.

By "total concentration" it is meant herein throughout a total weight in all of the (one or more) elastomeric modeling material formulations, or in an elastomeric formulation system as described herein.

In some embodiments, the elastomeric curable material comprises a mono-functional elastomeric curable material and a multi-functional elastomeric curable material.

In some embodiments, a total concentration of the mono-functional elastomeric curable material ranges from about 20% to about 70%, or from about 30% to about 50%, by weight, including any intermediate value and subranges therebetween. In exemplary embodiments, a total concentration of the mono-functional elastomeric curable material ranges from about 50% to about 70%, or from about 55% to about 65%, or from about 55% to about 60% (e.g. 58%), by weight, including any intermediate value and subranges therebetween. In exemplary embodiments, a total concentration of the mono-functional elastomeric curable material ranges from about 30% to about 50%, or from about 35% to about 50%, or from about 40% to about 45% (e.g., 42%), by weight, including any intermediate value and subranges therebetween.

In some embodiments, a total concentration of the multi-functional elastomeric curable material ranges from about 10% to about 30%, by weight. In exemplary embodiments, a concentration of the mono-functional elastomeric curable material ranges from about 10% to about 20%, or from about 10% to about 15% (e.g. 12%), by weight. In exemplary embodiments, a concentration of the mono-functional elastomeric curable material ranges from about 10% to about 30%, or from about 10% to about 20%, or from about 15% to about 20% (e.g., 16%), by weight.

In exemplary modeling material formulations according to some of any of the embodiments described herein, a total concentration of an additional curable material ranges from about 10% to about 40% by weight, or from about 15% to about 35%, by weight, including any intermediate value and subranges therebetween.

In some embodiments, the additional curable material comprises a mono-functional curable material.

In some embodiments, a total concentration of the mono-functional additional curable material ranges from about 15% to about 25%, or from about 20% to about 25% (e.g., 21%), by weight, including any intermediate value and subranges therebetween. In exemplary embodiments, a concentration of the mono-functional elastomeric curable material ranges from about 20% to about 30%, or from about 25% to about 30% (e.g., 28%), by weight, including any intermediate value and subranges therebetween.

In exemplary elastomeric modeling material formulations or formulation systems comprising same according to some of any of the embodiments described herein, the elastomeric curable material comprises a mono-functional elastomeric curable material and a multi-functional elastomeric curable material; a total concentration of the mono-functional elastomeric curable material ranges from about 30% to about 50% (e.g., from about 40% to about 45%) or from about 50% to about 70% (e.g., from about 55% to about 60%) by weight; and a total concentration of the multi-functional elastomeric curable material ranges from about 10% to about 20% by weight; and the one or more formulation(s) further comprise(s) an additional mono-functional curable material at a total concentration that ranges from about 20% to about 30%, by weight.

According to some of any of the embodiments described herein, the one or more modeling formulation(s) comprise(s) at least one elastomeric mono-functional curable material, at least one elastomeric multi-functional curable material and at least additional mono-functional curable material.

According to some of any of the embodiments described herein, a total concentration of the curable mono-functional material ranges from 10% to 30%, by weight of the total weight of the one or more modeling formulation(s).

According to some of any of the embodiments described herein, a total concentration of the elastomeric mono-functional curable material ranges from 50% to 70%, by weight, of the total weight of the one or more modeling formulation(s).

According to some of any of the embodiments described herein, a total concentration of the elastomeric multi-functional curable material ranges from 10% to 20%, by weight, of the total weight of the one or more modeling formulation(s).

According to some of any of the embodiments described herein, a total concentration of the curable mono-functional material ranges from 10% to 30%, by weight; a total concentration of the elastomeric mono-functional curable material ranges from 50% to 70%, by weight; and a total concentration of the elastomeric multi-functional curable material ranges from 10% to 20%, by weight, of the total weight of the one or more modeling formulation(s).

According to some of any of the embodiments described herein, a total concentration of the curable mono-functional material ranges from 20% to 30%, by weight, of the total weight of the one or more modeling formulation(s).

According to some of any of the embodiments described herein, a total concentration of the elastomeric mono-functional curable material ranges from 30% to 50%, by weight, of the total weight of the one or more modeling formulation(s).

According to some of any of the embodiments described herein, a total concentration of the elastomeric multi-functional curable material ranges from 10% to 30%, by weight, of the total weight of the one or more modeling formulation(s).

According to some of any of the embodiments described herein, a total concentration of the curable mono-functional material ranges from 20% to 30%, by weight; a total concentration of the elastomeric mono-functional curable material ranges from 30% to 50%, by weight; and a total concentration of the elastomeric multi-functional curable material ranges from 10% to 30%, by weight, of the total weight of the one or more modeling formulation.

In the exemplary modeling material formulations described herein, a concentration of each component is provided as its concentration when one modeling material formulations is used or as its total concentration in two or more modeling material formulations.

In some embodiments, an elastomeric modeling material formulation (or the two or more modeling material formulations) as described herein, is characterized, when hardened, by Tear Resistance of at least 4,000 N/m, or at least 4500 N/m or at least 5,000 N/m, whereby the Tear Resistance is determined according to ASTM D 624.

In some embodiments, an elastomeric modeling material formulation (or the two or more modeling material formulations) as described herein, is characterized, when hardened, by Tear Resistance higher by at least 500 N/m, or by at least 700 N/m, or by at least 800 N/m, than that of the same modeling material formulation(s) devoid of said silica particles, when hardened.

In some embodiments, an elastomeric modeling material formulation (or the two or more modeling material formulations) as described herein, is characterized, when hardened, by Tensile Strength of at least 2 MPa.

In some embodiments, an elastomeric modeling material formulation (or the two or more modeling material formulations) as described herein, is such that an object consisting of the cured modeling material and featuring two O-rings and a tube connecting the rings, is characterized by Tear Resistance under constant elongation of at least one hour, or at least one day.

According to some of any of the embodiments described herein, the elastomeric curable material is selected from a mono-functional elastomeric curable monomer, a mono-functional elastomeric curable oligomer, a multi-functional elastomeric curable monomer, a multi-functional elastomeric curable oligomer, and any combination thereof, as described herein for an elastomeric curable material in any of the respective embodiments and any combination thereof.

In some embodiments, the elastomeric curable material comprises one or more materials selected from the materials represented by Formula I, I*, II and III, as described herein in any of the respective embodiments and any combination thereof.

According to some of any of the embodiments described herein, the elastomeric curable material and the silica particles are in the same formulation.

According to some of any of the embodiments described herein, the elastomeric curable formulation system further comprises at least one additional curable material.

According to some of any of the embodiments described herein, the additional curable material is selected from a mono-functional curable monomer, a mono-functional curable oligomer, a multi-functional curable monomer, a multi-functional curable oligomer and any combination thereof, as described herein for an additional curable material in any of the respective embodiments and any combination thereof.

According to some of any of the embodiments described herein, the elastomeric curable material, the silica particles and the additional curable material are in the same formulation.

According to some of any of the embodiments described herein, the elastomeric curable material is a UV-curable elastomeric material.

According to some of any of the embodiments described herein, the elastomeric curable material is an acrylic elastomer.

The Object:

Embodiments of the present invention provide three-dimensional objects comprising in at least a portion thereof a soft material that resembles a soft bodily tissue.

Embodiments of the present invention provide three-dimensional objects that resemble a bodily structure as defined herein that comprises a soft bodily tissue or organ.

Embodiments of the present invention provide three-dimensional objects comprising in at least a portion thereof a soft material featuring at least a visual property and a mechanical property of a soft bodily tissue or of a bodily organ, system or structure comprising same.

According to some of any of the embodiments described herein, the object comprises in at least one portion a material which features a Shore A hardness lower than 10 or a Shore 00 hardness lower than 40, as described herein.

According to some of any of the embodiments described herein, the object described herein is obtainable by an additive manufacturing method as described herein in any of the respective embodiments and any combination thereof.

When the object is made of a single, soft modeling material formulation, as described herein, it features mechanical properties as described herein for a soft modeling material formulation, when hardened (cured).

In some embodiments, the object is made of two of more modeling material formulations, and in some of these embodiments, at least a portion of the object is made of digital materials, as described herein. In some embodiments, the object comprises a core-shell structure as described herein in any of the respective embodiments, and features properties in accordance with the selected materials and structure.

An object according to the present embodiments is such that at least a part or a portion thereof is made of a soft material. The object may be such that several parts or portions thereof are made of a soft material, or such that is entirely made of a soft material. The soft material can be the same or different in the different parts or portions, and, for each part, portion or the entire object made of a soft material, the soft material can be the same or different within the portion, part or object. When different soft materials are used, they can differ in their chemical composition and/or mechanical properties, as is further explained hereinafter.

In some of any of the embodiments described herein, the object features at least one of a visual property (e.g., shape, feel, color, appearance) and a mechanical property (e.g., Shore Hardness) of a bodily structure (e.g., bodily system, tissue and/or organ as defined herein).

In some of any of the embodiments described herein, the object features at least a shape and a hardness of a bodily structure that comprises a bodily soft tissue as described herein.

In some of these embodiments, the bodily structure (e.g., bodily tissue or organ or system) comprises a soft bodily tissue such as, for example, a muscle tissue, flesh, a skin tissue, a fat tissue, a brain tissue, a bone marrow tissue, a liver tissue, a cartilage tissue, a tumor tissue, a smooth tissue, and any other soft tissue as described herein.

In some of any of the embodiments described herein, an object as described herein is or forms a part of a medical device, for example, a medical device used for training or education purpose. Exemplary such devices are presented in FIGS. 10, 11A and 11B.

According to some of any of the embodiments described herein, the object has a visual property (e.g., shape and optionally color) and a mechanical property (e.g., hardness) that resemble the respective property of a bodily organ, structure or system, preferably such that comprises a soft bodily tissue. Such objects resemble, for example, a heart, a bone, a brain, a blood vessel, a muscle, a skin or a flesh, and any combination thereof.

Exemplary such objects are presented, for example, in FIGS. 9D and 17.

In some of any of the embodiments described herein, the object is devoid of a biological material, as described herein.

As used herein the term "about" refers to ±10% or ±5%.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

Herein throughout, the term "(meth)acrylic" encompasses acrylic and methacrylic compounds.

Herein throughout, the phrase "linking moiety" or "linking group" describes a group that connects two or more moieties or groups in a compound. A linking moiety is typically derived from a bi- or tri-functional compound, and can be regarded as a bi- or tri-radical moiety, which is connected to two or three other moieties, via two or three atoms thereof, respectively.

Exemplary linking moieties include a hydrocarbon moiety or chain, optionally interrupted by one or more heteroatoms, as defined herein, and/or any of the chemical groups listed below, when defined as linking groups.

When a chemical group is referred to herein as "end group" it is to be interpreted as a substituent, which is connected to another group via one atom thereof.

Herein throughout, the term "hydrocarbon" collectively describes a chemical group composed mainly of carbon and hydrogen atoms. A hydrocarbon can be comprised of alkyl, alkene, alkyne, aryl, and/or cycloalkyl, each can be substituted or unsubstituted, and can be interrupted by one or more heteroatoms. The number of carbon atoms can range from 2 to 20, and is preferably lower, e.g., from 1 to 10, or from 1 to 6, or from 1 to 4. A hydrocarbon can be a linking group or an end group.

Bisphenol A is an example of a hydrocarbon comprised of 2 aryl groups and one alkyl group.

As used herein, the term "amine" describes both a —NR'R" group and a —NR'— group, wherein R' and R" are each independently hydrogen, alkyl, cycloalkyl, aryl, as these terms are defined hereinbelow.

The amine group can therefore be a primary amine, where both R' and R" are hydrogen, a secondary amine, where R' is hydrogen and R" is alkyl, cycloalkyl or aryl, or a tertiary amine, where each of R' and R" is independently alkyl, cycloalkyl or aryl.

Alternatively, R' and R" can each independently be hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, carbonyl, C-carboxylate, O-carboxylate, N-thiocarbamate, O-thiocarbamate, urea, thiourea, N-carbamate, O-carbamate, C-amide, N-amide, guanyl, guanidine and hydrazine.

The term "amine" is used herein to describe a —NR'R" group in cases where the amine is an end group, as defined hereinunder, and is used herein to describe a —NR'— group in cases where the amine is a linking group or is or part of a linking moiety.

The term "alkyl" describes a saturated aliphatic hydrocarbon including straight chain and branched chain groups. Preferably, the alkyl group has 1 to 30, or 1 to 20 carbon atoms. Whenever a numerical range; e.g., "1-20", is stated herein, it implies that the group, in this case the alkyl group, may contain 1 carbon atom, 2 carbon atoms, 3 carbon atoms, etc., up to and including 20 carbon atoms. The alkyl group may be substituted or unsubstituted. Substituted alkyl may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, N-carbamate, O-carbamate, C-amide, N-amide, guanyl, guanidine and hydrazine.

The alkyl group can be an end group, as this phrase is defined hereinabove, wherein it is attached to a single adjacent atom, or a linking group, as this phrase is defined hereinabove, which connects two or more moieties via at least two carbons in its chain. When the alkyl is a linking group, it is also referred to herein as "alkylene" or "alkylene chain".

Herein, a C(1-4) alkyl, substituted by a hydrophilic group, as defined herein, is included under the phrase "hydrophilic group" herein.

Alkene and alkyne, as used herein, are an alkyl, as defined herein, which contains one or more double bond or triple bond, respectively.

The term "cycloalkyl" describes an all-carbon monocyclic ring or fused rings (i.e., rings which share an adjacent pair of carbon atoms) group where one or more of the rings does not have a completely conjugated pi-electron system. Examples include, without limitation, cyclohexane, adamantine, norbornyl, isobornyl, and the like. The cycloalkyl group may be substituted or unsubstituted. Substituted cycloalkyl may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, N-carbamate, O-carbamate, C-amide, N-amide, guanyl, guanidine and hydrazine. The cycloalkyl group can be an end group, as this phrase is defined hereinabove, wherein it is attached to a single adjacent atom, or a linking group, as this phrase is defined hereinabove, connecting two or more moieties at two or more positions thereof.

Cycloalkyls of 1-6 carbon atoms, substituted by two or more hydrophilic groups, as defined herein, is included under the phrase "hydrophilic group" herein.

The term "heteroalicyclic" describes a monocyclic or fused ring group having in the ring(s) one or more atoms such as nitrogen, oxygen and sulfur. The rings may also have one or more double bonds. However, the rings do not have a completely conjugated pi-electron system. Representative examples are piperidine, piperazine, tetrahydrofuran, tetrahydropyrane, morpholino, oxalidine, and the like.

The heteroalicyclic may be substituted or unsubstituted. Substituted heteroalicyclic may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, O-carbamate, N-carbamate, C-amide, N-amide, guanyl, guanidine and hydrazine. The heteroalicyclic group can be an end group, as this phrase is defined hereinabove, where it is attached to a single adjacent atom, or a linking group, as this phrase is defined hereinabove, connecting two or more moieties at two or more positions thereof.

A heteroalicyclic group which includes one or more of electron-donating atoms such as nitrogen and oxygen, and in which a numeral ratio of carbon atoms to heteroatoms is 5:1 or lower, is included under the phrase "hydrophilic group" herein.

The term "aryl" describes an all-carbon monocyclic or fused-ring polycyclic (i.e., rings which share adjacent pairs of carbon atoms) groups having a completely conjugated pi-electron system. The aryl group may be substituted or unsubstituted. Substituted aryl may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, N-carbamate, O-carbamate, C-amide, N-amide, guanyl, guanidine and hydrazine. The aryl group can be an end group, as this term is defined hereinabove, wherein it is attached to a single adjacent atom, or a linking group, as this term is defined hereinabove, connecting two or more moieties at two or more positions thereof.

The term "heteroaryl" describes a monocyclic or fused ring (i.e., rings which share an adjacent pair of atoms) group having in the ring(s) one or more atoms, such as, for example, nitrogen, oxygen and sulfur and, in addition, having a completely conjugated pi-electron system. Examples, without limitation, of heteroaryl groups include pyrrole, furan, thiophene, imidazole, oxazole, thiazole, pyrazole, pyridine, pyrimidine, quinoline, isoquinoline and purine. The heteroaryl group may be substituted or unsubstituted. Substituted heteroaryl may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, O-carbamate, N-carbamate, C-amide, N-amide, guanyl, guanidine and hydrazine. The heteroaryl group can be an end group, as this phrase is defined hereinabove, where it is attached to a single adjacent atom, or a linking group, as this phrase is defined hereinabove, connecting two or more moieties at two or more positions thereof. Representative examples are pyridine, pyrrole, oxazole, indole, purine and the like.

The term "halide" and "halo" describes fluorine, chlorine, bromine or iodine.

The term "haloalkyl" describes an alkyl group as defined above, further substituted by one or more halide.

The term "sulfate" describes a —O—S($=$O)$_2$—OR' end group, as this term is defined hereinabove, or an —O—S($=$O)$_2$—O— linking group, as these phrases are defined hereinabove, where R' is as defined hereinabove.

The term "thiosulfate" describes a —O—S($=$S)($=$O)—OR' end group or a —O—S($=$S)($=$O)—O— linking group, as these phrases are defined hereinabove, where R' is as defined hereinabove.

The term "sulfite" describes an —O—S(=O)—O—R' end group or a —O—S(=O)—O— group linking group, as these phrases are defined hereinabove, where R' is as defined hereinabove.

The term "thiosulfite" describes a —O—S(=S)—O—R' end group or an —O—S(=S)—O— group linking group, as these phrases are defined hereinabove, where R' is as defined hereinabove.

The term "sulfinate" describes a —S(=O)—OR' end group or an —S(=O)—O— group linking group, as these phrases are defined hereinabove, where R' is as defined hereinabove.

The term "sulfoxide" or "sulfinyl" describes a —S(=O)R' end group or an —S(=O)— linking group, as these phrases are defined hereinabove, where R' is as defined hereinabove.

The term "sulfonate" describes a —S(=O)$_2$—R' end group or an —S(=O)$_2$— linking group, as these phrases are defined hereinabove, where R' is as defined herein.

The term "S-sulfonamide" describes a —S(=O)$_2$—NR'R" end group or a —S(=O)$_2$—NR'— linking group, as these phrases are defined hereinabove, with R' and R" as defined herein.

The term "N-sulfonamide" describes an R'S(=O)$_2$—NR"— end group or a —S(=O)$_2$—NR'— linking group, as these phrases are defined hereinabove, where R' and R" are as defined herein. The term "disulfide" refers to a —S—SR' end group or a —S—S— linking group, as these phrases are defined hereinabove, where R' is as defined herein.

The term "phosphonate" describes a —P(=O)(OR')(OR") end group or a —P(=O)(OR')(O)— linking group, as these phrases are defined hereinabove, with R' and R" as defined herein.

The term "thiophosphonate" describes a —P(=S)(OR')(OR") end group or a —P(=S)(OR')(O)— linking group, as these phrases are defined hereinabove, with R' and R" as defined herein.

The term "phosphinyl" describes a —PR'R" end group or a —PR'— linking group, as these phrases are defined hereinabove, with R' and R" as defined hereinabove.

The term "phosphine oxide" describes a —P(=O)(R')(R") end group or a —P(=O)(R')— linking group, as these phrases are defined hereinabove, with R' and R" as defined herein.

The term "phosphine sulfide" describes a —P(=S)(R')(R") end group or a —P(=S)(R')— linking group, as these phrases are defined hereinabove, with R' and R" as defined herein.

The term "phosphite" describes an —O—PR'(=O)(OR") end group or an —O—PH(=O)(O)— linking group, as these phrases are defined hereinabove, with R' and R" as defined herein. The term "carbonyl" or "carbonate" as used herein, describes a —C(=O)—R' end group or a —C(=O)— linking group, as these phrases are defined hereinabove, with R' as defined herein.

The term "thiocarbonyl" as used herein, describes a —C(=S)—R' end group or a —C(=S)— linking group, as these phrases are defined hereinabove, with R' as defined herein.

The term "oxo" as used herein, describes a (=O) group, wherein an oxygen atom is linked by a double bond to the atom (e.g., carbon atom) at the indicated position.

The term "thiooxo" as used herein, describes a (=S) group, wherein a sulfur atom is linked by a double bond to the atom (e.g., carbon atom) at the indicated position.

The term "oxime" describes a =N—OH end group or a =N—O— linking group, as these phrases are defined hereinabove.

The term "hydroxyl" describes a —OH group.

The term "alkoxy" describes both an —O-alkyl and an —O-cycloalkyl group, as defined herein.

The term "aryloxy" describes both an —O-aryl and an —O-heteroaryl group, as defined herein.

The term "thiohydroxy" describes a —SH group.

The term "thioalkoxy" describes both a —S-alkyl group, and a —S-cycloalkyl group, as defined herein.

The term "thioaryloxy" describes both a —S-aryl and a —S-heteroaryl group, as defined herein.

The "hydroxyalkyl" is also referred to herein as "alcohol", and describes an alkyl, as defined herein, substituted by a hydroxy group.

The term "cyano" describes a —C≡N group.

The term "isocyanate" describes an —N=C=O group.

The term "isothiocyanate" describes an —N=C=S group.

The term "nitro" describes an —NO$_2$ group.

The term "acyl halide" describes a —(C=O)R"" group wherein R"" is halide, as defined hereinabove.

The term "azo" or "diazo" describes an —N=NR' end group or an —N=N— linking group, as these phrases are defined hereinabove, with R' as defined hereinabove.

The term "peroxo" describes an —O—OR' end group or an —O—O— linking group, as these phrases are defined hereinabove, with R' as defined hereinabove.

The term "carboxylate" as used herein encompasses C-carboxylate and O-carboxylate.

The term "C-carboxylate" describes a —C(=O)—OR' end group or a —C(=O)—O— linking group, as these phrases are defined hereinabove, where R' is as defined herein.

The term "O-carboxylate" describes a —OC(=O)R' end group or a —OC(=O)— linking group, as these phrases are defined hereinabove, where R' is as defined herein.

A carboxylate can be linear or cyclic. When cyclic, R' and the carbon atom are linked together to form a ring, in C-carboxylate, and this group is also referred to as lactone. Alternatively, R' and O are linked together to form a ring in O-carboxylate. Cyclic carboxylates can function as a linking group, for example, when an atom in the formed ring is linked to another group.

The term "thiocarboxylate" as used herein encompasses C-thiocarboxylate and O-thiocarboxylate.

The term "C-thiocarboxylate" describes a —C(=S)—OR' end group or a —C(=S)—O— linking group, as these phrases are defined hereinabove, where R' is as defined herein.

The term "O-thiocarboxylate" describes a —OC(=S)R' end group or a —OC(=S)— linking group, as these phrases are defined hereinabove, where R' is as defined herein.

A thiocarboxylate can be linear or cyclic. When cyclic, R' and the carbon atom are linked together to form a ring, in C-thiocarboxylate, and this group is also referred to as thiolactone. Alternatively, R' and O are linked together to form a ring in O-thiocarboxylate. Cyclic thiocarboxylates can function as a linking group, for example, when an atom in the formed ring is linked to another group.

The term "carbamate" as used herein encompasses N-carbamate and O-carbamate.

The term "N-carbamate" describes an R"OC(=O)—NR'— end group or a —OC(=O)—NR'— linking group, as these phrases are defined hereinabove, with R' and R" as defined herein.

The term "O-carbamate" describes an —OC(=O)—NR'R" end group or an —OC(=O)—NR'— linking group, as these phrases are defined hereinabove, with R' and R" as defined herein.

A carbamate can be linear or cyclic. When cyclic, R' and the carbon atom are linked together to form a ring, in O-carbamate. Alternatively, R' and O are linked together to form a ring in N-carbamate. Cyclic carbamates can function as a linking group, for example, when an atom in the formed ring is linked to another group.

The term "carbamate" as used herein encompasses N-carbamate and O-carbamate.

The term "thiocarbamate" as used herein encompasses N-thiocarbamate and O-thiocarbamate.

The term "O-thiocarbamate" describes a —OC(=S)—NR'R" end group or a —OC(=S)—NR'— linking group, as these phrases are defined hereinabove, with R' and R" as defined herein. The term "N-thiocarbamate" describes an R"OC(=S)NR'— end group or a —OC(=S)NR'— linking group, as these phrases are defined hereinabove, with R' and R" as defined herein.

Thiocarbamates can be linear or cyclic, as described herein for carbamates.

The term "dithiocarbamate" as used herein encompasses S-dithiocarbamate and N-dithiocarbamate.

The term "S-dithiocarbamate" describes a —SC(=S)—NR'R" end group or a —SC(=S)NR'— linking group, as these phrases are defined hereinabove, with R' and R" as defined herein.

The term "N-dithiocarbamate" describes an R"SC(=S)NR'— end group or a —SC(=S)NR'— linking group, as these phrases are defined hereinabove, with R' and R" as defined herein.

The term "urea", which is also referred to herein as "ureido", describes a —NR'C(=O)—NR"R'" end group or a —NR'C(=O)—NR"— linking group, as these phrases are defined hereinabove, where R' and R" are as defined herein and R'" is as defined herein for R' and R".

The term "thiourea", which is also referred to herein as "thioureido", describes a —NR'—C(=S)—NR"R'" end group or a —NR'—C(=S)—NR"— linking group, with R', R" and R'" as defined herein.

The term "amide" as used herein encompasses C-amide and N-amide.

The term "C-amide" describes a —C(=O)—NR'R" end group or a —C(=O)—NR'— linking group, as these phrases are defined hereinabove, where R' and R" are as defined herein.

The term "N-amide" describes a R'C(=O)—NR"— end group or a R'C(=O)—N— linking group, as these phrases are defined hereinabove, where R' and R" are as defined herein.

An amide can be linear or cyclic. When cyclic, R' and the carbon atom are linked together to form a ring, in C-amide, and this group is also referred to as lactam. Cyclic amides can function as a linking group, for example, when an atom in the formed ring is linked to another group.

The term "guanyl" describes a R'R"NC(=N)— end group or a —R'NC(=N)— linking group, as these phrases are defined hereinabove, where R' and R" are as defined herein.

The term "guanidine" describes a —R'NC(=N)—NR"R'" end group or a —R'NC(=N)— NR"— linking group, as these phrases are defined hereinabove, where R', R" and R'" are as defined herein.

The term "hydrazine" describes a —NR'—NR"R'" end group or a —NR'—NR"— linking group, as these phrases are defined hereinabove, with R', R", and R'" as defined herein.

As used herein, the term "hydrazide" describes a —C(=O)—NR'—NR"R'" end group or a —C(=O)—NR'—NR"— linking group, as these phrases are defined hereinabove, where R', R" and R'" are as defined herein.

As used herein, the term "thiohydrazide" describes a —C(=S)—NR'—NR"R'" end group or a —C(=S)—NR'—NR"— linking group, as these phrases are defined hereinabove, where R', R" and R'" are as defined herein.

As used herein, the term "alkylene glycol" describes a —O—[(CR'R")$_z$—O]$_y$R'" end group or a —O—[(CR'R")$_z$—O]$_y$— linking group, with R', R" and R'" being as defined herein, and with z being an integer of from 1 to 10, preferably, from 2 to 6, more preferably 2 or 3, and y being an integer of 1 or more. Preferably R' and R" are both hydrogen. When z is 2 and y is 1, this group is ethylene glycol. When z is 3 and y is 1, this group is propylene glycol. When y is 2-4, the alkylene glycol is referred to herein as oligo(alkylene glycol).

When y is greater than 4, the alkylene glycol is referred to herein as poly(alkylene glycol). In some embodiments of the present invention, a poly(alkylene glycol) group or moiety can have from 10 to 200 repeating alkylene glycol units, such that z is 10 to 200, preferably 10-100, more preferably 10-50.

The term "silanol" describes a —Si(OH)R'R" group, or —Si(OH)$_2$R' group or —Si(OH)$_3$ group, with R' and R" as described herein.

The term "silyl" describes a —SiR'R"R'" group, with R', R" and R'" as described herein.

As used herein, the term "urethane" or "urethane moiety" or "urethane group" describes a Rx-O—C(=O)—NR'R" end group or a -Rx-O—C(=O)—NR'— linking group, with R' and R" being as defined herein, and Rx being an alkyl, cycloalkyl, aryl, alkylene glycol or any combination thereof. Preferably R' and R" are both hydrogen.

The term "polyurethane" or "oligourethane" describes a moiety that comprises at least one urethane group as described herein in the repeating backbone units thereof, or at least one urethane bond, —O—C(=O)—NR'—, in the repeating backbone units thereof.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Herein throughout, whenever the phrase "weight percents", or "% by weight" or "% wt.", is indicated in the context of embodiments of a formulation (e.g., a modeling formulation), it is meant weight percents of the total weight of the respective uncured formulation.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Example 1

Formulation Design

The present inventors have sought for a modeling material formulation that can provide, when used in additive manufacturing methodologies such as 3D inkjet printing, hardened materials featuring a range of Shore hardness values lower than 10, preferably lower than 1, or of 0, at the Shore A scale, and/or lower than 50, preferably lower than 40, or lower than 30, at the Shore 00 scale (see, FIG. 7), combined with a range of viscosities, and of mechanical and/or appearance properties of the hardened material obtained thereby.

As described hereinabove, such soft modeling materials are suitable, inter alia, for providing 3D objects featuring, in at least a portion thereof, properties that mimic soft bodily tissues.

As further described hereinabove, to date, the lowest Shore hardness value obtained for a 3D-inkjet printed hardened material is about 27 at the Shore Hardness A scale.

The Shore Hardness of currently practiced 3D-inkjet printed hardened model materials is mainly attributed to the exclusive inclusion of curable materials in the modeling formulations providing same.

Materials exhibiting low hardness as indicated above are typically gel-like materials (e.g., materials featuring mechanical properties of a gel), which are obtained from formulations that include, in addition to curable materials, also non-curable materials. Such gel-like materials are currently mostly used in additive manufacturing as support materials, which are aimed to be removed at the end of the process and do not form a part of the final object.

Herein and in the art, the term "gel" describes a material, often referred to as a semi-solid material, which comprises a three-dimensional solid network, typically made of fibrous structures chemically or physically linked therebetween, and a liquid phase encaged within this network. Gels are typically characterized by a consistency of a solid (e.g., are non-fluidic), and feature relatively low Tensile strength, relatively low Shear Modulus, e.g., lower than 100 kPa, and a Shear Loss Modulus to Shear Storage modulus (tan delta, $G''/G'$) value lower than 1.

Gel-like materials according to the present embodiments are typically soft materials, which can be gels or solids, which feature mechanical and rheological properties of a gel.

However, such gel-like materials exhibit low Tensile strength and low Tear resistance, and hence break easily under stress, a property which is highly undesirable in additive manufacturing in general and 3D-inkjet printing in particular, and are further susceptible to being damaged when exposed to water and upon usage. Further, gel-like materials typically pose printing reliability issues such as smearing and stickiness, and, in addition, feature low dimension stability due to possible leakage, sweating or drying. Gel-like materials are further limited by their capability to swell other components and hence may be incompatible, or at least form unstable objects, when used in multi-material (e.g., digital material) techniques.

While a solution to the limitations associated with utilizing formulations that provide, when hardened, gel-like materials, may be a use of reinforcing materials which provide for improved strength, and/or encapsulating the gel-like material in a material exhibiting the desired stiffness and/or durability, such solutions may provide hardened materials with overall characteristics, and particularly hardness, which exceed the target characteristics.

Liquid materials can also be added to the formulation, to balance the overall properties, yet, such materials may adversely affect the performance of the obtained object, for example, while causing a "bleeding" effect and/or by adversely affecting the mechanical properties of the objects (typically be decreasing the cross-linking density). The amount of the liquid material should therefore be selected so as to provide a desired effect with minimal adverse effects.

The present inventors have therefore studied ample combinations of curable and non-curable materials to be included in the modeling material formulation or formulation system, that would provide the desired hardness values, preferably in combination with other desirable properties for efficient additive manufacturing of objects, including, for example, Tensile strength, Tear resistance, stability (prolonged shelf-live), dimensional stability, and compatibility with other curable materials when utilized in multi-material additive manufacturing processes (e.g., when utilized in formation of digital materials in 3D-inkjet printing).

The tested formulations, and the hardened materials or objects made therefrom, were characterized when used per se and when used in combination with other curable formulations, as a formulation system in a multi-material (digital material, or DM) approach. The tested formulations were further characterized for their suitability to provide hardened materials that are suitable for use in printing objects that include, in at least a portion thereof, materials that mimic (e.g., feature mechanical and appearance properties of) bodily soft tissues, as described herein.

Example 2

Formulations

Table 1 below presents exemplary formulations according to the present embodiments, which exhibit Shore scale A hardness 0 (as determined by no reading when measured using a Shore A durometer according to ASTM D2240).

The phrase "monofunctional acrylate type I" as used in Table 1, encompasses monofunctional hydrophilic or hydrophilic amphiphilic acrylates, more specifically one or more monomeric, oligomeric or polymeric curable material(s) featuring an acrylate group as a polymerizable group and one or more heteroatoms (e.g., O, N or both) or heteroatom-containing groups (e.g., carboxylate, amide, alkylene glycol and combinations thereof) which impart a hydrophilic or amphiphilic nature. See also Formula A1, wherein $R_1$ is $C(=O)-O-Ra$, and Ra is a hydrophilic or amphiphilic moiety that does not include a hydrophobic group or moiety as described herein. Exemplary materials include alkoxy-terminated poly(ethylene glycol) acrylates (e.g., such as marketed as AM130); urethane acrylates (e.g., such as marketed as Genomer®, for example, Genomer 1122); Acryloyl morpholine, and any of the other respective curable materials described herein.

The phrase "monofunctional acrylate type II" encompasses one or more monomeric, oligomeric or polymeric, preferably monomeric, hydrophobic or hydrophobic amphiphilic, curable material(s) featuring an acrylate group as a polymerizable group and at least one hydrophobic moiety or group, e.g., a hydrocarbon of at least 6 carbon atoms in length, as defined herein. See also Formula A2, wherein $R_1$ is C(=O)—O—Ra, and Ra is or comprises a hydrophobic moiety or group. Exemplary such materials include compounds of Formula A as described herein featuring as Ra groups such as nonyl phenyl, isodecyl, and/or lauryl groups, optionally in combination with alkylene glycol groups, for example, those marketed by Sartomer as SR395; SR504D, SR335, SR7095 and more.

The phrase "non-curable polymeric material" as used in the Examples section herein encompasses one or more polymeric material(s), devoid of a polymerizable acrylate group or any other polymerizable group that participates in polymerization upon exposure to conditions that initiate acrylate polymerization (e.g., devoid of photopolymerizable group or a group that polymerizes upon exposure to radiation at wavelength that induce acrylate polymerization), as described herein. Preferably, the non-curable polymeric material(s) include one or more block co-polymers of PEG and PPG, also known under the Trade name "Pluronic®", at any order and number of blocks, at any MW and featuring a variety of Tg values when hardened. Preferably, the non-curable polymeric material(s) include one or more block co-polymers of PEG and PPG such as PEG-PPG-PEG and PPG-PEG-PPG, featuring no more than 10% by weight of PEG, and/or a PEG/PPG ratio as described herein, featuring MW of at least 500, preferably at least 900 and more preferably of at least 2,000, Daltons and/or featuring, when hardened, Tg lower than 20, preferably lower than 0, more preferably lower than −20, ° C., as described herein. Preferably, these materials are characterized by low solubility (e.g., lower than 20% or lower than 10%, or lower), or insolubility in water.

The phrase "multi-functional acrylate" encompasses one or more monomeric, oligomeric or polymeric curable material(s) featuring two or more polymerizable acrylate groups. Such materials are also referred to herein as cross-linking agents. Exemplary such materials include, but are not limited to, urethane diacrylates such as, for example, marketed as Ebecryl 230; aliphatic di-, tri- or tetra-acrylates such as, for example, trimethylolpropane triacrylate, optionally ethoxylated (e.g., materials marketed as Photomer 4072, Photomer 4158, Photomer 4149, Photomer 4006, Miramer M360, SR499), glyceryl triacrylate, pentaerythritol tetraacrylate, optionally ethoxylated (e.g., marketed as Photomer 4172), heaxnediol diacrylate, PEGDA, and more; epoxy diacrylates such as marketed as Photomer 3005, Photomer 3015, Photomer 3016, Photomer 3316. Preferably, the multi-functional acrylate features, when hardened, Tg lower than 20° C., or lower than 0° C., or lower.

The phrase "polysiloxane" encompasses non-curable organic and inorganic materials comprising a polysiloxane backbone, including, as non-limiting examples, PDMS and derivatives thereof and block-copolymers containing same.

The terms "photoinitiator" and "inhibitor" are as defined herein.

All formulations presented in Table 1 comprise one or more photoinitiators in an amount ranging for 1 to 5% by weight (e.g., 3% wt.). Exemplary photoinitiators include those of the Irgacure® family, for example, 1819, 1184, and a combination thereof.

All formulations presented in Table 1 comprise one or more inhibitors (free-radical polymerization inhibitors) in an amount ranging for 0.01 to 1% by weight (e.g., 0.1% wt.), unless otherwise indicated. Exemplary inhibitors include Tris(N-nitroso-N-phenylhydroxylamine) Aluminum Salt (NPAL) and inhibitors of the Genorad™ family, such as, for example, G18.

Some of the formulations presented in Table 1 further comprise additional, non-reactive components (additives) as described herein.

In an exemplary formulation (BM219) a UV-curable surface active agent is used—BYK UV-3500—Polyether-modified, acryl-functional polydimethylsiloxane.

TABLE 1

| Formulation Code | Monofunctional acrylate Type 1 (% wt.) | Monofunctional Acrylate Type II (% wt.) | Multi-functional acrylate* (% wt.) | Non-curable polymeric material (% wt.) |
|---|---|---|---|---|
| BM19 | X | 40 | 7 | $50^a$ |
| BM19(5) | 5 | $40^d$ | 7 | $45^a$ |
| BM19(10) | 10 | $40^d$ | 7 | $40^a$ |
| BM29 | X | $52^e$ | 15 | $30^a$ |
| BM32 | X | $40^f$ | 7 | $50^a$ |
| BM35 | X | $50^e$ | 7 | $40^a$ |
| BM38 | 10 | $50^e$ | 7 | $30^a$ |
| BM43 | X | 57 ($27^e + 30^d$) | 10 | $30^a$ |
| BM44 | X | 57 ($15^e + 42^d$) | 10 | $30^a$ |
| BM58 | 20 | $30^d$ | 7 | $40^a$ |
| BM61 | X | 57 ($27^e + 30^d$) | 7 | $33^c$ |
| BM62 | X | 57 ($27^e + 30^d$) | 7 | $33^b$ |
| BM62 | X | 57 ($27^f + 30^d$) | 7 | $33^a$ |
| BM64 | 10 | $50^f$ | 7 | $30^c$ |
| BM66 | X | 57 ($15^d + 42^e$) | 3 | $33^c$ |
| BM67 | 20.9 | $31.3^d$ | 3 | $41.8^a$ |
| BM68 | 18.2 | $27.3^d$ | 15 | $36.5^a$ |
| BM75 | X | $94^d$ | 3 | X |
| BM76 | X | $87^d$ | 3 | $7^c$ |
| BM77 | X | $79^d$ | 3 | $15^c$ |
| BM78 | X | $64^d$ | 3 | $30^c$ |
| BM101 | X | 61 ($34^d + 27^e$) | 3** | $33^c$ |
| BM102 | X | 61 ($34^d + 27^e$) | 3*** | $33^c$ |
| BM103 | 27 | $33^d$ | 7 | $30^b$ |
| BM104 | 60 | X | 7 | $30^b$ |
| BM108 | X | 57 ($27^e + 30^d$) | 7 | $33^h$ |
| BM109 | X | 67 ($27^e + 40^d$) | 7 | $23^c$ |
| BM110 | X | 47 ($27^e + 20^d$) | 7 | $43^c$ |

TABLE 1-continued

| Formulation Code | Monofunctional acrylate Type 1 (% wt.) | Monofunctional Acrylate Type II (% wt.) | Multi-functional acrylate* (% wt.) | Non-curable polymeric material (% wt.) |
|---|---|---|---|---|
| BM111 | X | 67 (37$^e$ + 30$^d$) | 7 | 23$^c$ |
| BM112 | X | 62 (27$^e$ + 35$^d$) | 7 | 28$^c$ |
| BM131 | X | 57 (27$^e$ + 30$^d$) | 7 | 33$^g$ |
| BM151 | X | 57 (27$^e$ + 30$^d$) | 7 | 33 (16.5$^g$ + 16.5$^c$) |
| BM205.4$^\#$ | X | 56 (27$^e$ + 29$^d$) | 7 | 33$^k$ |
| BM219$^{\#\#}$ | X | 63$^f$ | 7 | 26 (13$^g$ + 13$^c$) |

$^a$= PPG; MW 900
$^b$= PEG-PPG-PEG block copolymer MW 2750
$^c$= PPG; MW 2000
$^h$= PPG-PEG-PPG block copolymer MW 3500
$^g$= PPG-PEG-PPG block copolymer MW 3250
$^k$= PEG-PPG-PEG block copolymer MW 2000
$^d$= ethoxylated nonylphenyl acrylate
$^e$= isodecyl acrylate
$^f$= lauryl acrylate or ethoxylated lauryl acrylate
*= urethane diacrylate (e.g., Ebecryl 230) unless otherwise indicated
**= aliphatic triacrylate (e.g., trimetholopropane triacrylate)
***= epoxy diacrylate (e.g., Photomer 3005F)
$^\#$= G18 type inhibitor used, at a concentration of 1.5% wt. + UV curable surface active agent (e.g., BYK3500)
$^{\#\#}$= G18 type inhibitor used, at a concentration of 1% wt.

Additional exemplary formulations, comprising a multi-functional acrylate other than urethane diacrylate and/or at an amount of from 1 to 3% wt., and/or comprising polysiloxane compounds at an amount of 5-10% wt., have been prepared, and all featured Shore A hardness 0 as defined herein.

Example 3

Characterization

The following preliminary tests were performed for characterizing the hardened materials obtained from the tested formulations during the design process.

Shore A Hardness was determined in accordance with ASTM D2240 on a Shore A durometer.

Shore 00 Hardness was determined in accordance with ASTM D2240 using a Shore 00 durometer.

Compression modulus was determined for a cylindrical uncoated object (printed of a tested formulation per se) featuring a radius of 20 mm and a height of 15 mm, printed using Stratasys J750™ 3 D Printer. The test was performed using a Lloyd instrumental system, 100N load cell, operated at the following parameters: Direction=Compression; Preload/Stress=0.5 N; preload/Stress Speed=50 mm/minute; Speed=50 mm/minute; Limit=8 mm. A stress vs. strain data was extracted from the obtained data and the slope between strain values of 0.001-0.01 was calculated. A satisfying value in these measurements ranges from 0.02 to 0.1 MPa. The data obtained in these tests is also referred to herein as "compression stress at 40% strain".

Same Lloyd system was used in adhesion tests, operated at the following parameters: Direction=Tension; Speed down=2 mm/minute; Speed up=5 mm/minute; Force down=−5N; Holding time=1 second. Specimens in which a tested formulation was used as a coat were measured, and results are reported as the maximum load required to pull out the platen from the coat specimen.

Tear Resistance (TR) was determined in accordance with ASTM D624 for a specimen as described therein having a thickness of 2 mm. Values are reported herein as Load at maximum Load (N) for the 2 mm-thick specimen. A satisfying value in these measurements is at least 0.3N. For some formulations, Time to Break measured in this test is also reported, with a satisfying value being at least 9 seconds. The reported values are converted to N/m Tear Resistance values as described wherein when divided by 0.002. For example, a value of 0.3N as reported herein equals 150 N/m.

Stability was determined for uncoated objects (printed of a tested formulation per se) or for coated objects (printed with a 0.8 mm coating of an elastomeric curable material (for example, the Agilus family, e.g., Agilus30™), all printed using Stratasys J750™ 3D Printer, and featuring a cube shape of 25 mm×25 mm×25 mm, weighing the obtained object once printed, storing the object at 50° C. for 7 days, and re-weighing, using analytical scales. The weight change is provided in % wt., relative to the initial weight after printing.

Dimensional stability is determined for coated oval objects of 60×24×18 mm coated with 0.6 mm layer of an elastomeric curable material (for example, the Agilus family, e.g., Agilus30™), upon storage at 50° C. for several days or at room temperature for one month, and observing distortions in the object upon storage. An acceptable result would be no distortion.

Stickiness after printing was determined qualitatively, for a printed object shaped as a cube, by applying to the object a tissue paper and provide a rate on a 0-3 scale as follows: 3 for cases where the tissue paper could not be removed from the object, and 0 for cases where no fibers were stuck to the object once the tissue paper has been removed.

Printing 3D objects was performed using Stratasys J750™ 3 D Printer.

All formulations feature Shore A hardness 0, and some formulations, when tested for their Shore 00 hardness, feature a value of 0-30.

Table 2A below summarizes the data obtained while characterizing exemplary formulations according to the present embodiments, as presented in Table 1, using the experimental methods described hereinabove.

TABLE 2A

| Formulation Code | Compression Stress at 40% Strain (MPa) | Tear Resistance** (N) | Stability of uncoated cube object* (% wt. change) | Stability of coated cube object* (% wt. change) | Stickiness |
|---|---|---|---|---|---|
| BM19 | 0.06 | | | | 3 |
| BM19(5) | 0.04-0.05 | 0.44 ± 0.05 | | | 3 |
| BM19(10) | 0.04-0.05 | 0.49 ± 0.06 | | | 2 |
| BM29 | 0.08-0.09 | 0.67 ± 0.05 | | | 2 |
| BM32 | 0.04-0.05 | | | | |
| BM35 | | | | | 3 |
| BM38 | | | | | |
| BM43 | 0.05 | 0.60 ± 0.03 | −0.63 | −0.47 | 2 |
| BM44 | 0.06 | | | | |
| BM58 | 0.038 | 0.49 ± 0.03 | −1.06 | −0.6 | 3 |
| BM61 | 0.045 | 0.64 ± 0.06 (Time to Break = 9 seconds) | −0.41 | −0.27 | 2 |
| BM62 | 0.047 | 0.42 ± 0.05 | −0.66 | −0.42 | 2 |
| BM63 | | | ND | ND | |
| BM64 | | | ND | ND | 3 |
| BM66 | | 0.26 | ND | ND | 0 |
| BM67 | | | ND | ND | |
| BM68 | | | ND | ND | 0 |
| BM75 | | | ND | ND | 1 |
| BM76 | | | ND | ND | 1 |
| BM77 | | | ND | ND | 0 |
| BM78 | | | ND | ND | 0 |
| BM101 | 0.177 | 0.36 (Time to Break = 6 seconds) | ND | ND | 1 |
| BM102 | 0.072 | 0.18 | ND | ND | 1 |
| BM103 | | | ND | ND | |
| BM104 | | | ND | ND | |
| BM108 | 0.037 | 0.57 ± 0.07 | ND | ND | |
| BM109 | 0.074 | 0.57 ± 0.16 | ND | ND | |
| BM110 | | | ND | ND | |
| BM111 | 0.065 | 0.57 ± 0.09 | ND | ND | |
| BM112 | | 0.63 ± 0.046 | ND | ND | |
| BM131 | 0.027 | 0.64 ± 0.04 | ND | ND | |
| BM151 | 0.02-0.04 | 0.44 ± 0.02 (Time to Break = 22 seconds) | ND | ND | |

*all formulations from BM62 onwards feature dimensional stability and were not tested further Ok
**Tear Resistance measured and reported as described herein An adhesion test as described hereinabove was performed by printing a cube sample (15 mm×15 mm×15 mm) made of a modeling formulation such as marketed as Vero, coated by a 0.6 mm-thick layer of the tested formulation. The obtained sample was tested as is (wet) and upon drying with a cloth (dry). The following data was obtained: BM151 (wet)—Load at Maximum Load=1.3N; BM151 (dry)—Load at Maximum Load=7.3N.

In a different set of experiments, the formulations presented in Table 1 as BM205.4 and BM219 were characterized as follows:

Shore00 Hardness was measured for an uncoated object (printed of a tested formulation per se) or for coated objects (printed with a 0.6 mm coating of an elastomeric curable material (e.g., Agilus30™), all printed using Stratasys J750™ 3D Printer, in accordance with ASTM D2240 using a Shore 00 durometer, for a 6 mm-height sample.

Compression modulus was determined for a cylindrical, Agilus30-coated object made of the tested formulation, featuring a radius of 20 mm and a height of 15 mm, printed using Stratasys J750™ 3 D Printer. The test was performed using a Lloyd instrumental system, 100N load cell, operated at the following parameters: Direction=Compression; Preload/Stress=0.5 N; preload/Stress Speed=50 mm/minute; Speed=50 mm/minute; Limit=90N. The compression modulus was determined for a maximum stress value of 90N. A stress vs. strain data was extracted from the obtained data and the slope between strain values of 0.001-0.01 was calculated.

Load to break was determined for a cubic Agilus-coated object made of the tested formulation, having dimensions of 50×50×50 mm, printed using Stratasys J750™ 3 D Printer. The test was performed using a Lloyd instrumental system, 100N load cell, operated at the following parameters: Direction=Compression; Preload/Stress=0.5 N; preload/Stress Speed=50 mm/minute; Speed=50 mm/minute; load to break was determined to be the maximum load the sample can hold before ultimate failure.

Stability was measured for an Agilus-coated cubic object, printed of a tested formulation per se, using Stratasys J750™ 3D Printer, featuring 50 mm×50 mm×50 mm dimensions; weighing the obtained object once printed, storing the object at 50° C. for 3 days, and re-weighing, using analytical scales. The weight change is provided in % wt., relative to the initial weight after printing.

The obtained data is presented in Table 2B below.

TABLE 2B

| Formulation | Shore00 (uncoated) | Shore00 (coated) | Load to Break (N) | Compression Modulus (MPa) | Stability of uncoated cube object* (% wt. change) |
|---|---|---|---|---|---|
| BM205.4 | 29 | 49 | 728 | 0.176 | −0.4 |
| BM219 | 12.5 | 44 | 731 | 0.065 | −0.68 |

Printability, stickiness to the roller and an amount of material within the roller bath after leveling were observed qualitatively, and showed good printability for most of the tested formulations, whereby for some formulations, stickiness to the roller was observed and the roller bath was filled with material, and for other formulations, no stickiness to the roller was observed and the roller bath was clean.

Stability was also measured in terms of color change over time. In some formulations, some change in color was observed after a period of 4 weeks at room temperature, whereby in exemplary formulations, such as BM205.4 and BM219, no change in color was observed during this time period. The obtained data suggest that the properties of the hardened material obtained from the tested formulations are influenced by the weight ratio of curable vs. non-curable materials, the type of curable and non-curable materials, and the type and amount of the multi-functional curable material, whereby the more advantageous formulations include materials featuring a low Tg, as described and defined herein, less than 50% by weight of non-curable materials, preferably featuring low Tg, as defined herein, and a multi-functional curable material featuring low Tg, as defined herein, and at an amount that is at least 3%, preferably at least 5%, by weight (e.g., 5-10% by weight). Some properties are also influenced by the type and amount of an inhibitor and/or the addition of a surfactant.

Example 4

Compatibility in Multi-Material Additive Manufacturing

Since, as delineated hereinabove, the present formulations may be utilized in multi-material additive manufacturing, particularly in cases where improved strength and Tear resistance are required while maintaining low hardness, some of the tested formulations were used to form printed objects coated or covered with an elastomeric material (for example, of the Agilus family, e.g., Agilus30™). The swelling of Agilus30™ in the non-curable materials included in the exemplary formulations presented herein was therefore tested, with the aim of defining the chemical requirements of a non-reactive material in which an elastomeric material exhibits minimal swellability.

Swelling tests were performed by printing swelling test specimens made of a hardened elastomeric material (for example, of the Agilus family, e.g., Agilus30™), featuring dimensions of 20×20×1 mm, and recording the weight of each specimen using analytical scales. Each specimen was put in a 20 ml glass vial and 15 ml of a tested non-reactive material (tested material) was added thereto. A sample with no additional material was used as control. The vials were stored at 40-50° C., and after 3-4 days the samples were dried using a cloth and weighed using analytical scales. Tables 3 and 4 below present the obtained weight change.

TABLE 3

| Tested material | MW (Daltons) | viscosity at 25° C. (centipoise) | Weight day 0 (grams) | Weight day 3 50° C. (grams) | % change |
|---|---|---|---|---|---|
| Control (Agilus30 ™) | | | 0.4704 | 0.4678 | −0.6% |
| PPG MW = 900 | 900 | 150 | 0.47 | 0.6699 | 42.5% |
| PPG MW = 2000 | 2000 | −300 | 0.4768 | 0.4722 | −1.0% |
| PPG-PEG-PPG block copolymer | 1100 | 175 | 0.4687 | 0.4835 | 3.1% |
| PEG-PPG-PEG block copolymer | 2800 | 475 | 0.4707 | 0.6252 | 32.8% |

As can be seen from Table 3, high molecular weight materials, featuring PPG blocks at a high content or consisting of PPG, provide for improved performance when used with Agilus30™.

TABLE 4

| Tested Material | MW | Weight day 0 (grams) | Weight day 4 40° C. (grams) | % Change |
|---|---|---|---|---|
| Control (Agilus30 ™) | | 0.5456 | 0.5468 | 0.22% |
| Polyol 3165 | 1014 | 0.5452 | 0.547 | 0.33% |
| Trifunctional alkoxylated polyol | | | | |
| PEG 400 | 400 | 0.5457 | 0.6041 | 10.70% |
| SUP706 | | 0.5466 | 0.6431 | 17.65% |
| Exemplary support material | | | | |
| Propandiol | | 0.5467 | 0.6283 | 14.93% |
| PEG 2000 | 2000 | 0.5452 | 0.5522 | 1.28% |

As can be seen in Table 4, in the presence of an exemplary support material formulation and other additives commonly added to building formulations (e.g., PEG 400; propanediol), high swelling was observed, whereby in high molecular weight polymers improved dimensional stability performance is observed.

Example 5

3D-Inkjet Printing

One of the application modes of the formulations of the present embodiments is in 3D inkjet printing of model objects featuring, in at least some portions thereof, a soft material (e.g., of Shore A hardness 0).

The present inventors have utilized formulations according to the present embodiments in multi-material 3D inkjet printing mode, along with an elastomeric material.

As shown in Examples 2 and 3 above, the present inventors have identified formulations which provide model objects which exhibit dimension stability, reduced or nullified stickiness and reduced or nullified leakage or migration (e.g., swelling) of the non-reactive materials to the other materials used in the multi-material mode.

For assuring adequate 3D-inkjet printing of reliable model objects, it is preferred to employ materials featuring at least one of the following characteristics:

(i) Stability over time, reflected in prolonged shelf-life of the printed object, without shape distortions, layers separation, material's leakage and wrinkles/cracks developments.

These properties are validated using the following exemplary tests:

Delamination test in sandwich specimen: 20×20×5 mm specimens made of a soft material formulation as described herein and covered with 1 mm Agilus30Clear™ layer are printed and maintained at 50° C. for 3 days. The peeling of the coat layer is thereafter observed. An acceptable result is minimal or null peeling.

Delamination test in oval specimens: Oval 60×24×18 mm specimens made of a soft material formulation as described herein and coated with 0.6 mm Agilus30 layer are printed and maintained at 50° C. for 3 days or at room temperature for one month. The dimensions of the specimens are thereafter tested. An acceptable result is minimal or null distortion.

Delamination test in box specimens: A 40×30×20 mm box-shaped object coated with an Agilus30 layer is printed as described hereinabove, and maintained at 50° C. for 3 days. The integrity, weight and dimensions of the box are thereafter measured. An acceptable result is less than 3% deviation from the parameters measured immediately after printing.

(ii) Resistance to applied forces, reflected, for example, by Tear resistance (controlled, slow and preferably nullified crack propagation when the printed object is subjected to moderate stress), Peel resistance and resistance to cutting and/or sewing.

Tear Resistance is validated using ASTM as described in Example 3.

Peel resistance is validated using a T-peel test (ASTM D1876), performed to measure the maximum yield load and crack propagation load. An acceptable result is higher than 15 N for the maximum yield load and higher than 13 N for the crack propagation load.

Sew/Suture tests, verifying resistance to suturing through the printed matrix, as depicted in FIG. 10.

(iii) Printing reliability, reflected by print quality and accuracy.

These properties are validated using the following exemplary tests:

A correct printing of a 100×40 z 5 mm plate; and Appropriate print quality of simple object geometries such as cubes, spheres and cylinder, and of more complicated geometries such as, for example, body organs such as a hear model.

(iv) Color, reflecting, for example, a desired stimulation of the appearance of tissue mimics (for example, of a human flesh), and tested visually. This property is achieved by using pigmentation systems already known in the art (e.g., tinting with Vero Yellow and Vero Magenta pigmentation systems).

Several 3D inkjet printing modes utilizing a soft material formulation according to the present embodiments, and an elastomeric material as described herein, were practiced and found to meet the above requirements, as follows:

(a) A multi-material core-shell printing mode providing objects made of a soft material formulation as described herein, coated by a thin (e.g., of 0.5-1 mm) shell layer of an elastomeric material as described herein. FIG. 8, left and middle objects, presents images of oval objects coated with 0.7 mm-thick layer of Agilus30.

Tear resistance data of similar objects are presented in Example 3 hereinabove.

Objects printed according to this core-shell mode exhibited dimension stability, printability, mechanical properties and print reliability that meet the above-indicated requirements.

(b) A multi-material scaffold mode, in which a composite structure made of a soft material formulation as described herein and reinforced by a scaffold made of an elastomeric material, in addition to being coated by a shell of an elastomeric material as described hereinabove. The Scaffold material can be, for example, 19% or 26%, by weight of the total weight of the multi-material formulation system, as exemplified herein for BM19 (see, Table 1). A BM19 formulation reinforced by 19% Agilus30 as a scaffold features an elastic modulus of 100 kPa and improved Tear resistance.

FIG. 9A is a schematic illustration of a printing scheme to form a region which includes interlaced modeling materials, and FIG. 9B is an image showing an exemplary thin plate printed according to the scheme illustrated in FIG. 9A and featuring a scaffold composite structure of BM61 with 19% Agilus30 scaffold.

FIG. 8, right object, presents an oval structure made of a composite scaffold of a soft material formulation and elastomeric formulation as described herein, and coated by an elastomeric material.

FIGS. 9C and 9D present a heart model made of a BM19 formulation (see, Table 1) reinforced by Agilus30 scaffold structure (19% 0.5 mm beams) (FIG. 9C), and a view of its inner portion (FIG. 9D).

Objects printed according to this scaffold-reinforcing mode exhibited dimension stability, printability, mechanical properties and print reliability that meet the above-indicated requirements.

These data show that various printing modes were successfully used for printing 3D objects made of the soft material formulation described herein, while obtaining the desirable softness (Shore A hardness 0), yet a usable strength (e.g., Tear resistance), desirable stability over time, and desirable printability.

As an example, FIG. 10 presents an image of an object printed using BM61 with 19% Agilus30 scaffold and 0.6 mm Agilus30 coating, which withstands suturing/sewing therethrough.

FIGS. 11A-B presents a heart mimic printed using BM61 with 19% Agilus30 scaffold and 0.6 mm Agilus30 coating, and tested with a medical device.

Good printing reliability, dimension and color stability over time, resistance to forces, along with the required soft nature were achieved with MB205.4 and MB219 formulations, when printed without a coating.

Example 6

Optimization of Printing Parameters

Further studies have been conducted for optimizing printing parameters so as to utilize a soft material formulation as described herein while reducing the amount of a reinforcing material (e.g., an elastomeric material) and improving print reliability issues such as stickiness to the roller of the AM system.

In this Example, Jarvik heart models, such as the model shown in FIG. 12 have been printed. All heart models were printed by dispensing the aforementioned BM151 and Agilus30 formulations in interlaced voxelated manner, such that for each layer, about X % of the voxels were occupied by the Agilus30 formulation and about 100−X % of the voxels were occupied by the BM151 formulation. Experiments were conducted with X=10, X=11, X=14 and X=19.

The elastomeric modeling formulation was dispensed in a DM operation mode together with a modeling material formulation, to form a three-dimensional DM structure in which elements of the modeling material formulation are within a matrix of support material formulation. The three-dimensional DM structure served as temporary removable support construction for the fabricated objects (heat models in the present example), and is referred to herein as a support grid. Three different sizes for the modeling material formulation elements in the support construction were tested in the present example: about 0.2 mm in diameter, about 0.4 mm in diameter and about 1 mm in diameter. The resulting support grids for these sizes are referred to herein as support grid A, support grid B and support grid C. The shapes of these modeling material formulation elements were generally cubic. For support grid A, the ratio between the amount of modeling material formulation and the amount of elastomeric modeling formulation was about 12%; for support grid B, the ratio between the amount of modeling material formulation and the amount of elastomeric modeling formulation was about 16%, and for support grid C, the ratio between the amount of modeling material formulation and the amount of elastomeric modeling formulation was about 25%.

It was found by the Inventors that the rotation speed of the roller affects the quality of the printed object. The Inventors found that for soft materials, particularly, but not exclusively, material obtained using exemplary formulations as described in Example 1 hereinabove, it is preferred to employ a roller rotation speed of less than 500 or less than 480 or less than 460 or less than 440 or less than 420 RPM. The effect of the rotation speed of the roller on the smoothness of the outer surface is demonstrated in FIGS. 13A-B, where FIG. 13A is an image of a heart model printed in a mode in which the roller rotated at a speed of 600 RPM, and FIG. 13B is an image of a heart model printed in a mode in which the roller rotated at a speed of 412 RPM. The heart model shown in FIG. 13B has a substantially smoother outer surface than heart model shown in FIG. 13A. A region with defects is marked by a dashed circle in FIG. 13A.

It was found by the Inventors that better quality of the printed object was provided by printing in a matte mode, wherein the outermost surface of the object is coated by one or more layers of support materials which are subsequently removed, support grid B, and without an outline gap in which voxels between the boundary of the support grid and the boundary of the model were left vacant. The effect of the outline gap on the smoothness of the outer surface is demonstrated in FIG. 14. Shown are two heat models. The heat model on the left side was printed in a mode in which outline gap was employed, and the heat model on the right side was printed in a mode in which an outline gap was not employed. The heart model shown on the right side of FIG. 14 has a substantially smoother outer surface than the heart model shown on the left side of FIG. 14. A region with defects is marked by a dashed circle on the image of the heart model on the left side of FIG. 14.

The elastomeric modeling formulation (e.g., Agilus30) was included both for reducing the stickiness of each layer and for reinforcing the object. It was found by the Inventors that fibrous reinforcement provides a higher Tear resistance than non-fibrous reinforcement, and that directional fibrous reinforcement pattern provides a higher Tear resistance than an isotropic fibrous reinforcement pattern. Without wishing to be bound to any particular theory, it is assumed that the tearing force applied by the roller is diagonal with respect to the plane of the layer, as schematically illustrated in FIG. 15. Shown is a newly dispensed layer of a material combination denoted TM of and a roller rotating on a surface of the layer to straighten the newly dispensed layer. The forces applied by the roller include a component T resulting from a relative translation motion between the layer and the roller, and a component R resulting from a rotational motion of the roller. The combination of the components T and R results in an effective force F which is diagonal with respect to the plane engaged by the uppermost surface of the layer (the X-Y plane which is perpendicular to the X-Z plane shown in FIG. 15).

FIGS. 16A-F show several experimentally tested reinforcement patterns in the X-Z plane. Shown are a vertical reinforcement pattern (parallel to the thickness direction Z, FIG. 16A), a horizontal reinforcement pattern (perpendicular to the thickness direction Z, FIG. 16B), a positive diagonal pattern (at a positive slope relative to the to the plane engaged by the layer, FIG. 16C), a negative diagonal pattern (at a negative slope relative to the to the plane engaged by the layer, FIG. 16D), and two isotropic patterns: a chopped pattern (FIG. 16E) and a gyroid pattern (FIG. 16F).

The experiments revealed higher Tear resistance for the vertical and negative diagonal reinforcement patterns than for the other reinforcement patterns. The highest Tear resistance were obtained with X=14, a negative reinforcement pattern with a slope of about −45°, Agilus30 fibers about 0.5 mm in diameter, and an outermost Agilus30 coating of from about 0.4 to about 0.7 mm. FIG. 17 is an image of four heart models printed using these parameters.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method of additive manufacturing an object featuring properties of a soft bodily tissue, the method comprising:
dispensing at least one modeling material formulation to sequentially form a plurality of layers in a configured pattern corresponding to a shape of the object, wherein for at least a portion of said layers, said dispensing is of a modeling material formulation featuring, when hardened, a Shore A hardness lower than 10 or a Shore 00 hardness lower than 40,
wherein said modeling material formulation featuring, when hardened, said Shore A hardness or said Shore 00 hardness comprises curable materials and non-curable materials, wherein a total amount of said non-curable materials ranges from 10 to 49, or from 10 to 30, % by weight, of the total weight of said formulation.

2. The method of claim 1, comprising dispensing at least two modeling material formulations, at least one of said at least two modeling material formulations is said formulation featuring, when hardened, a Shore A hardness lower than 10 or a Shore 00 hardness lower than 40, and at least another one of said at least two modeling material formulations is an elastomeric curable formulation which comprises at least one elastomeric curable material.

3. The method of claim 2, wherein for at least one of said layers, said dispensing comprises forming voxel elements containing said at least one formulation featuring, when hardened, a Shore A hardness lower than 10 or a Shore 00 hardness lower than 40, and said elastomeric curable formulation.

4. The method according to claim 3, wherein interlaced locations occupied by said elastomeric curable formulation constitute from about 10% to about 30% of an area of said at least one layer.

5. The method according to claim 2, wherein interlaced locations occupied by said elastomeric curable formulation constitute from about 10% to about 30% of an area of said at least one layer.

6. The method of according to claim 5, wherein said elastomeric curable formulation further comprises a pigment which imparts a white opaque color with yellow tint to the formulation when hardened.

7. The method according to claim 2, wherein voxel elements containing said elastomeric curable formulation form a volumetric fibrous pattern in the object.

8. The method according to claim 7, wherein a characteristic fiber thickness of said fibrous pattern is from about 0.4 mm to about 0.6 mm.

9. The method according to claim 2, further comprising forming from said elastomeric curable formulation a shell coating the object.

10. The method according to claim 2, further comprising forming from said elastomeric curable formulation a shell coating the object, and removing said shell following a completion of said additive manufacturing of said three-dimensional object.

11. The method according to claim 1, wherein said non-curable materials comprise a non-curable polymeric material and wherein an amount of said non-curable polymeric material ranges from 20 to 40 weight percent.

12. The method according to claim 11, wherein said non-curable polymeric material features a molecular weight of at least 1000, or at least 1500 or at least 2000 Daltons; and a Tg lower than 0, or lower than −10, or lower than −20, ° C.

13. The method according to claim 11, wherein:
said non-curable polymeric material comprises polypropylene glycol; and/or
said non-curable polymeric material is a block co-polymer that comprises at least one polypropylene glycol block; and/or
said non-curable polymeric material is a block co-polymer that comprises at least one polypropylene glycol block and at least one polyethylene glycol block, wherein a total amount of said polyethylene glycol in said block co-polymer is no more than 10 weight percent, wherein a ratio of polypropylene glycol blocks and said polyethylene glycol blocks in said block-copolymer is at least 2:1; and/or
said non-curable polymeric material comprises a polypropylene glycol and/or a block co-polymer comprising at least one polypropylene glycol block, each featuring a molecular weight of at least 2000 Daltons.

14. The method according to claim 11, wherein a ratio of the amount of said curable materials and the amount of said non-curable polymeric material ranges from 4:1 to 1.1:1, or from 3:1 to 2:1.

15. The method according to claim 1, wherein an amount of said curable materials ranges from 55 to 70 weight percent.

16. The method according to claim 1, wherein said curable materials comprise at least one mono-functional curable material and at least one multi-functional curable material, wherein an amount of said mono-functional curable material ranges from 50 to 60 weight percent, or from 55 to 60 weight percent; and/or
an amount of said multi-functional curable material ranges from 3 to 10 weight percent, or from 5 to 10 weight percent.

17. The method according to claim 16, wherein said mono-functional curable material features, when hardened, a Tg lower than −10, or lower than −20° C.

18. The method according to claim 16, wherein said multi-functional curable material features, when hardened, a Tg lower than −10, or lower than −20° C.

19. The method according to claim 16, wherein said modeling material formulation featuring, when hardened, said Shore A hardness or said Shore 00 hardness comprises:
a mono-functional amphiphilic acrylate that comprises a hydrophobic moiety, in an amount of 25-35 weight percent;
a mono-functional hydrophobic acrylate, in an amount of 25-30 weight percent;
a multi-functional acrylate, in an amount of 5-10 weight percent; and
a non-curable polymeric material featuring a molecular weight of at least 1000, or at least 1500 or at least 2000 Daltons; and a Tg lower than 0, or lower than −10, or lower than −20, ° C., in an amount of 30-35 weight percent.

20. The method according to claim 19, wherein said non-curable polymeric material comprises a polypropylene glycol and/or a block co-polymer comprising at least one polypropylene glycol block, each featuring a molecular weight of at least 2000 Daltons.

21. The method according to claim 19, wherein said multi-functional acrylate is a urethane diacrylate.

22. The method according to claim 1, wherein said modeling material formulation featuring, when hardened, said Shore A hardness or said Shore 00 hardness comprises:
- a mono-functional curable material, in an amount of from 50 to 89 weight percent;
- a non-curable polymeric material, in an amount ranging from 10 to 49 weight percent; and
- a multi-functional curable material, in an amount ranging from 1 to 10 weight percent.

23. The method according to claim 22, wherein:
(i) said non-curable polymeric material features a molecular weight of at least 1000, or at least 1500 or at least 2000 Daltons; and/or
(ii) said non-curable polymeric material features a Tg lower than 0, or lower than −10, or lower than −20, ° C.; and/or
(iii) at least 80 weight percent of the total amount of said mono-functional and said multi-functional curable materials include curable materials featuring, when hardened, a Tg lower than 0, or lower than −10, or lower than −20, ° C.

24. The method according to claim 1, wherein at least said modeling material formulation featuring, when hardened, said Shore hardness, is devoid of a biological material.

25. The method according to claim 1, wherein at least said modeling material formulation featuring, when hardened, said Shore A hardness comprises less than 10% by weight water.

26. The method according to claim 1, wherein said at least one modeling material formulation featuring when hardened said Shore hardness further comprises a pigment which imparts to a red tint to the formulation when hardened.

* * * * *